(12) United States Patent
Taya et al.

(10) Patent No.: US 7,104,056 B2
(45) Date of Patent: Sep. 12, 2006

(54) DESIGN OF FERROMAGNETIC SHAPE MEMORY ALLOY COMPOSITES AND ACTUATORS INCORPORATING SUCH MATERIALS

(75) Inventors: Minoru Taya, Mercer Island, WA (US); Taishi Wada, Kanagawa (JP); Masahiro Kusaka, Hyogo (JP); Hsiu-hung Chen, Seattle, WA (US)

(73) Assignee: University of Washington, Seattle, WA (US)

( * ) Notice: Subject to any disclaimer, the term of this patent is extended or adjusted under 35 U.S.C. 154(b) by 321 days.

(21) Appl. No.: 10/790,634

(22) Filed: Feb. 27, 2004

(65) Prior Publication Data

US 2005/0001367 A1 Jan. 6, 2005

Related U.S. Application Data

(60) Provisional application No. 60/450,632, filed on Feb. 27, 2003, and provisional application No. 60/450,633, filed on Feb. 27, 2003.

(51) Int. Cl.
*B32B 5/02* (2006.01)
*B32B 15/01* (2006.01)
*C22C 19/00* (2006.01)
*C22C 30/00* (2006.01)
*C22K 1/00* (2006.01)

(52) U.S. Cl. .............................. 60/527; 60/528; 60/529; 310/307; 310/308; 310/309

(58) Field of Classification Search .................... 60/527, 60/528, 529; 310/306, 307, 308, 309
See application file for complete search history.

(56) References Cited

U.S. PATENT DOCUMENTS 5,071,064 A * 12/1991 AbuJudom et al. ......... 236/1 G
6,427,712 B1 * 8/2002 Ashurst ........................ 60/527
6,499,952 B1 * 12/2002 Jacot et al. ................... 60/527
6,633,095 B1 * 10/2003 Swope et al. ................. 310/12
6,796,124 B1 * 9/2004 Kutlucinar .................... 60/528
6,832,477 B1 * 12/2004 Gummin et al. .............. 60/527

FOREIGN PATENT DOCUMENTS

JP 62088890 A * 4/1987
JP 2002129273 A * 5/2002

OTHER PUBLICATIONS

Matsunaga, Yasuhiro et al. "Design of ferromagnetic shape memory alloy composites based on TiNi for robust and fast actuators." 2002. Proc. SPIE on Smart Materials. Mar. 17–21, 2002: 4699:172. 10pp.

Wada, Taishi and Taya, Minoru. "Spring–based actuators." Smart Structures and Materials 2002: Active Materials: Behavior and Mechanics, Christopher S. Lynch, Editor, Proceedings of SPIE vol. 4699 (2002). pp. 294–302.

* cited by examiner

*Primary Examiner*—Sheldon J Richter
(74) *Attorney, Agent, or Firm*—Ronald M. Anderson

(57) ABSTRACT

The present invention employs an optimized cross-sectional shape for a ferromagnetic shape memory alloy (FSMA) composite that is used in a spring-type actuator, an improved hybrid magnetic trigger for use in FSMA based actuators, an a FSMA composite based spring type actuator, an a FSMA based spring type actuator including a stack of triggering units and FSMA springs, a FSMA composite based torque actuator. The invention also includes a model that can be employed to evaluate different materials being considered as components a FSMA for a FSMA composite used in either a FSMA based torque actuator or a FSMA spring actuator.

6 Claims, 28 Drawing Sheets

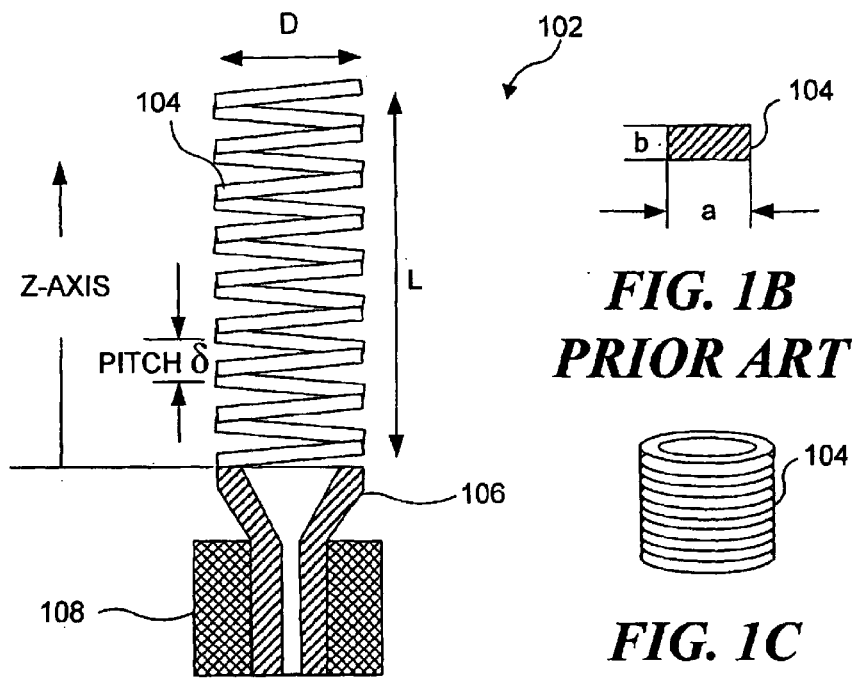
FIG. 1A PRIOR ART
FIG. 1B PRIOR ART
FIG. 1C PRIOR ART
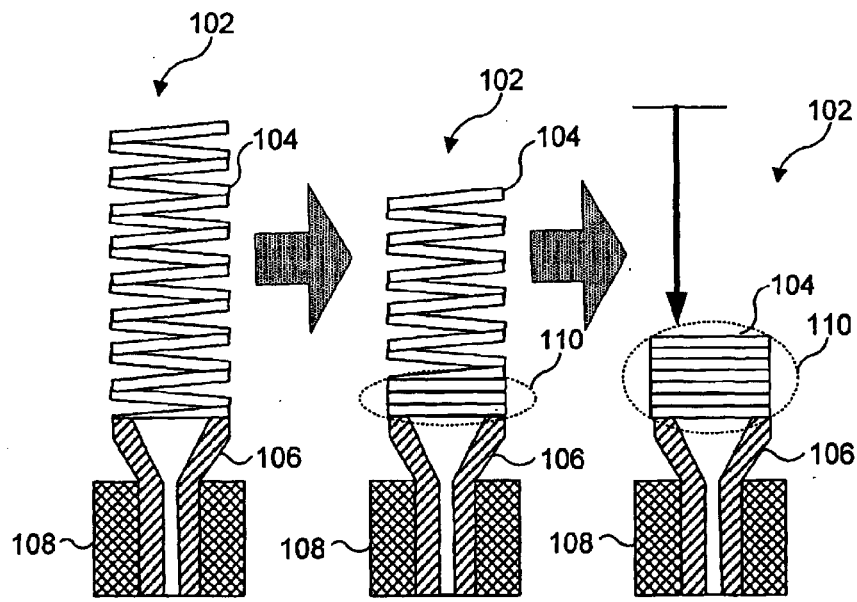
FIG. 2A  FIG. 2B  FIG. 2C
PRIOR ART

FIG. 7
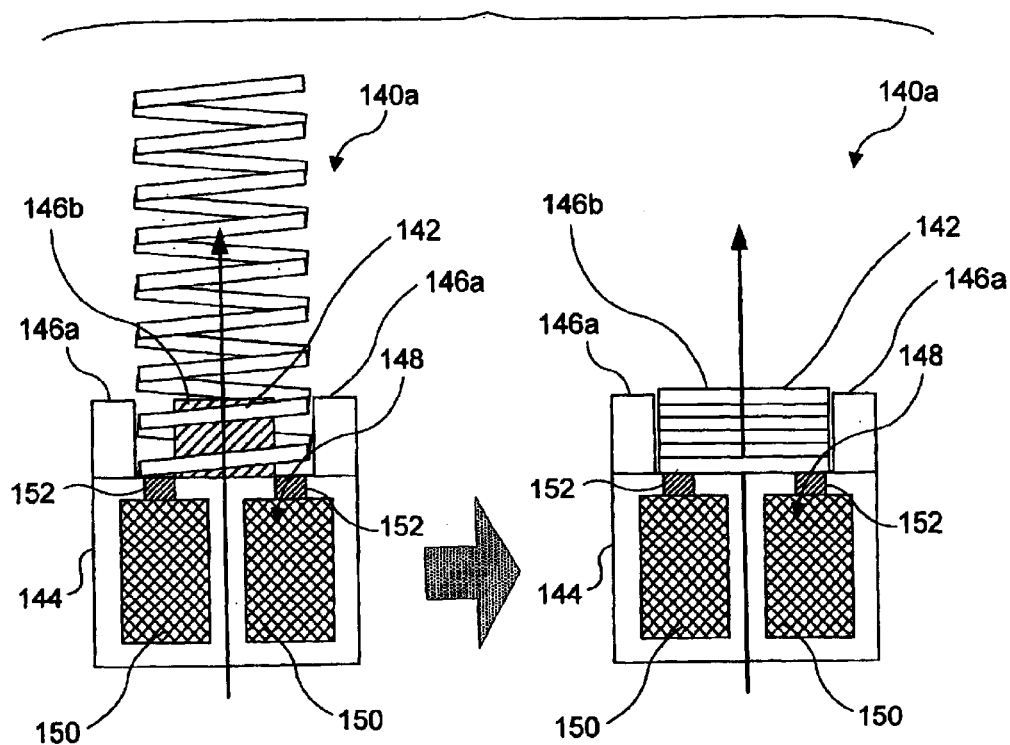
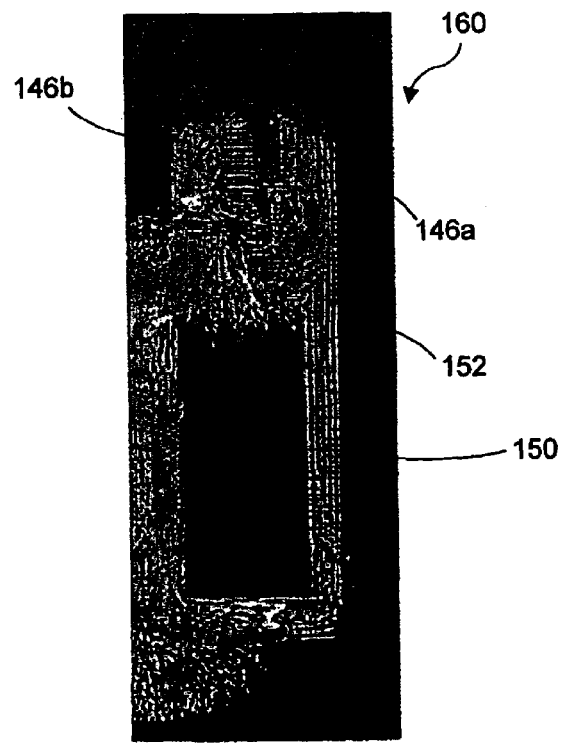
FIG. 8

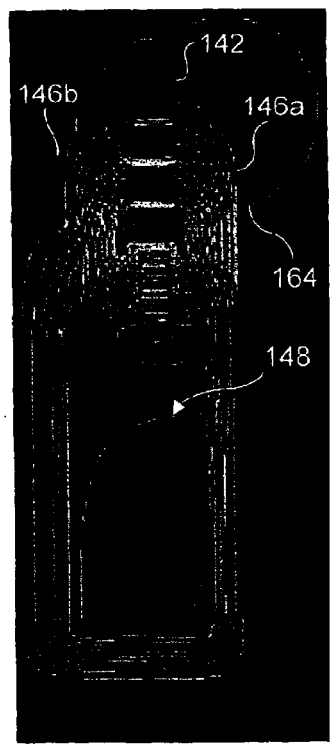 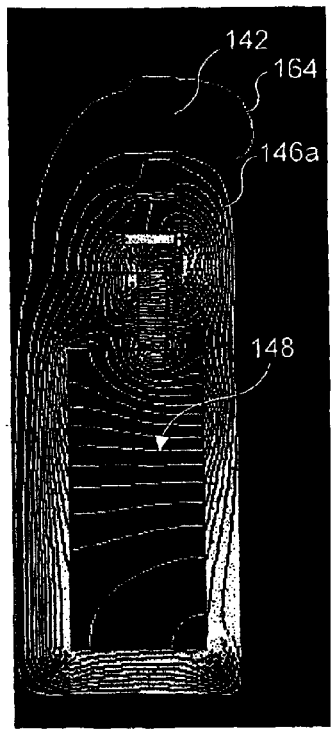
FIG. 9A  FIG. 9B
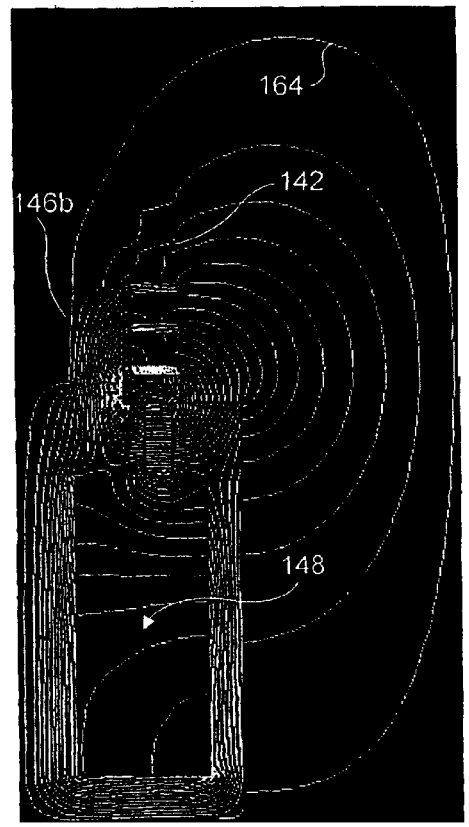
FIG. 9C

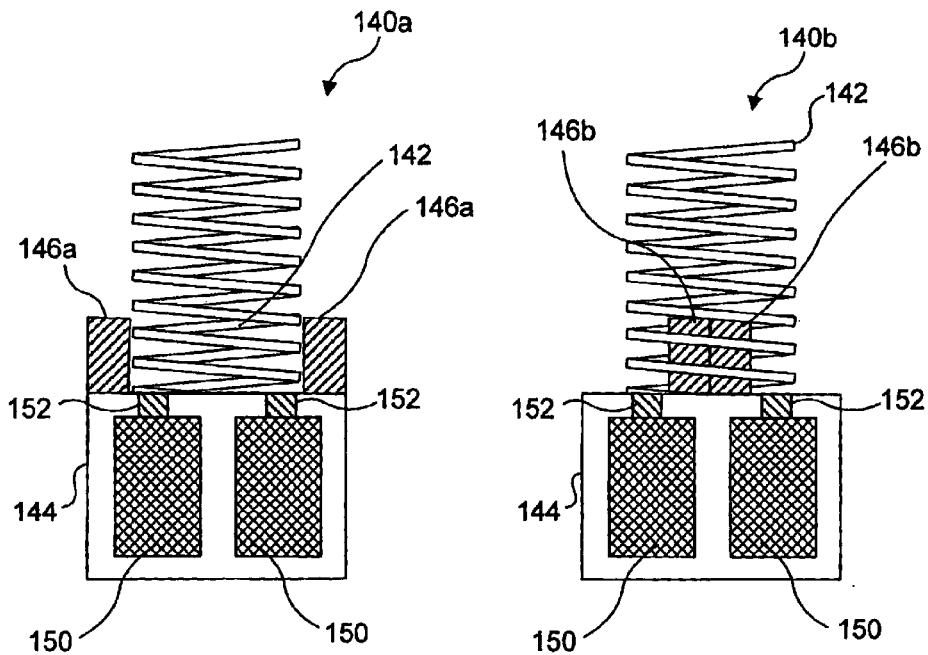
FIG. 10A  FIG. 10B
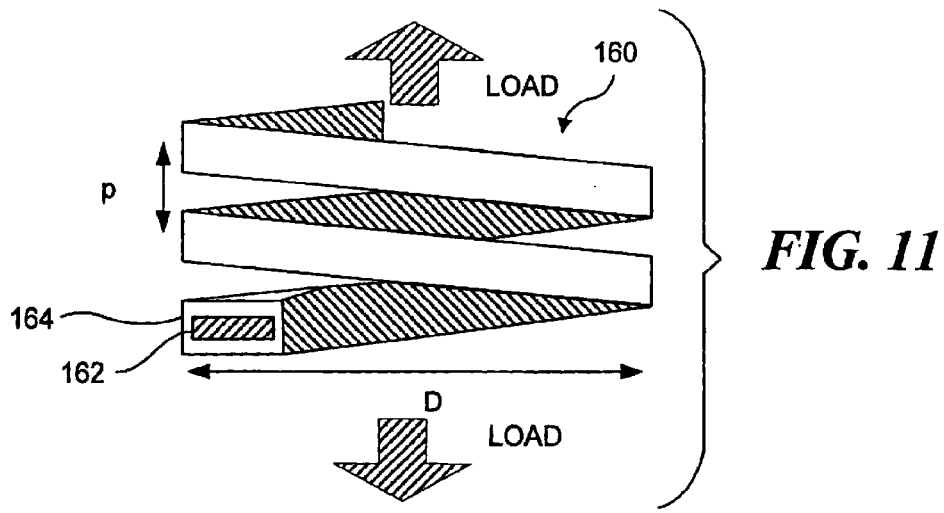
FIG. 11
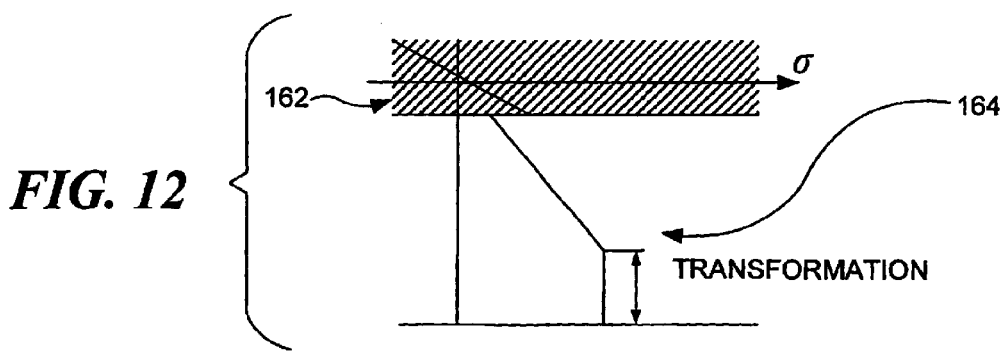
FIG. 12

D: THE DIAMETER OF THE SPRING (D=2R)
d: THE DIAMETER OF THE WIRE
p: THE PITCH OF ONE CYCLE
n: THE NUMBER OF TURNS
L: THE LENGTH OF THE SPRING W/O A LOAD (L=np)
α: THE INCLINED ANGLE OF THE WIRE TO THE X-Y PLANE

DESIGN OF FERROMAGNETIC SHAPE MEMORY ALLOY COMPOSITES AND ACTUATORS INCORPORATING SUCH MATERIALS

RELATED APPLICATIONS

This application is based on two prior copending provisional applications, Ser. No. 60/450,632, filed on Feb. 27, 2003, and Ser. No. 60/450,633, filed on Feb. 27, 2003, the benefits of the filing dates of which are hereby claimed under 35 U.S.C. § 119(e).

GOVERNMENT RIGHTS

This invention was funded at least in part with a Darpa/ONR Grant No. N-00014-00-1-0520, and an AFOSR Grant No. F49620-02-1-0028, and the U.S. government may have certain rights in this invention.

FIELD OF THE INVENTION

The present invention relates to the use of ferromagnetic shape memory alloys, and more specifically, relates to the use of ferromagnetic shape memory alloys in spring actuators and torque actuators.

BACKGROUND OF THE INVENTION

Actuators are relatively simple mechanical components that are often incorporated into more complex mechanical systems, including those found in automobiles, airplanes, manufacturing facilities, and processing facilities. A conventional solenoid is one example of an actuator that has found broad application across many types of industries and technologies.

Shape memory alloys (SMAs) are metals that exist in two distinct solid phases, referred to as Martensite and Austenite. Martensite is relatively soft and easily deformed, whereas Austenite is relatively stronger and less easily deformed. SMAs can be induced to change phase by changes in temperature and changes in mechanical stress. Also, SMAs can generate relatively large forces (when resistance is encountered during their phase transformation) and can exhibit relatively large movements as they recover from large strains. SMAs have been used commercially in many types of actuators, where a temperature change is used to control the actuation cycle. One of the most widely recognizable applications has been the use of SMA based actuators in automatic sprinkler systems.

One disadvantage of SMA actuators triggered by changes in temperature is that a heating or cooling device must be incorporated into the actuator, increasing the size, expense, and complexity of the actuator. Further, the response of such an actuator depends on heat transfer, which can occur too slowly for certain applications. Material scientists have more recently recognized that the phase change between Martensite and Austenite can be induced by changes in an applied magnetic field in certain alloys, as well as by changes in temperature and stress loading. Because magnetic fields generated with electromagnets can be rapidly switched on and off, particularly compared to the time required to induce a change in temperature to initiate an actuation, electromagnetically controlled SMA based actuators appear to offer promise in applications where rapidly responding actuation is required. Such alloys are referred to as ferromagnetic shape memory alloys (FSMAs).

A spring-based FSMA actuator (as reported by T. Wada, and M. Taya. 2002. *Proc. of SPIE on Smart Structures and Materials*, ed. C. S. Lynch. 4699:294–302, the disclosure of which is hereby specifically incorporated herein by reference) has been designed and tested with favorable results. The specific FSMA employed was an alloy of iron and palladium (FePd), and the actuator described was triggered using a hybrid system including a permanent magnet and an electromagnet. The permanent magnet alone is insufficient to induce the phase change, but does enable a smaller electromagnet to be employed. Unfortunately, the cost of palladium is so prohibitive that commercial utilization of FePd based actuators is not now economically feasible.

In an attempt to identify other materials that could be of use in FSMA actuators, composites of a ferromagnetic material and a SMA alloy that itself is not ferromagnetic have been suggested (Y. Matsunaga, T. Tagawa, T. Wada, and M. Taya, et al. 2002. *Proc. SPIE on Smart Materials*, (March 17–21):4699:172, the disclosure of which is hereby specifically incorporated herein by reference). Matsunaga et al. describe a three layer composite in which a soft iron (Fe) core is sandwiched between two layers of a super elastic (but non ferromagnetic) SMA. The ferromagnetic material is iron, or an iron, cobalt, and vanadium alloy (FeCoV), and the SMA is an alloy of titanium and nickel (TiNi), or an alloy of titanium, nickel, and copper (TiNiCu). This approach enables a SMA material having good mechanical properties to be combined with a material having good magnetic properties to achieve a desirable FSMA composite. While such research indicated that FSMA composites are indeed achievable, the FSMA composites produced did not perform as well in actuators as did the FePd material.

It would therefore be desirable to produce FSMA composite having properties suited for use in actuators at a commercially viable cost. Because there exist many potential combinations of ferromagnetic materials and (non ferromagnetic) SMAs, it would further be desirable to provide a model to aid in identifying potentially useful components from which future composite ferromagnetic SMAs can be produced. Because the physical geometry of a FSMA component impacts the properties of that component, it would also be desirable to determine a specific geometry that provides enhanced performance when the material is utilized in an actuator. Finally, it would be desirable to develop different embodiments of actuators incorporating FSMAs that will likely have commercial value.

SUMMARY OF THE INVENTION

A first aspect of the present invention relates to several configurations of FSMA composites. One embodiment includes only two layers, including a ferromagnetic layer and a SMA layer. Another such embodiment has a specific cross-sectional shape that is suitable for a FSMA composite component to be incorporated in an actuator. The cross-sectional shape has a generally rectangular-shaped core of ferromagnetic material, such as iron or FeCoV alloy that is twice as long as it is high. Each of the four sides has a generally ovoid depression centered therein. The SMA portion of the FSMA composite fills the depressions. This rectangular FSMA composite is made by first forming the generally rectangular ferromagnetic core. In fact, iron and iron based ferromagnetic alloys are commercially available in this rectangular form. The depressions can be machined into bar stock of the alloy, or bar stock can be extruded with the depressions formed in the bar stock as part of the extrusion process, using appropriately configured rollers.

Once the core is produced, the SMA is spray cast into the depressions. This rectangular cross-sectional shape is particularly useful when the material is formed into a spring for use in a FSMA composite spring-based actuator.

Another aspect of the present invention is directed to an improved hybrid magnetic trigger. The shape and orientation of the magnetic flux produced by any triggering system for a FSMA based actuator is important. If the magnetic flux is not properly oriented, either the actuator will not function or, in the case of actuators including multiple FSMA components, the desired phase change will not occur in each FSMA component, and the actuator will not perform as desired. Significantly, extending the magnetic field in a desired direction enables linear motion type actuators having a longer stroke to be achieved. Thus, one aspect of the invention involves the addition of fences, or flux directors in a hybrid triggering mechanism to achieve a more useful distribution of magnetic flux. Such fences are disposed on one or more sides of the hybrid magnetic trigger, between the electromagnet and the FSMA components.

Still another aspect of the present invention is directed to a spring type FSMA-based actuator that employs a modular design to achieve substantial stroke distances. Instead of including a single hybrid magnetic trigger that actuates a single FSMA spring, the actuator uses a plurality of triggers and springs that are oriented in a stack configuration. Each hybrid magnetic trigger includes a generally circular permanent magnet, an electromagnet, and a yoke configured to couple the magnetic flux to the FSMA spring. The hybrid magnetic triggers are disc shaped, with a cross-sectional shape generally corresponding to the dimensions of the FSMA springs. The base of the stack is a first hybrid magnetic trigger, which is coupled to a first FSMA spring. The first FSMA spring is then coupled to a second hybrid magnetic trigger, which is coupled to a second FSMA spring. Additional triggers and springs are added until the resulting stack achieves the desired stroke. The springs are implemented using either homogenous FSMAs or FSMA composites.

Yet another aspect of the present invention is directed to a FSMA composite-based torque actuator. The torque actuator includes a FSMA composite plate coil spring centrally disposed in a casing defining an inner volume. A rod is disposed along a central axis of the inner volume, and a first end of the FSMA plate coil spring is attached to the rod, while a second end of the FSMA plate coil spring is attached to the casing. Disposed around a periphery of the casing are a plurality of hybrid magnetic triggers. Each hybrid magnetic trigger includes a permanent magnet and an electromagnet. When the hybrid magnetic triggers are energized, the FSMA composite plate coil spring is attracted to the casing (as magnetic flux from the hybrid magnetic triggers penetrate the casing), causing the rod to rotate. The rotation of the rod can be used to move a load, directly, or via a pulley or other coupling. Preferably, the FSMA composite plate includes one layer of SMA bonded to a layer of ferromagnetic material. CuAlMn represents a particularly preferred SMA alloy, while FeCoV represents a particularly preferred ferromagnetic material. When the hybrid magnetic triggers are energized, the triggers are preferably energized simultaneously.

Still another aspect of the present invention is directed to a model useful for analyzing materials to determine their suitability for use in a FSMA composite. The model is based on an analysis of the forces acting on FSMA plates used for bending actuators, and FSMA springs for spring based actuators.

BRIEF DESCRIPTION OF THE DRAWING FIGURES

The foregoing aspects and many of the attendant advantages of this invention will become more readily appreciated as the same becomes better understood by reference to the following detailed description, when taken in conjunction with the accompanying drawings, wherein:

FIGS. 1A–1C schematically illustrate a prior art spring SMA actuator made of FePd alloy;

FIGS. 2A–2C schematically illustrate the sequential actuation and collapse of the spring actuator of FIGS. 1A–1C;

FIG. 3 graphically illustrates a stress and strain relationship of a particularly preferred FSMA composite used for actuators in accord with the present invention;

FIG. 4 schematically illustrates a prior art FSMA composite including two layers of a SMA and a ferromagnetic core;

FIG. 5 schematically illustrates a particularly preferred cross-sectional shape for a FSMA composite used in a spring actuator in accord with the present invention;

FIG. 6 graphically illustrates a force and displacement relationship for the particularly preferred FSMA composite of FIG. 3, having the cross-sectional shape illustrated in FIG. 5;

FIG. 7 schematically illustrates a FSMA composite-based spring actuator including inner and outer fences, in accord with another aspect of the present invention;

FIG. 8 is a visual representation of magnetic flux vectors determined using finite element analysis for a portion of the FSMA composite-based spring actuator of FIG. 7;

FIG. 9A is a visual representation of magnetic flux lines present in a portion of the FSMA composite-based spring actuator of FIG. 7, when the hybrid electromagnetic trigger is energized;

FIG. 9B is a visual representation of magnetic flux lines present in a portion of a FSMA composite-based spring actuator similar to that of FIG. 7 (but which includes only outer fences) when the hybrid electromagnetic trigger is energized;

FIG. 9C is a visual representation of magnetic flux lines present in a portion of a FSMA composite-based spring actuator similar to the one illustrated in FIG. 7 (but which includes only inner fences) when the hybrid electromagnetic trigger is energized;

Figure 13A:
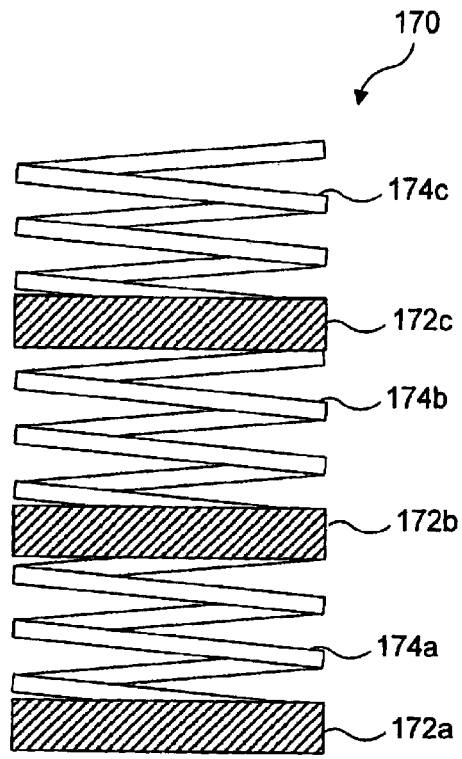
Figure 13B:
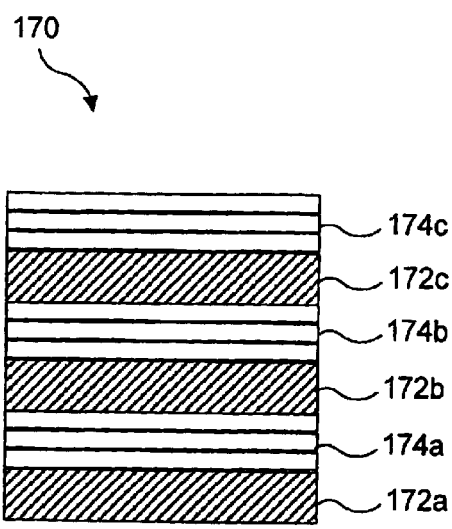
Figure 14:
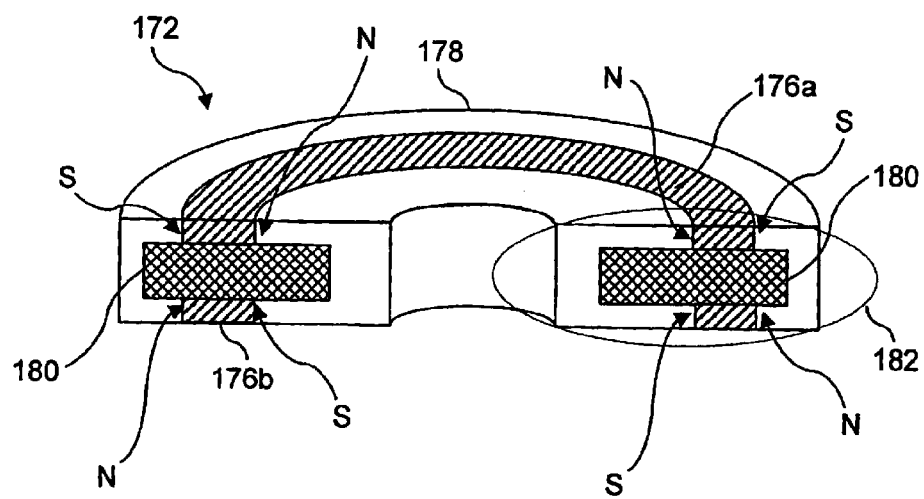
Figure 15A:
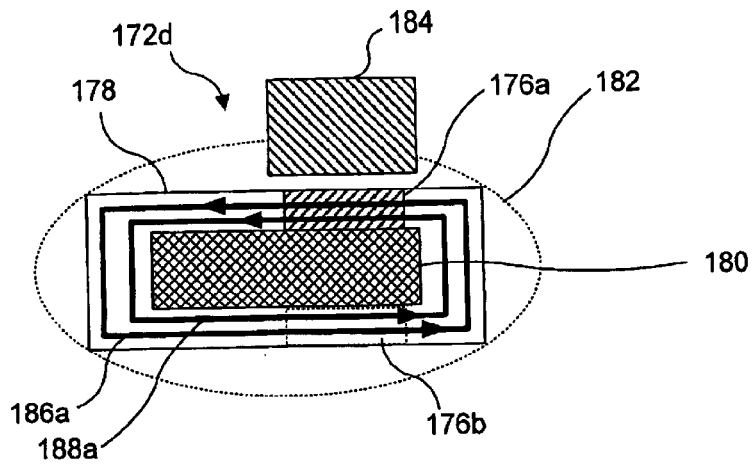
Figure 15B:
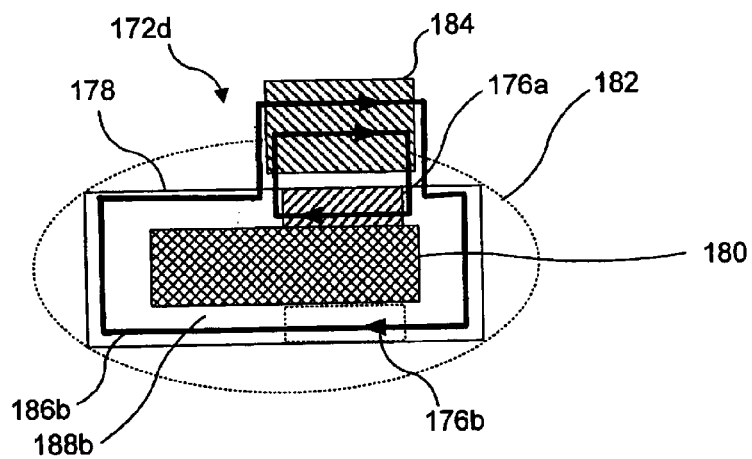
Figure 15C:
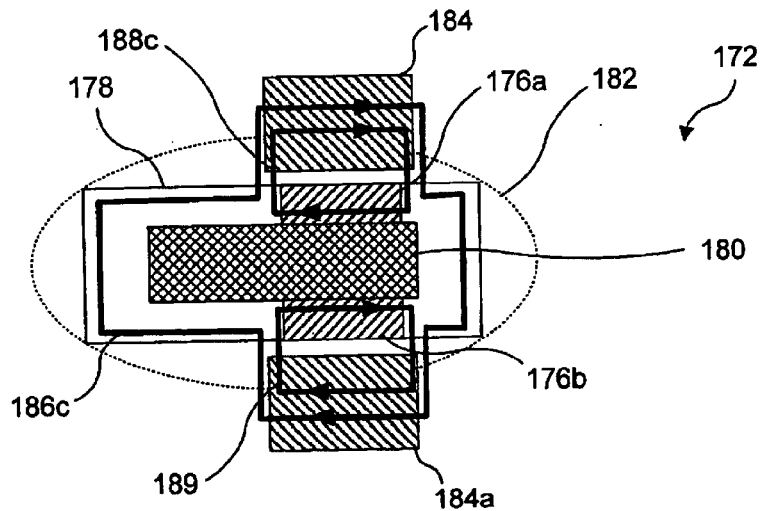
Figure 16A:
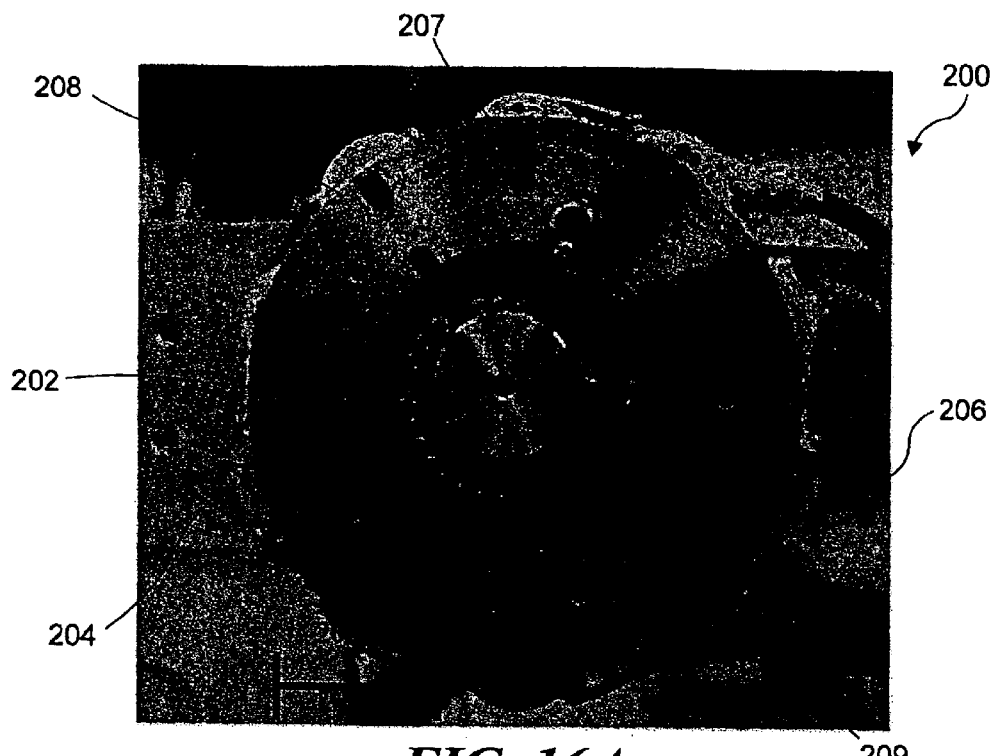
Figure 16B:
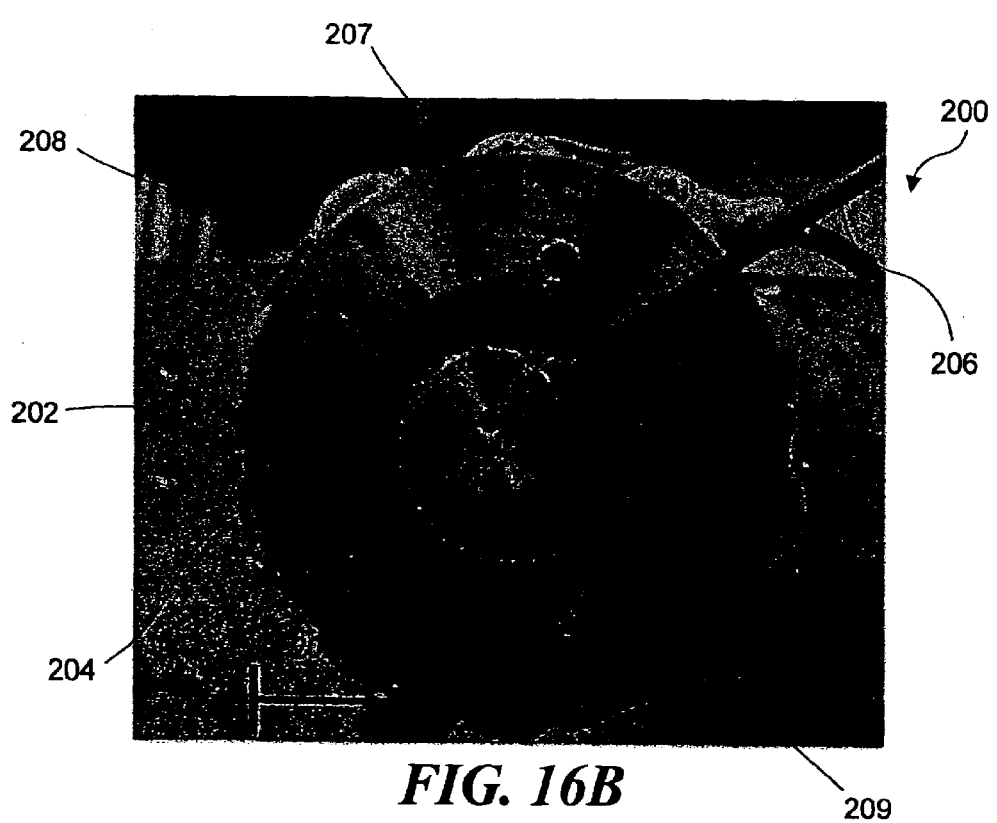
Figure 16C:
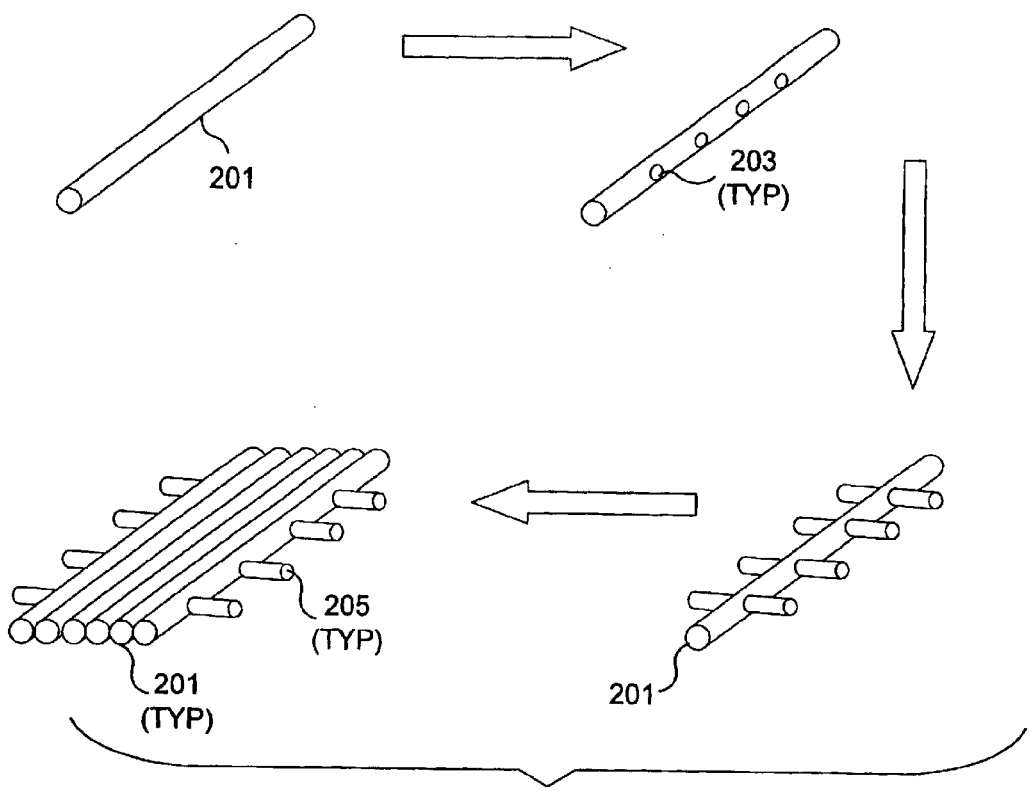
Figure 24:
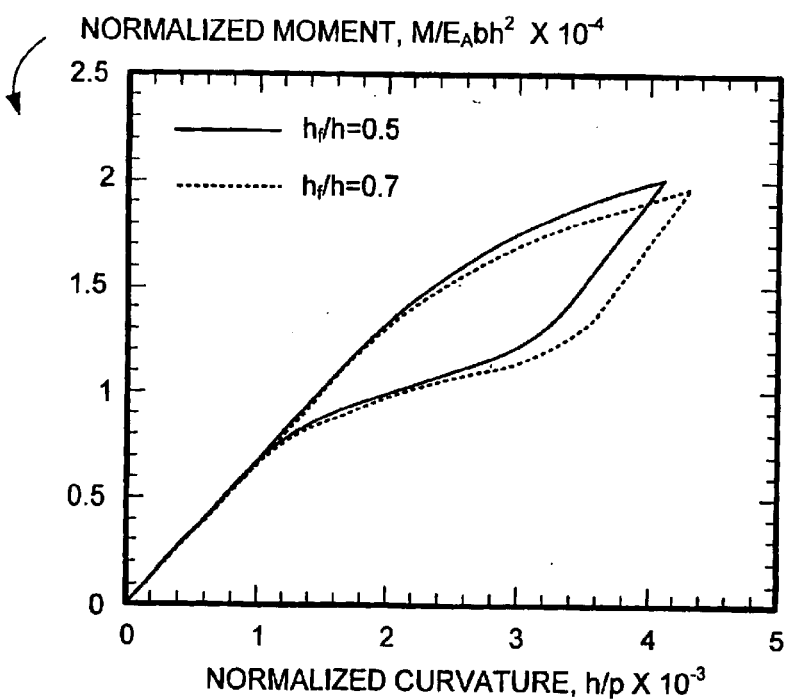
Figure 17A:
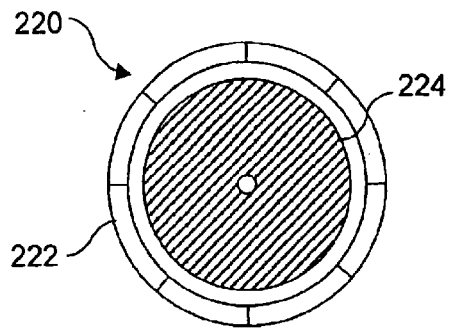
Figure 17B:
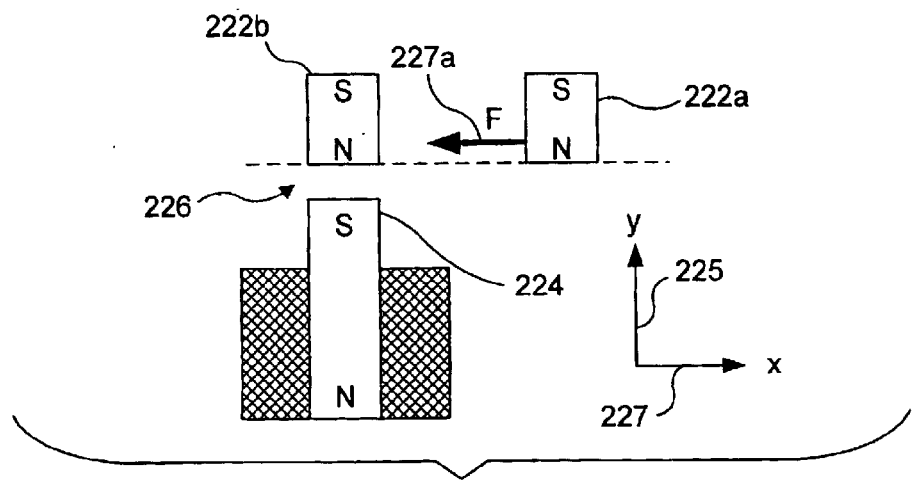
Figure 17C:
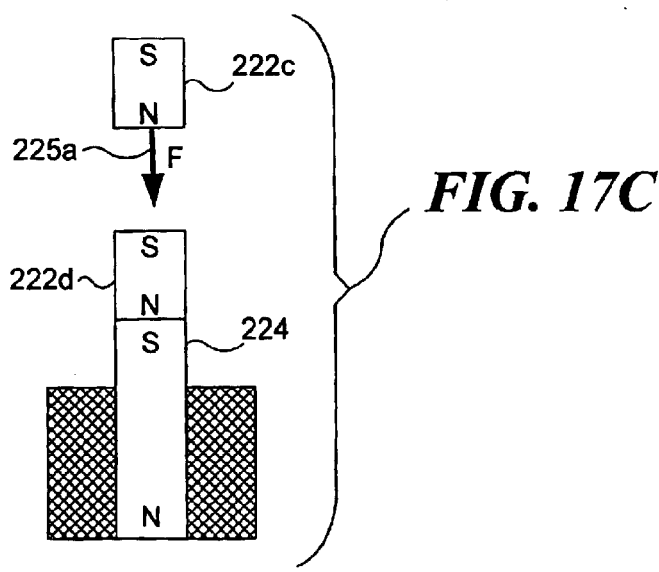
Figure 18A:
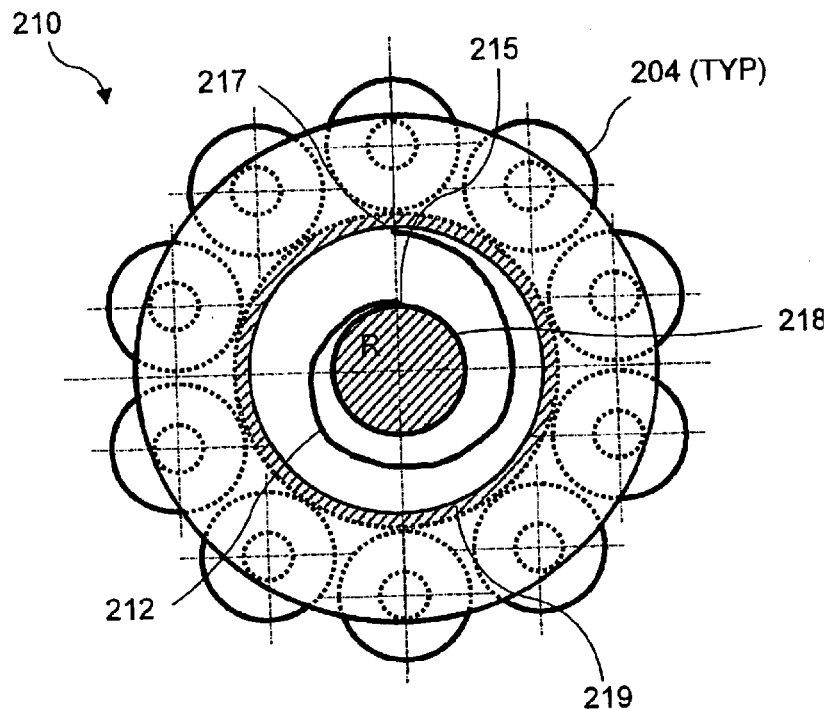
Figure 18B:
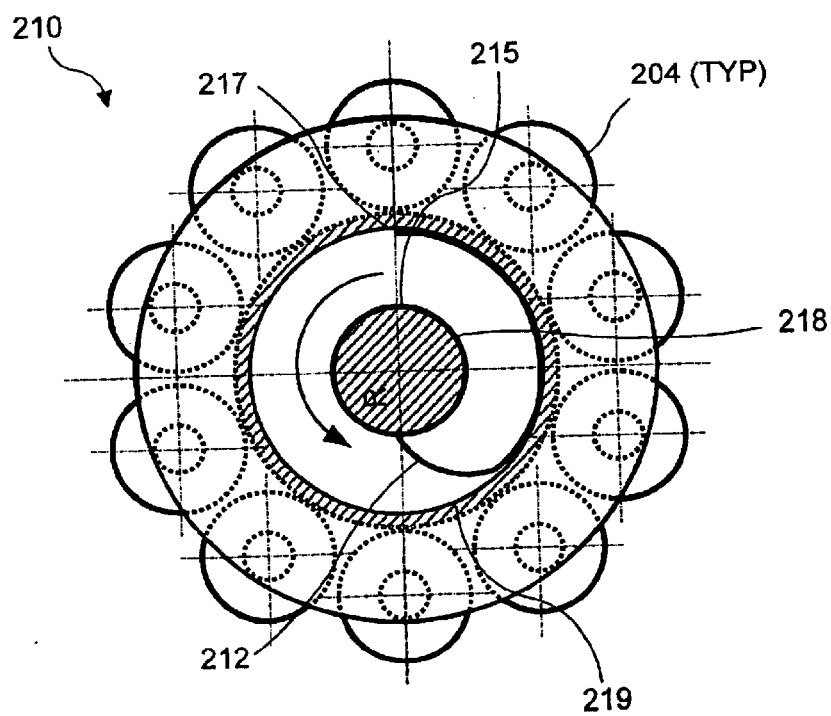
Figure 19A:
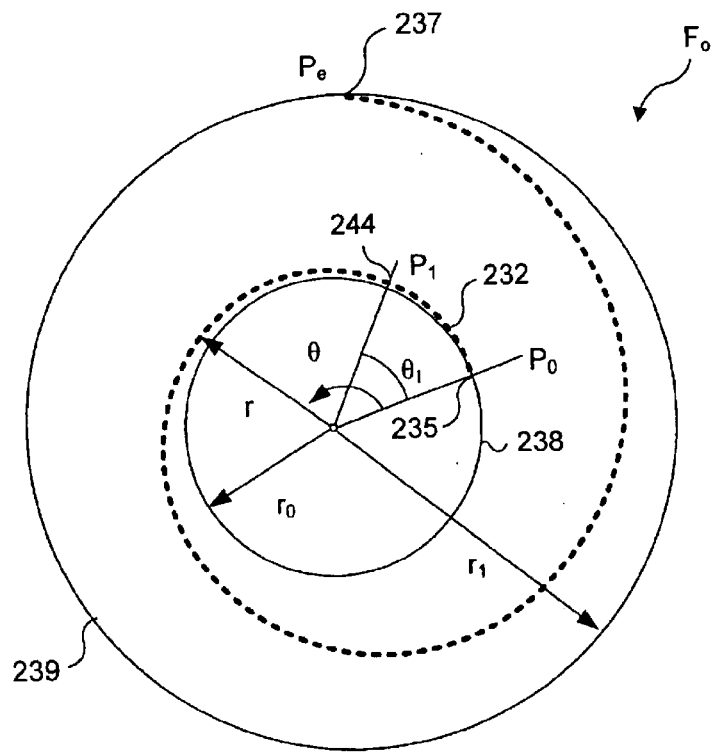
Figure 19B:
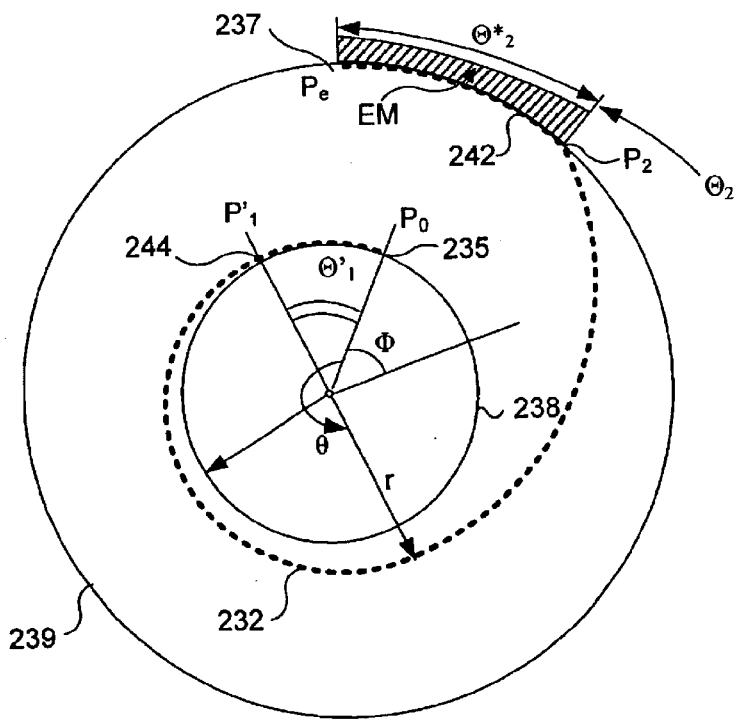
Figure 20:
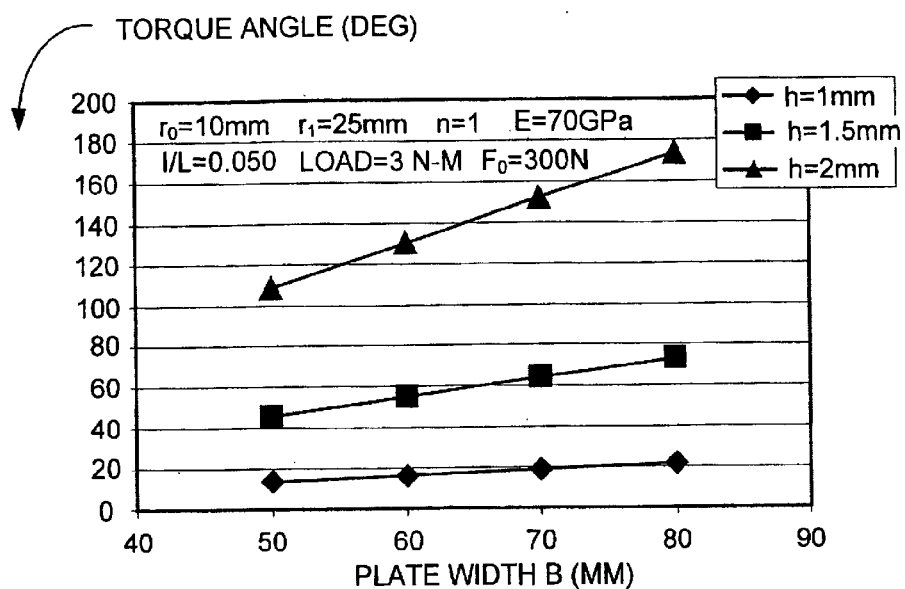
Figure 21:
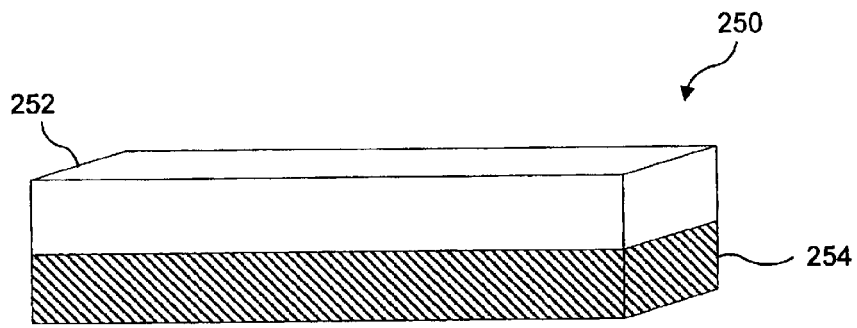
Figure 22:
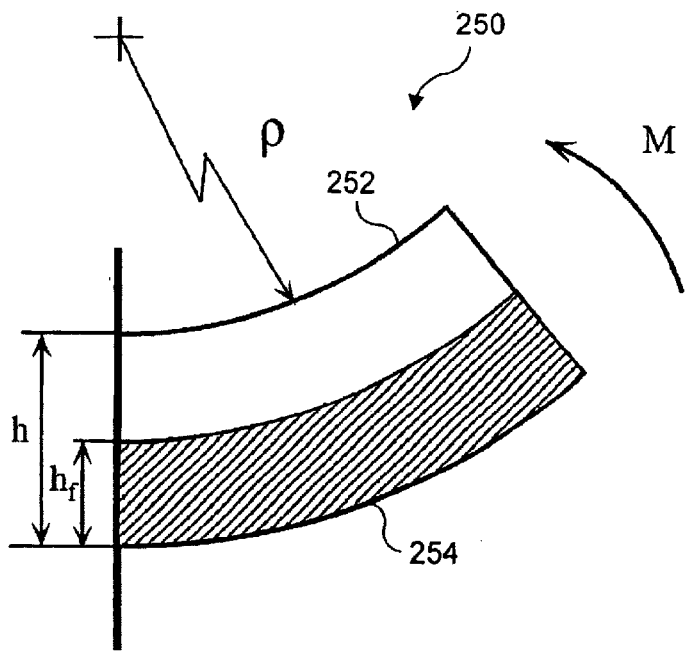
Figure 23:
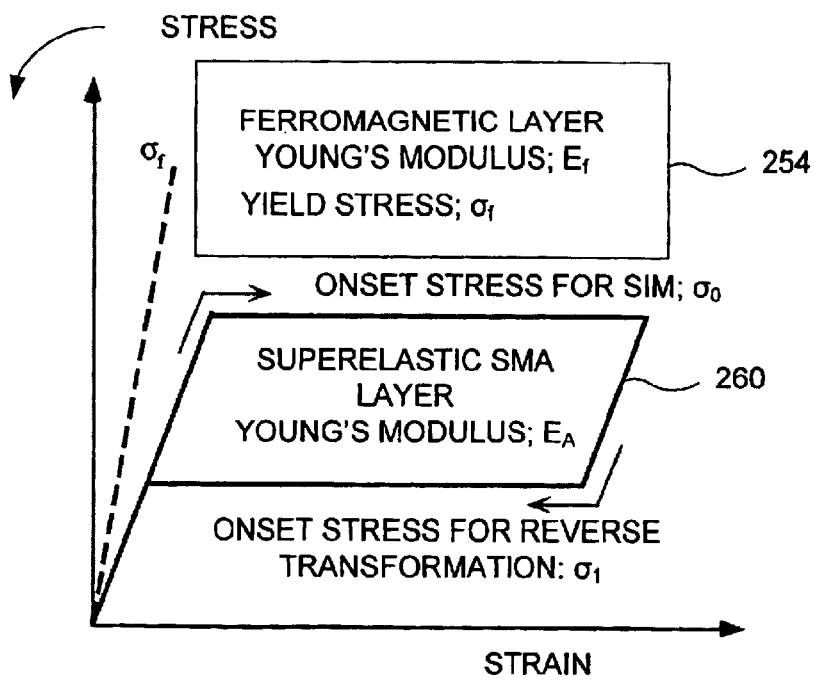
Figure 25A:
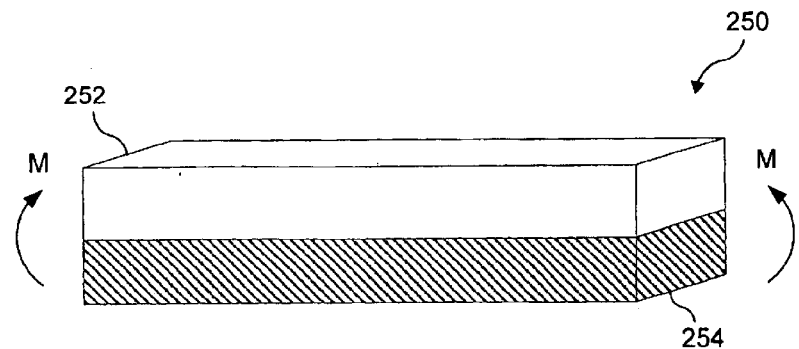
Figure 25B:
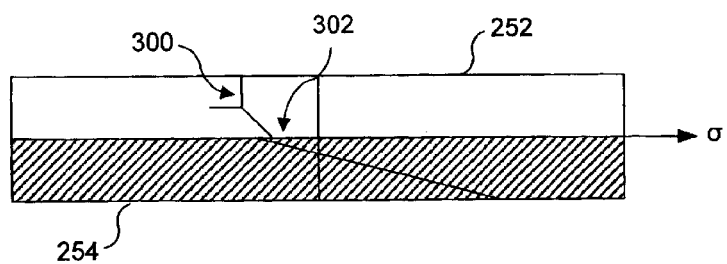
Figure 26A:
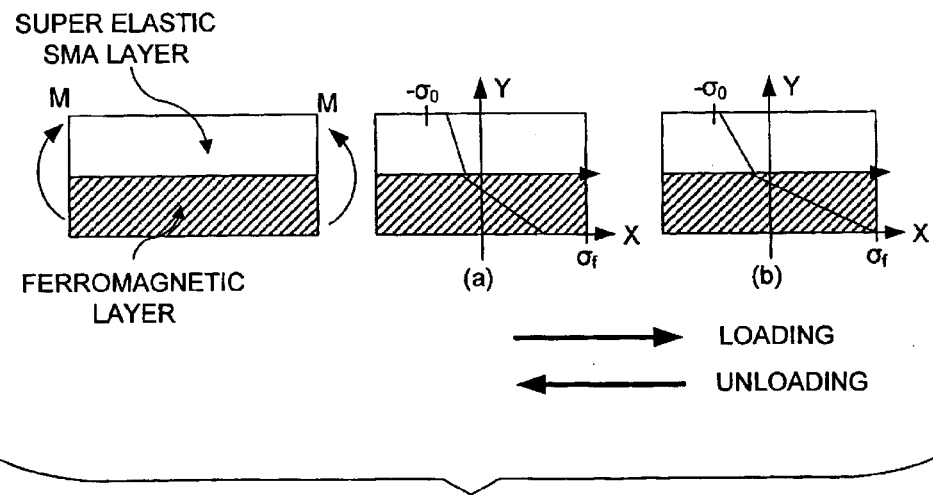
Figure 26B:
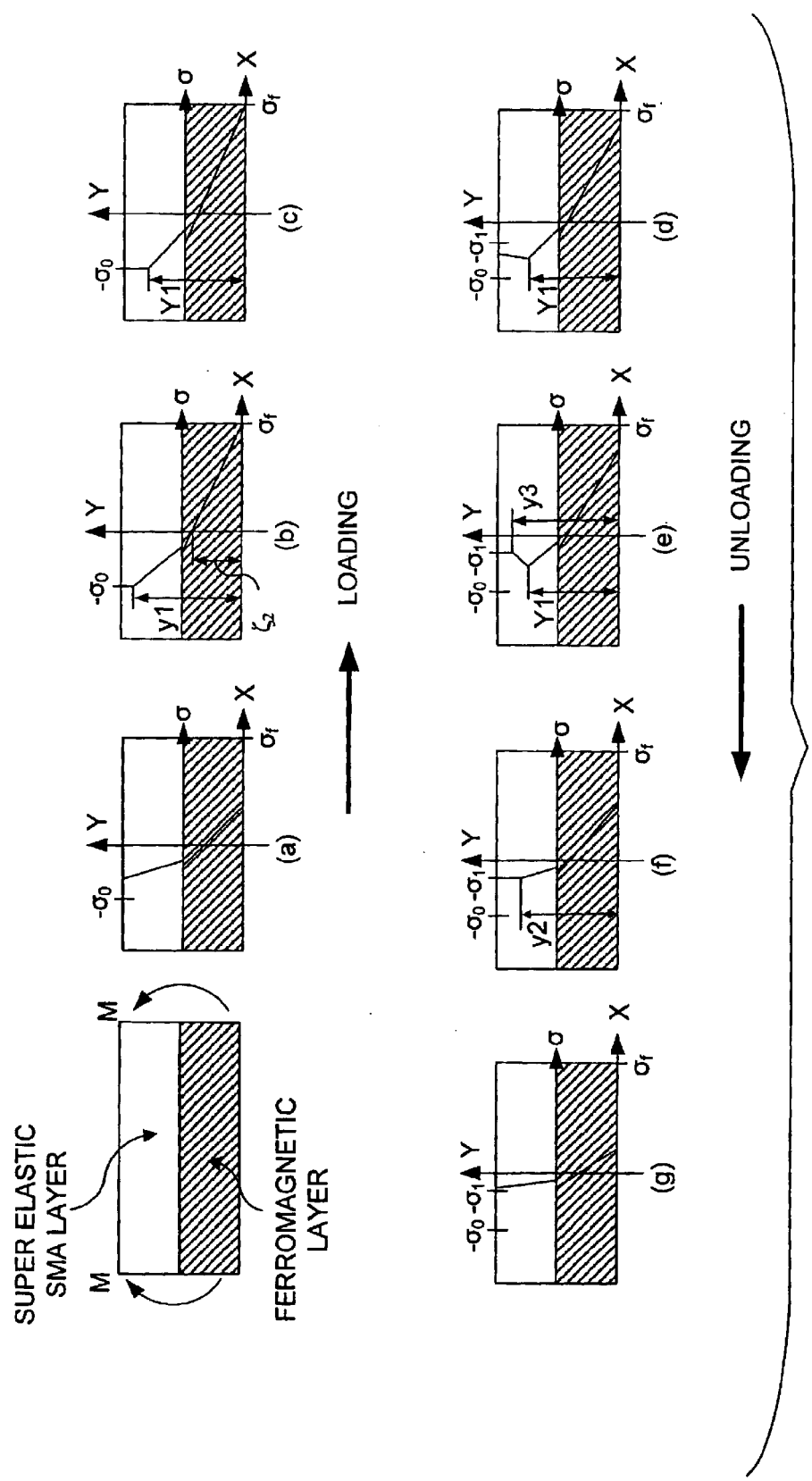
Figure 26C:
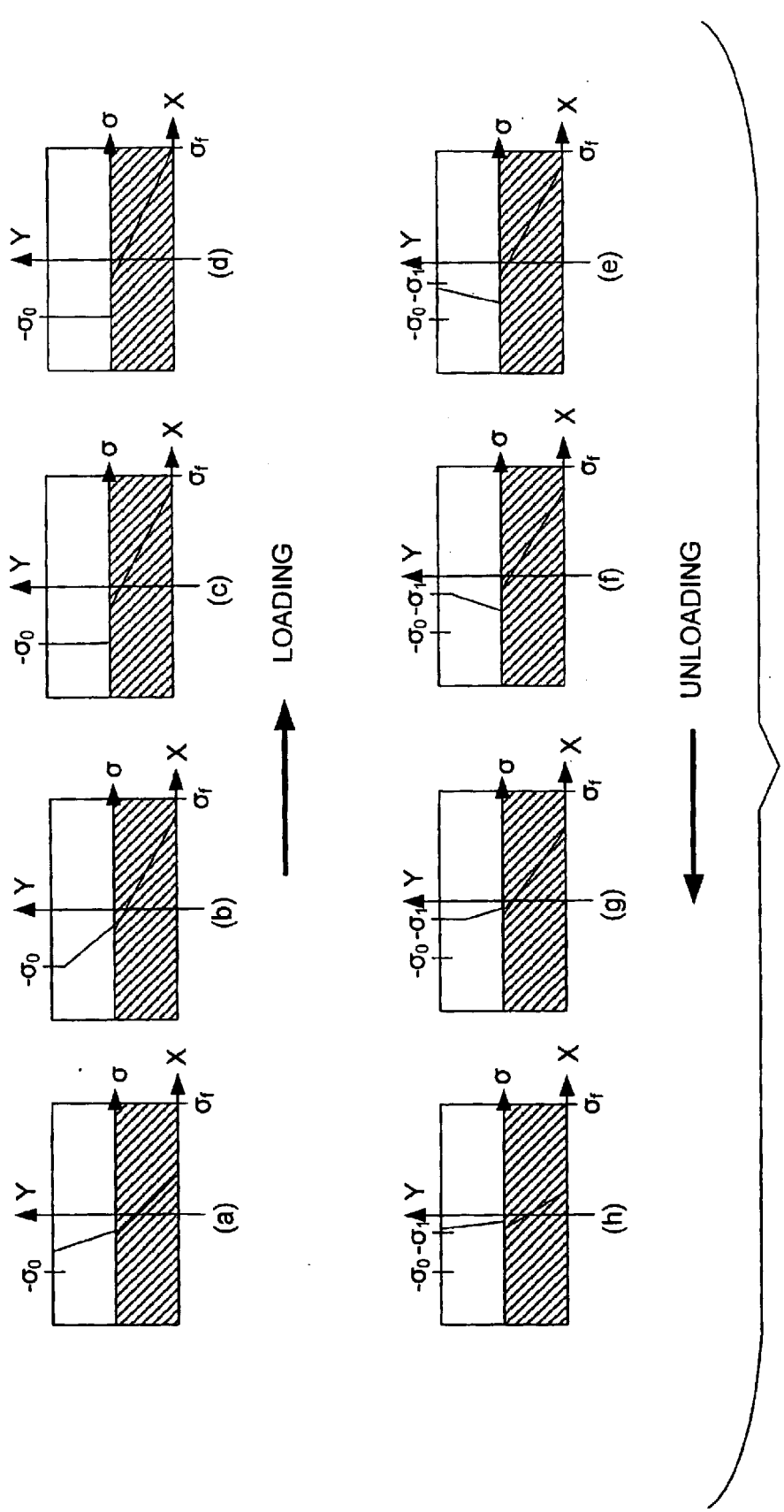
Figure 27:
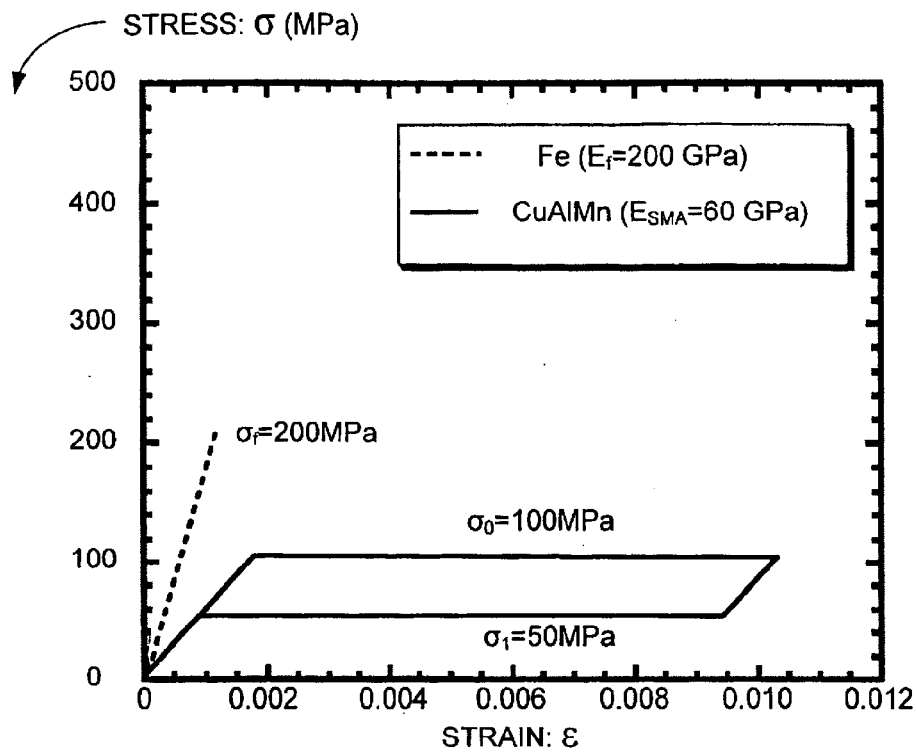
Figure 28:
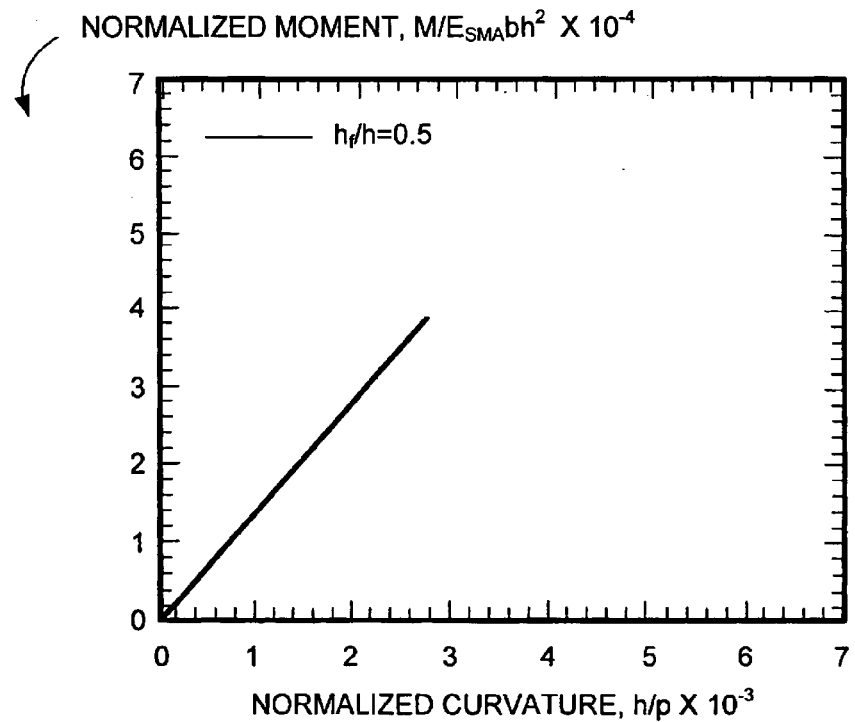
Figure 29:
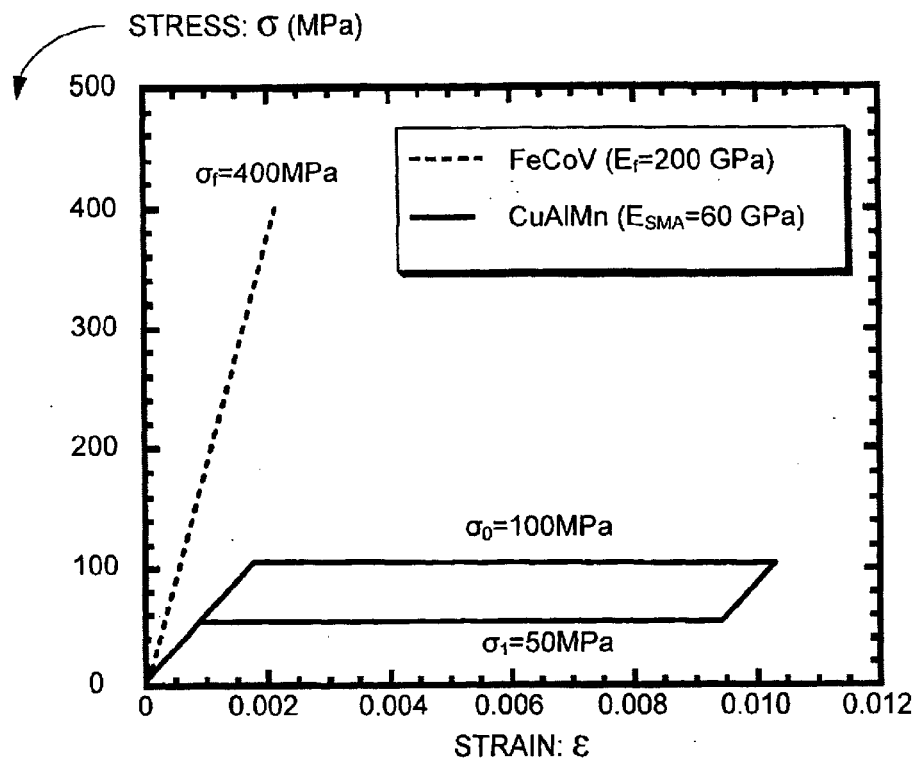
Figure 30:
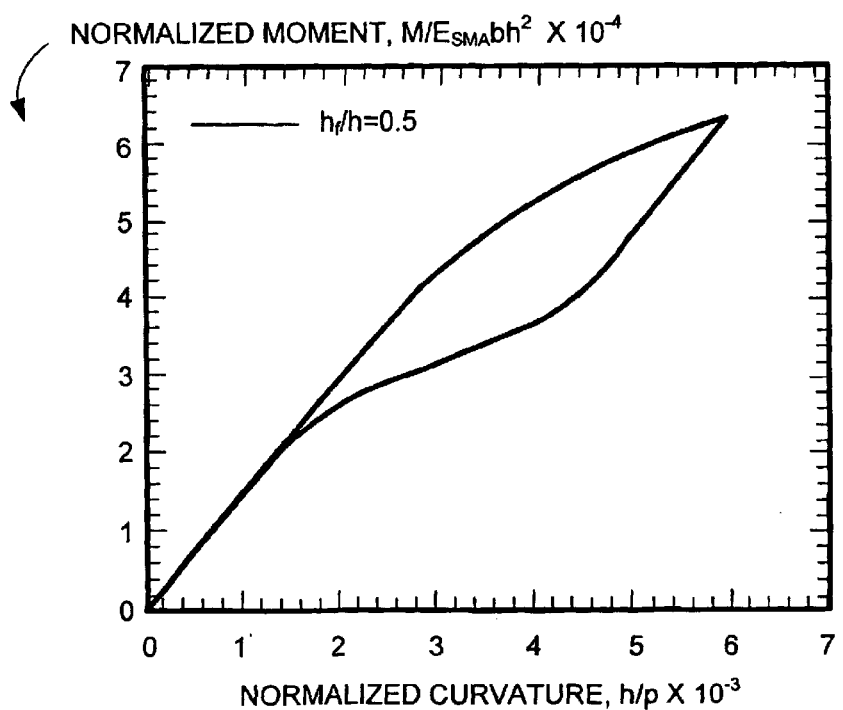
Figure 31:
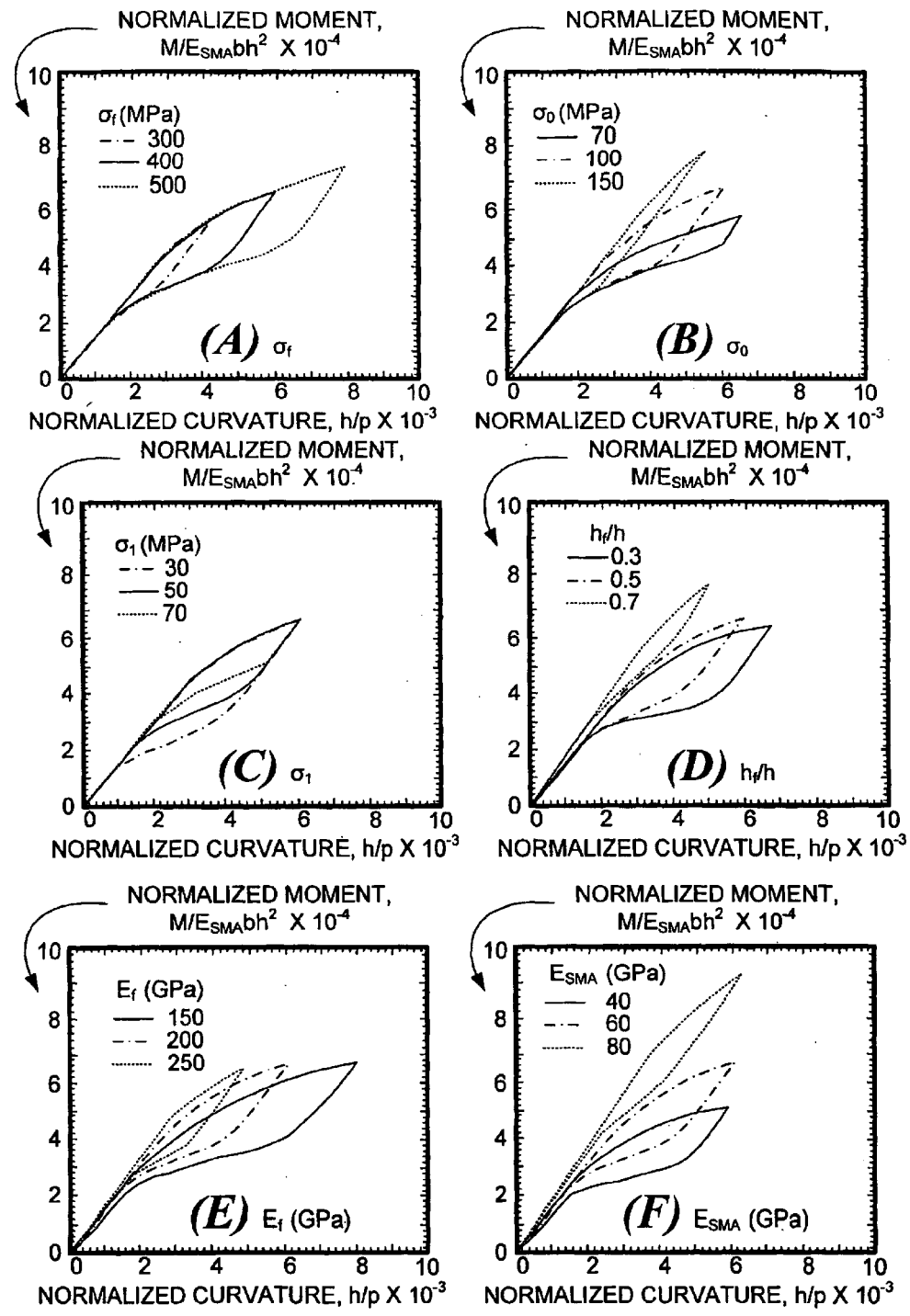
Figure 32:
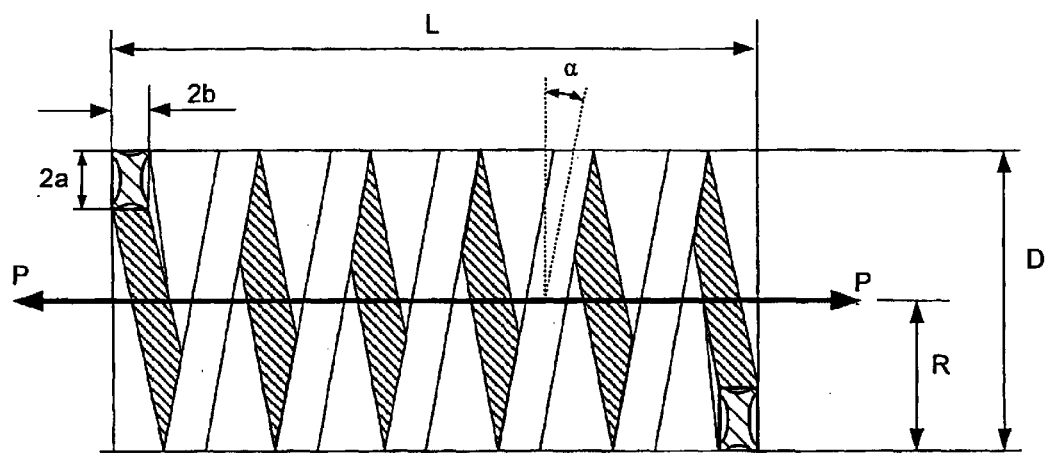
Figure 33A:
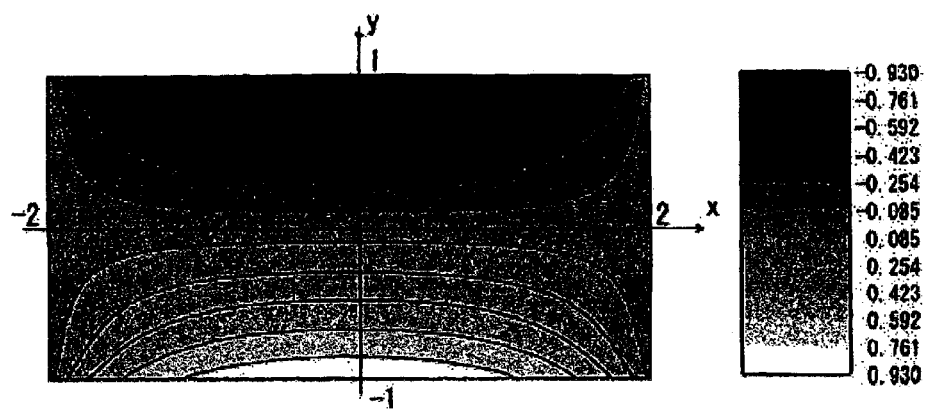
Figure 33B:
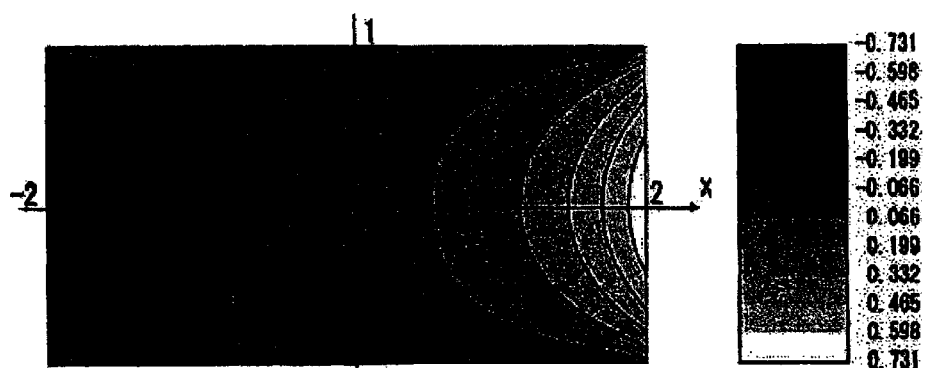
Figure 33C:
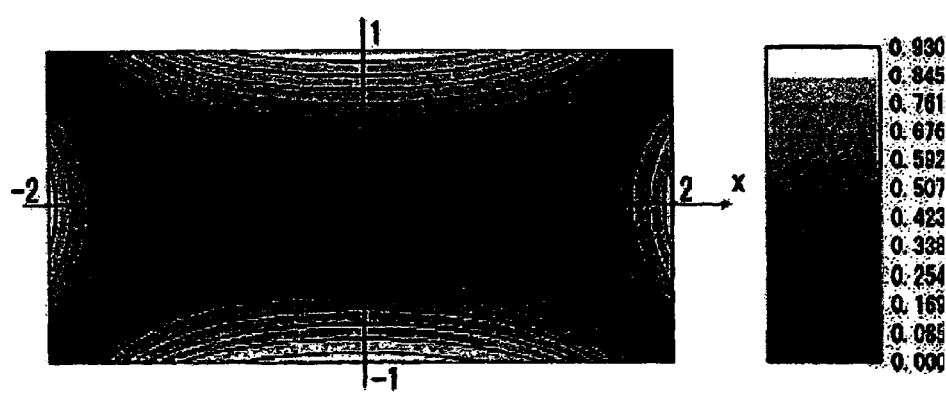
Figure 34:
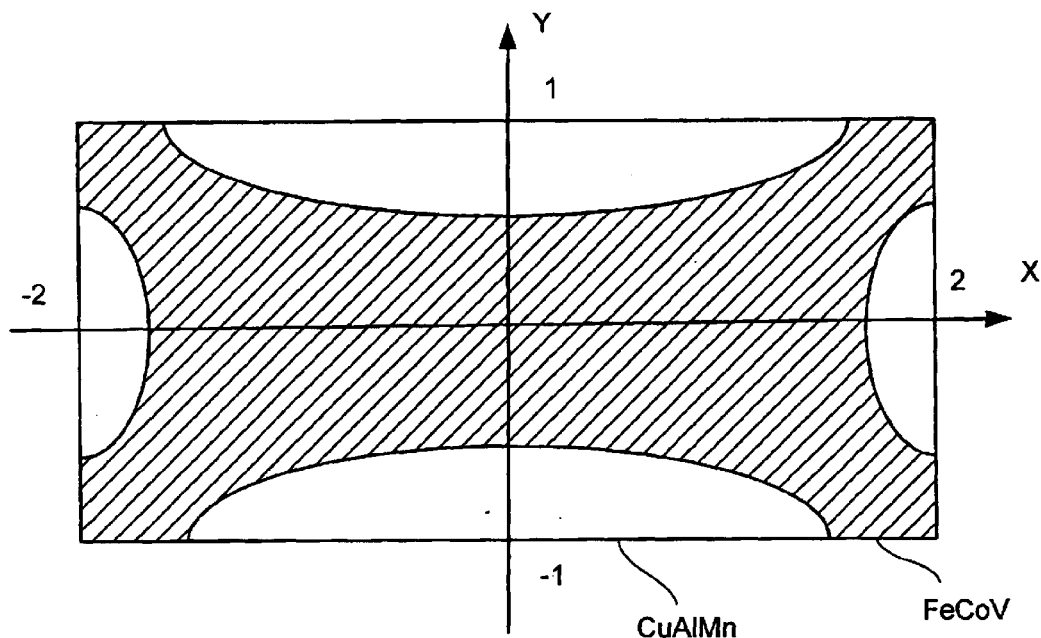
Figure 35:
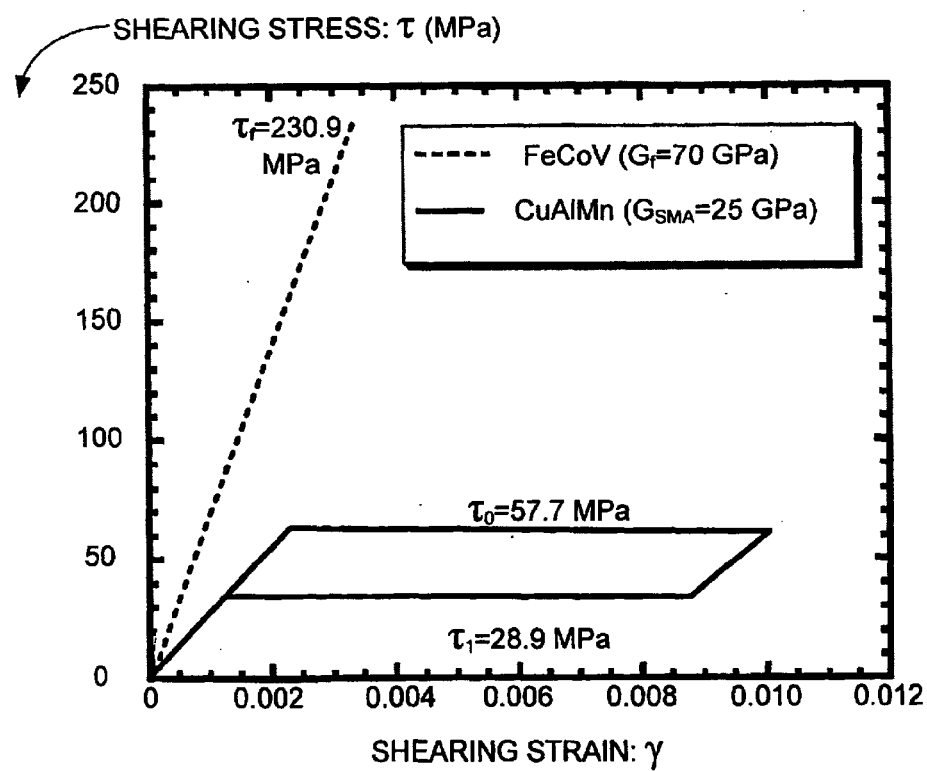
Figure 36A:
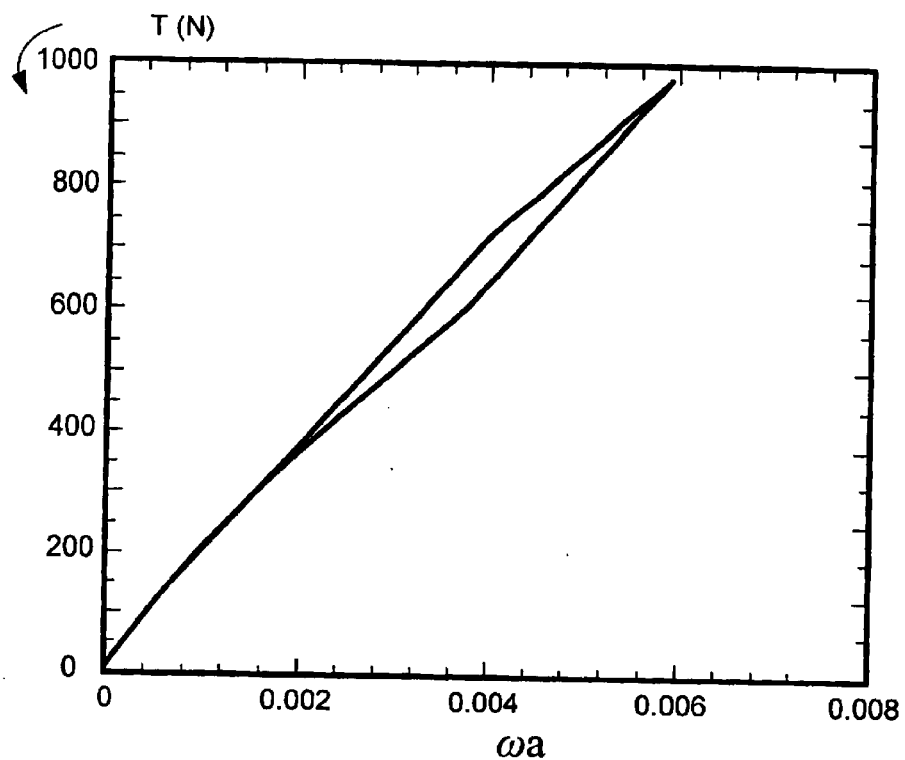
Figure 36B:
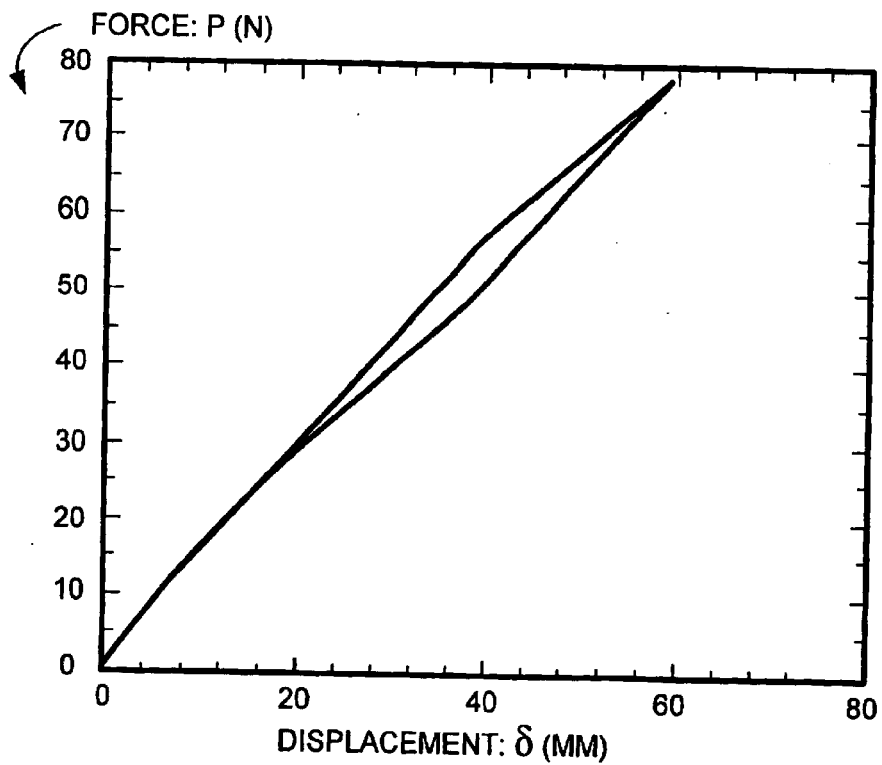
Figure 37:
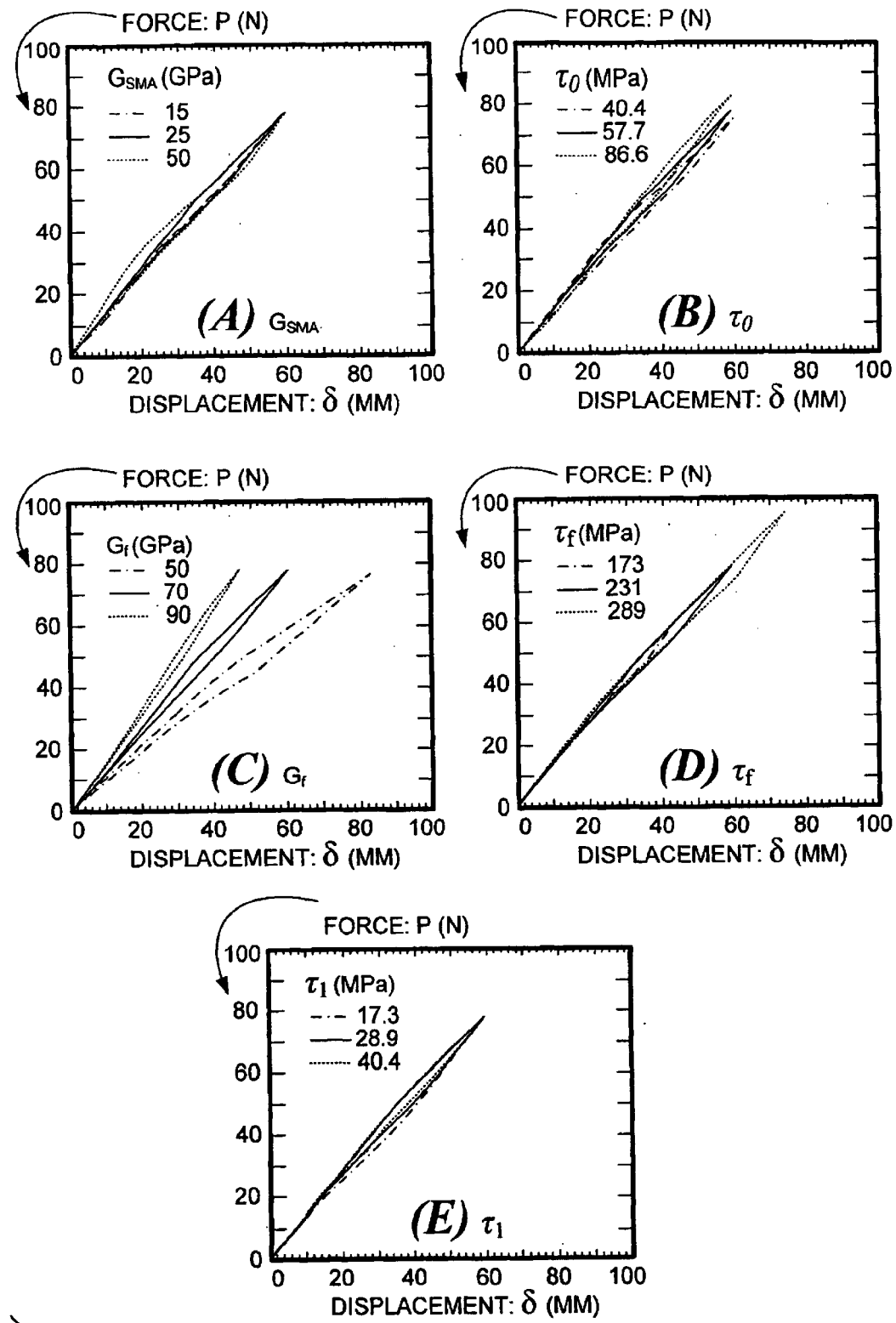
Figure 38:
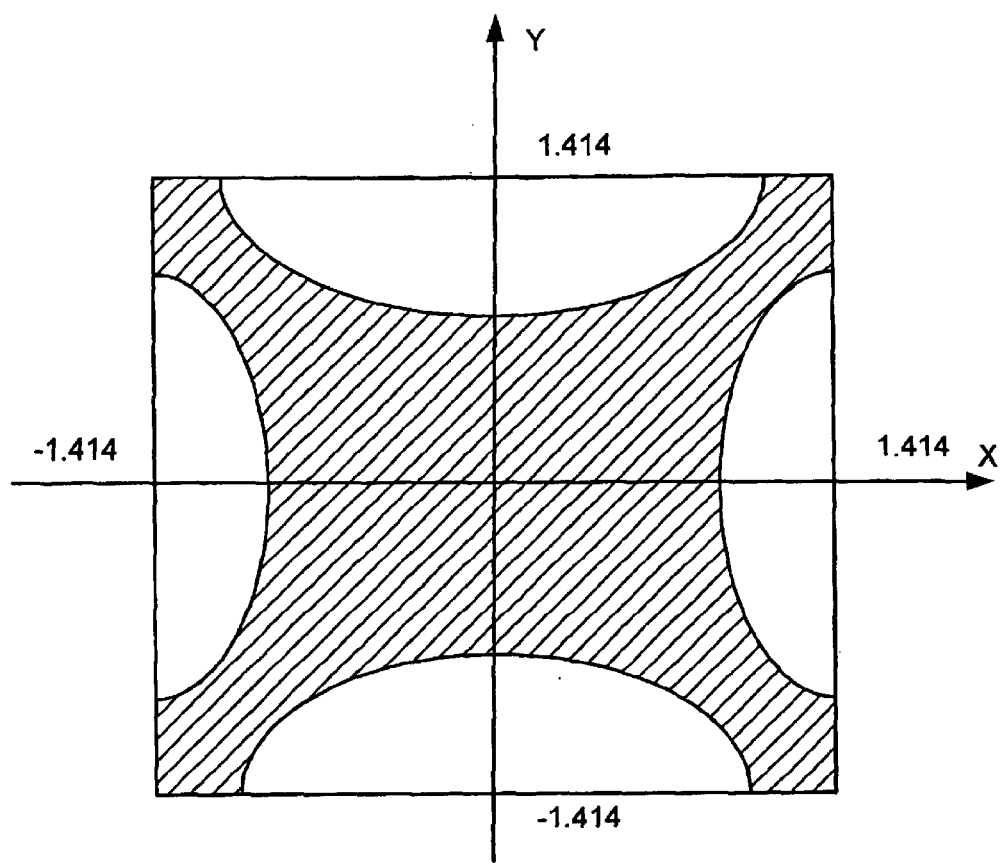
Figure 39:
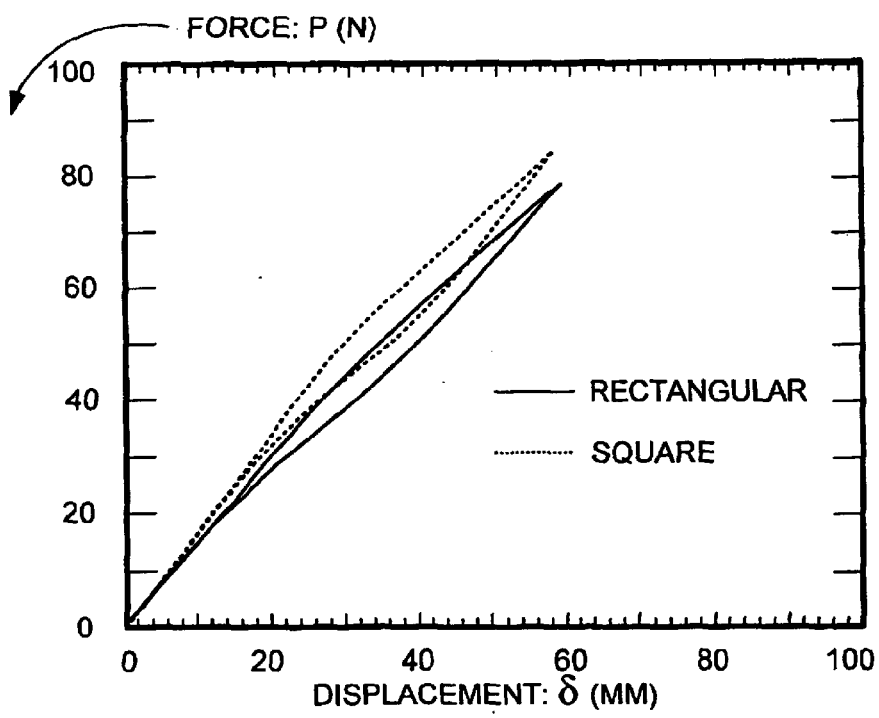
Figure 40A:
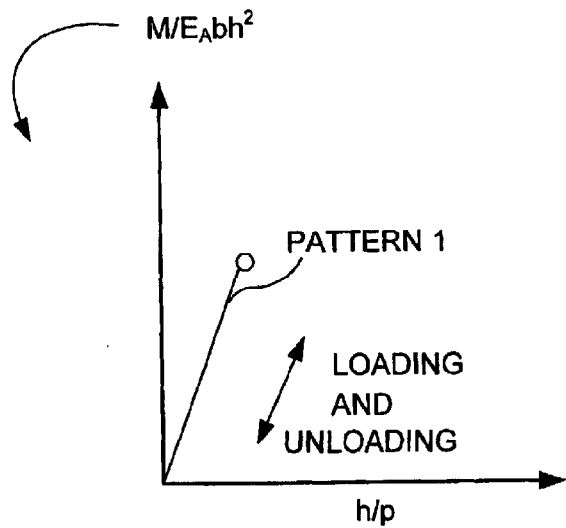
Figure 40B:
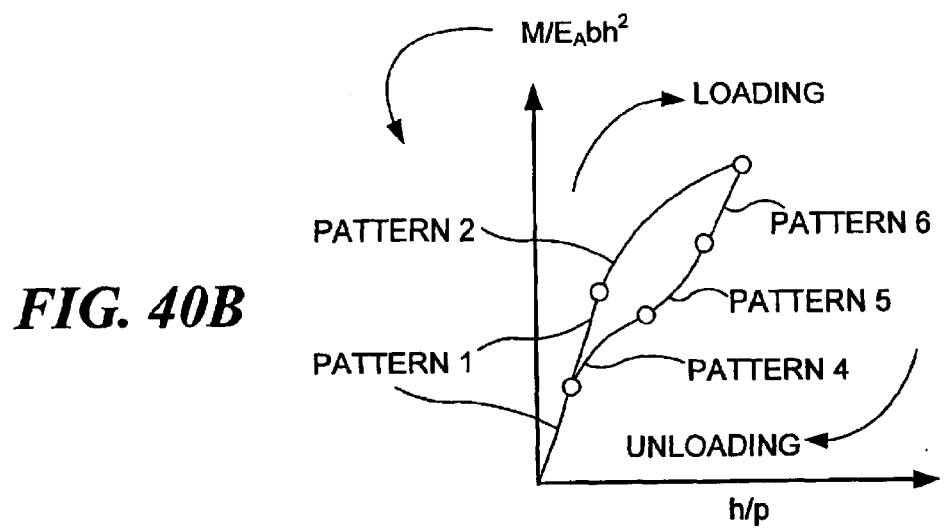
Figure 40C:
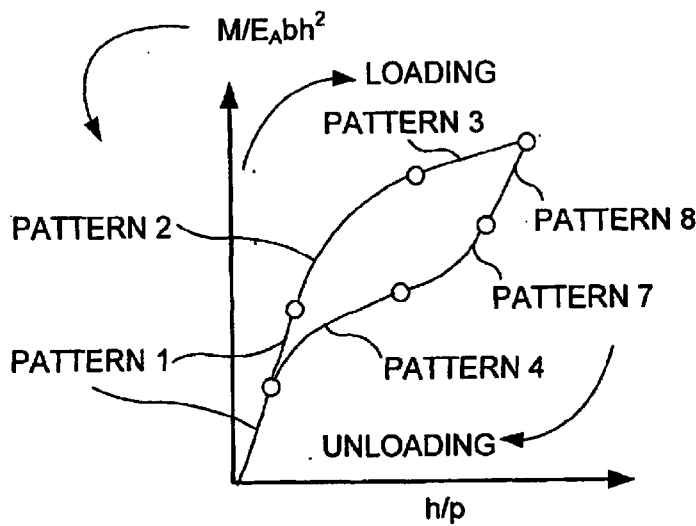

FIG. 10A schematically illustrates a FSMA composite-based spring actuator including only outer fences;

FIG. 10B schematically illustrates a FSMA composite-based spring actuator including only inner fences;

FIG. 11 is a visual representation of the forces acting on the spring of a spring-based actuator, which is referenced in the development of a model for analyzing such forces;

FIG. 12 graphically illustrates stresses induced in the ferromagnetic layer and the SMA layer of a FSMA composite spring, showing a linear discontinuity at the interface of the two layers;

FIG. 13A schematically illustrates yet another embodiment of a SMA spring-based actuator, which includes a stack of drive units and SMA springs;

FIG. 13B schematically illustrates the SMA spring-based actuator of FIG. 13A in a collapsed configuration, achieved after the drive units are energized;

FIG. 14 schematically illustrates a cross-sectional configuration of an exemplary drive unit for use in the SMA spring-based actuator of FIG. 13A;

FIG. 15A is an enlarged view of a portion of a drive unit substantially similar to the exemplary drive unit of FIG. 14, which includes only an upper permanent magnet, and provides a visual representation of magnetic forces when the drive unit is not energized;

FIG. 15B shows the portion of the drive unit of FIG. 15A, with a visual representation of magnetic forces when the drive unit is energized;

FIG. 15C is an enlarged view of a portion of the exemplary drive unit of FIG. 14, and includes a visual representation of magnetic forces when the drive unit is energized;

FIG. 16A illustrates a working model of a FSMA composite torque actuator including a coil formed of simple iron bars and TiNi wire in accord with the present invention, wherein the drive units of the torque actuator have not been energized;

FIG. 16B illustrates the torque actuator of FIG. 16A showing the movement of the FSMA composite coil after the drive units of the torque actuator have been energized;

FIG. 16C schematically illustrates how the FSMA composite coil of the torque actuator of FIGS. 16A and 16B is constructed;

FIG. 17A schematically illustrates a prior art torque actuator having an inner electromagnet and a ring of permanent magnets;

FIG. 17B schematically illustrates the magnetic forces acting on the prior art torque actuator of FIG. 17A;

FIG. 17C schematically illustrates the magnetic forces acting on the torque actuators of FIGS. 16A and 16B;

FIG. 18A schematically illustrates a preferred embodiment of a FSMA composite torque actuator, in which the iron bar and TiNi coil is replaced by a two layer FSMA composite plate, wherein the drive units of the torque actuator have not been energized;

FIG. 18B schematically illustrates the torque actuator of FIG. 18A showing the movement of the FSMA composite plate after the drive units of the preferred torque actuator have been energized;

FIGS. 19A and 19B are visual representations of the forces acting on the FSMA composite plate of the torque actuator of FIGS. 18A and 18B, which is referenced in the development of a model for analyzing such forces;

FIG. 20 graphically illustrates a torque angle and plate width relationship for FSMA composite plates used in the torque actuator of FIGS. 18A and 18B, which was produced using the model for analyzing forces acting on the preferred torque actuator developed in conjunction with FIGS. 19A and 19B;

FIG. 21 schematically illustrates a preferred cross-sectional shape for the FSMA composite plate for use in the torque actuator of FIGS. 18A and 18B;

FIG. 22 is a visual representation of the forces acting on preferred cross-sectional shape of FIG. 21 as the plate bends, as referenced in the development of a model for analyzing the bending forces;

FIG. 23 graphically illustrates a stress and strain relationship for FSMA composite plates for use in the torque actuator of FIGS. 18A and 18B, which was produced using the model for analyzing bending forces developed in conjunction with FIG. 22;

FIG. 24 graphically illustrates a bending force and curvature relationship for FSMA composite plates for use in the torque actuator of FIGS. 18A and 18B, which was produced using the model for analyzing bending forces developed in conjunction with FIG. 22;

FIG. 25A schematically illustrates a FSMA composite plate including a layer of ferromagnetic material and a layer of SMA, with the ferromagnetic layer applying a bending moment to the SMA layer;

FIG. 25B schematically illustrates a SMA phase transformation propagating from the surface of the SMA layer, with a linear discontinuity at the interface between the ferromagnetic layer and the SMA layer;

FIG. 26A schematically illustrates loading and unloading stresses experienced by the FSMA composite plate of FIG. 25A in a first of three potential stress domains;

FIG. 26B schematically illustrates loading and unloading stresses experienced by the FSMA composite plate of FIG. 25A in a second of three potential stress domains;

FIG. 26C schematically illustrates loading and unloading stresses experienced by the FSMA composite plate of FIG. 25A in a third of three potential stress domains;

FIG. 27 graphically illustrates a stress-strain curve for the FSMA composite plate of FIG. 25A when the ferromagnetic layer is implemented using iron, and the SMA layer is implemented using a CuAlMn alloy;

FIG. 28 graphically illustrates a bending moment and curvature relationship for the FSMA composite plate of FIG. 25A when the ferromagnetic layer is implemented using iron, and the SMA layer is implemented using a CuAlMn alloy, indicating that a super elastic plateau is not achieved by the Fe/CuAlMn composite;

FIG. 29 graphically illustrates a stress strain curve for the FSMA composite plate of FIG. 25A when the ferromagnetic layer is implemented using an alloy of iron, cobalt, and vanadium, and the SMA layer is implemented using a CuAlMn alloy;

FIG. 30 graphically illustrates a bending moment and curvature relationship for the FSMA composite plate of FIG. 25A when the ferromagnetic layer is implemented using an alloy of iron, cobalt, and vanadium, and the SMA layer is implemented using a CuAlMn alloy, indicating that a super elastic plateau is achieved by the FeCoV/CuAlMn composite;

FIG. 31 graphically illustrates the results of parametric studies performed to determine the effects of material parameters and geometric parameters analyzed using a model describing the bending moment and curvature of the FSMA composite plate of FIG. 25A;

FIG. 32 is a visual representation of the forces acting on a spring, and spring parameters employed to develop a model of the spring in accord with yet another aspect of the invention, wherein the model of the spring describes the behavior of a FSMA composite spring;

FIGS. 33A–33C are contour line distributions of shear-strain components experienced by a spring having a rectangular cross section;

FIG. 34 schematically illustrates a preferred cross-sectional shape for a FSMA composite spring derived using the spring model and contour line distributions of FIGS. 33A–33C;

FIG. 35 graphically illustrates a stress-strain curve for a FSMA composite spring, when the ferromagnetic layer is implemented using an alloy of iron, cobalt and vanadium, and the SMA layer is implemented using a CuAlMn alloy;

FIG. 36A graphically illustrates the relationship between the torque and the normalized twist angle for a FSMA spring of defined dimensions, a stress-strain curve for a FSMA composite spring indicating that the torque rises proportionally to an increase in the twist angle;

FIG. 36B graphically illustrates the relationship between the spring force and the displacement of a FSMA spring of defined dimensions;

FIG. 37 graphically illustrates the results of parametric studies performed to determine the effects of material parameters and geometric parameters analyzed using the spring model based on FIG. 32;

FIG. 38 schematically illustrates a generally square cross-sectional shape for a FSMA composite spring, so relative performances of the preferred cross-sectional shape of FIG. 34 and the square cross-sectional of FIG. 38 can be compared using the spring model based on FIG. 32;

FIG. 39 graphically illustrates the relationship between the spring force and spring displacement for FSMA composite springs having the preferred cross-sectional shape of FIG. 34 and the square cross-sectional of FIG. 38; and FIGS. 40A–40C graphically illustrate the relationship between the normalized bending moment and the normalized curvature of the FSMA composite plate of FIG. 25A, classified into eight patterns.

DESCRIPTION OF THE PREFERRED EMBODIMENT

The present invention encompasses an optimized cross sectional shape for a FSMA composite to be utilized in a spring type actuator, an improved hybrid magnetic trigger for use in FSMA based actuators, a FSMA composite based spring type actuator, a FSMA based spring type actuator including a stack of triggering units and FSMA springs, a FSMA composite based torque actuator, and a model that can be employed to evaluate different materials that are being considered as components of a FSMA composite for use in a torque actuator and a spring actuator.

Single FSMA Component Spring Actuator

The present invention encompasses a spring actuator based on a FSMA composite. Development of the FSMA composite-based spring actuator included the use of a model to determine an optimized cross-sectional shape for the composite used to produce the spring, as well as improvements to the hybrid magnetic trigger, which resulted in a superior distribution of magnetic flux. The model, as will be described in greater detail below, lead to a conclusion that a modified rectangular ferromagnetic core, with SMA deposited in depressions formed on each side of the rectangle, represented an optimal configuration. The improvements to the hybrid magnetic trigger involve several different configurations of fences, or flux distributors, that are disposed between the electromagnet and the FSMA spring to improve the magnetic flux distribution that induces the phase change in the FSMA, to cycle the actuator.

Spring actuators are widely used to provide a large axial stroke with a modest force. FIG. 1A illustrates a prior art spring actuator 102 utilizing a polycrystalline FePd wire spring 104 having a rectangular cross section with a width a and a height b (see FIG. 1B). The spring is coupled to a yoke 106, which is in turn coupled to a hybrid magnetic trigger 108, or drive unit. The yoke enables magnetic flux from the hybrid magnetic trigger to reach spring 104. As will be described in greater detail below, several embodiments of the present invention use a hybrid magnetic trigger that includes both a permanent magnet and an electromagnet. The permanent magnet alone does not produce a sufficiently strong magnetic field to induce the desired transformation in the FSMA. By including the permanent magnet, a smaller electromagnet can be used to control the actuation, because the magnetic fields of the permanent magnet and the electromagnet combine to induce the phase change in the FSMA when the electromagnet is energized.

The Z-axis in FIG. 1A is parallel to a center axis of the spring and the yoke. FIG. 1C shows spring 104 in a collapsed position. In the event that the first turn of the coil spring is directly fixed to the yoke, the pitch δ should be a function of the value of z, i.e., δ=f(z), where z is the distance from the yoke along the center axis of the spring. The function f(z) should increase slightly when the value of z is very small, and the derivative df/dz (z=0) must be zero in order to connect the coil spring to the yoke directly.

FIGS. 2A–2C illustrate a single cycle of spring actuator 102. In FIG. 2A, a hybrid magnetic trigger 108 is not energized and spring 104 is fully extended. In FIG. 2B, the electromagnet in hybrid magnetic trigger 108 is energized, and the combined magnetic fields of the electromagnet and the permanent magnet in hybrid magnetic trigger 108 induce a phase change in a portion 110 of spring 104. Initially, when hybrid magnetic trigger 108 is energized, a first turn of spring 104 (i.e., the turn closest to yoke 106) is attracted to the yoke and comes into contact with the top face of the yoke. The second turn is then attracted to the first turn, and the second turn comes in contact with the first turn (i.e., the spring begins to collapse). This process is repeated until the spring is fully collapsed, as shown in FIG. 2C, wherein portion 110 encompasses all of spring 104.

Preferably, each turn of the spring should fully contact its neighboring turns. Thus, the rectangular shape for the cross section of the spring wire is better than a circular shape cross section. The magnetic flux from the hybrid magnetic trigger can more easily penetrate into a stack of spring coils having a rectangular cross section. Unless the first turn of the coil spring closest to the yoke makes contact with the yoke, the magnetic flux from the hybrid magnetic trigger will not collapse the coil, in which case the actuator will not function. Preferably, the pitch (δ) should be determined so as to induce the elastic or super elastic deformation of the first turn of the coil spring due to the magnetic force around the upper portion of the yoke (i.e., adjacent to portion 110 as shown in FIG. 2B).

Figure 3:
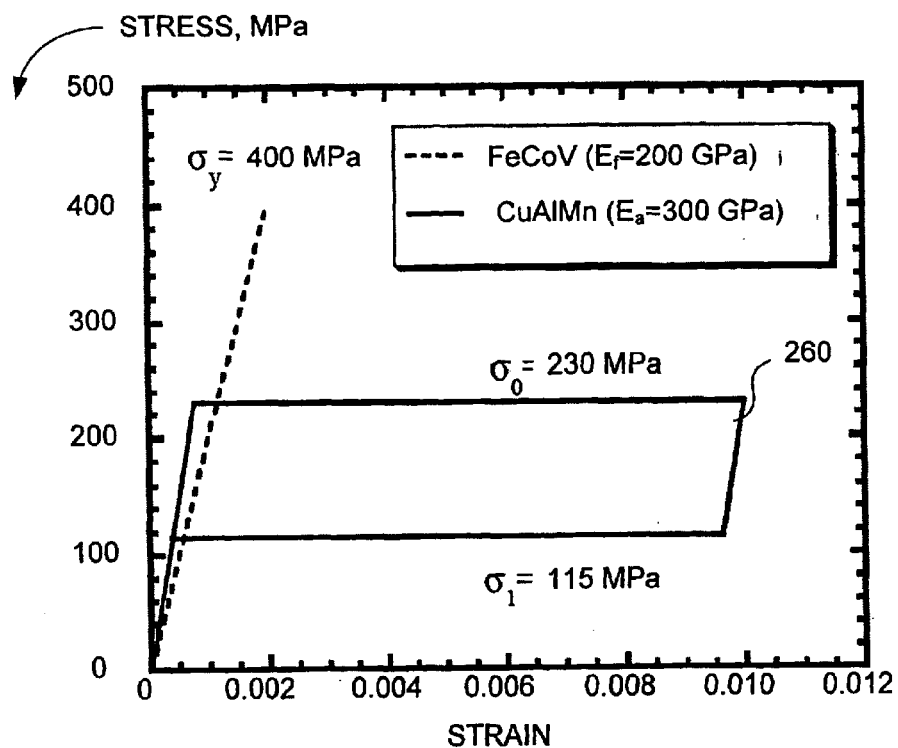

As noted above, spring actuator 102 showed great promise, but the cost of the FePd alloy is too great for FePd-based actuators to be economically commercially viable. This concern led to research involving the use of a FSMA composite produced using a ferromagnetic material (such as iron) and a SMA. It was determined that iron and an alloy of copper, manganese, and aluminum (CuAlMn) could be employed to achieve an FSMA composite with the desired properties. FIG. 3 graphically illustrates a stress and strain relationship for this FSMA composite, with only the elastic portion of FE being shown, wherein the super elastic portion for the CuAlMn alloy is idealized.

Figure 4:
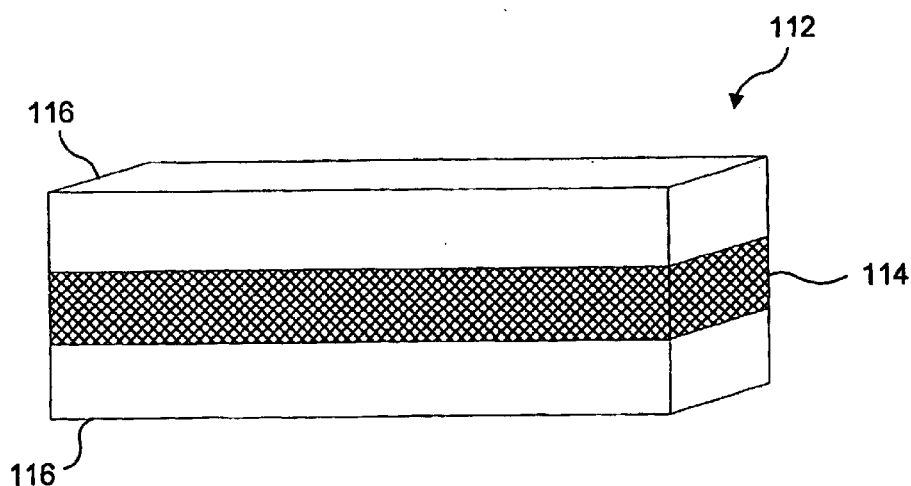

As indicated above, studies of the FePd-based spring actuator concluded that a generally rectangular cross section (with the width being greater than the height) represented a preferred cross-sectional shape. FIG. 4 schematically illustrates a prior art FSMA composite 112 that was investigated as a potential alternative to the more expensive FePd. FSMA composite 112 includes a ferromagnetic layer 114 sandwiched between two layers of SMA. Ferromagnetic layer 114 was implanted using either Fe or FeCoV alloy, while layers 116 were implemented using either TiNi or TiNiCu alloy. FSMA composite 112 has a generally rectangular cross section. This approach enables a SMA material having good mechanical properties to be combined with a material having high magnetic properties, to achieve a desired FSMA composite. While such research indicated that practical and cost effective FSMA composites are indeed achievable, unfortunately, FSMA composite 112 did not perform as well as the prior art FePd composite material discussed above.

Figure 5:
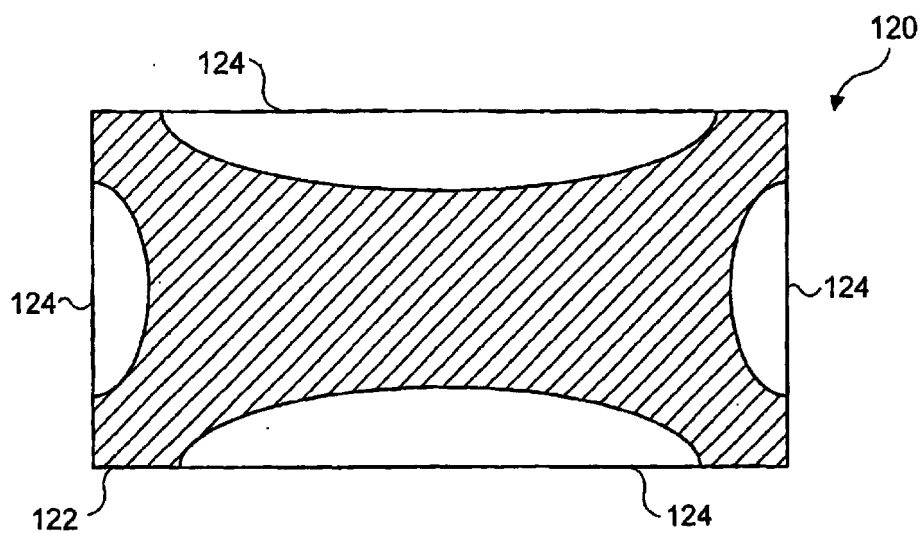

Once Fe and CuAlMn alloy were identified as possible alternatives to FePd, further modeling was performed to optimize the cross-sectional shape of an a FSMA composite formed of Fe and CuAlMn alloy, to be used in a spring actuator. FIG. 5 illustrates a FSMA composite 120 having an optimized cross-sectional shape that was identified. FSMA composite 120 has a generally stretched X-shaped Fe core 122, with CuAlMn alloy regions 124 attached peripherally.

Figure 6:
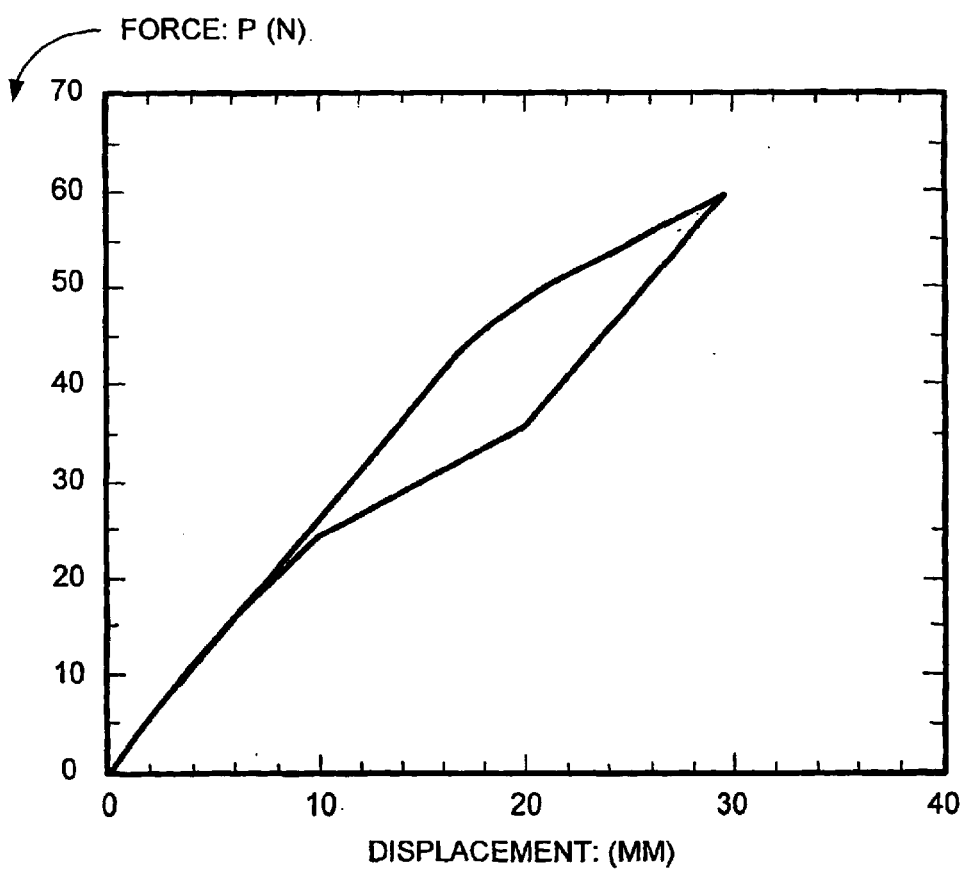

FIG. 6 graphically illustrates a force (P) and displacement (δ) relationship computed based on the optimized cross section for FSMA composite 120. The force and displacement relationship of FIG. 6 is based on a spring having a length (L) of 100 mm, a diameter (D) of 25 mm, and a pitch (p) of 5 mm, with a width for the generally rectangular cross section being 4 mm, and a height of the generally rectangular cross section being 2 mm. The force and displacement relationship of FIG. 6 predicted by the present model clearly indicates super elastic behavior with the maximum force and stroke being 60 N and 30 mm, respectively.

Having identified the optimum cross-sectional shape, cost effective methods of producing FSMA composite 120 were investigated. One method for producing the desired cross-sectional shape involves machining rectangular iron bar stock of the appropriate size to remove material from each face of the bar stock. A more efficient technique is to modify the extrusion rollers producing rectangular bar stock to generate the desired stretched-X shape. Investing in extrusion tooling requires higher capital costs, but production costs of the stretched X-shape produced by extrusion compared to machining (i.e., the removal of material on the faces) is far less. Once the desired stretched X-shape is achieved, the CuAlMn alloy is spray cast into the depression formed on each face of the Fe core. Forming FSMA composite 120 into the optimized cross-sectional shape in a single processing using a co-extrusion process is also a possibility. Calculations related to the relationships illustrated in FIGS. 3 and 6 are provided below.

Referring now to FIG. 7, an improved FSMA composite spring actuator 140 includes a spring 142 formed of the Fe/CuAlMn FSMA composite described above. Preferably, spring 142 has the optimized cross-sectional shape described above and is mounted to a yoke 144, which includes outer fences 146a and inner fences 146b. These fences act as magnetic flux distributors to improve the magnetic coupling between hybrid magnetic trigger 148 and spring 142, as well as helping hold the bottom end of spring 142 in place. Spring actuator 140 has a center axis 154. Hybrid magnetic trigger 148 includes a plurality of electromagnets 150 and a plurality of permanent magnets 152. A working model using the above-noted FePd SMA has been produced with separate electromagnets, and four permanent magnets. Of course, hybrid magnetic triggers having more, or fewer permanent magnets or electromagnets can also be employed.

Before discussing the improved hybrid magnetic trigger, it may be helpful to review the mechanisms by which phase transformations are induced in FSMAs. The three mechanisms associated with FSMAs that can be utilized to cause the actuator materials to transform and provide the actuation movement are: (i) magnetic field-induced phase transformation; (ii) Martensite variant rearrangement; and, (iii) a hybrid mechanism. The hybrid mechanism involves sequential events, including applying a magnetic field gradient, such that magnetic force and stress inducing a phase transformation from stiff Austenite to soft martensite, which contributes to a greater Martensite, which enhances a larger displacement or stroke. To enable a large stroke to be achieved, the hybrid mechanism is preferred.

Having determined the preferred spring material (Fe/CuAlMn alloy), the optimal cross-sectional shape (FIG. 5), and exemplary spring dimensions (L=100 mm, D=25 mm, p=5 mm, a=4 mm, and b=2 mm), optimization of the hybrid magnetic trigger was attempted using finite element analysis techniques. The magnetic flux provided by hybrid magnetic trigger 148 (FIG. 7), including neodymium permanent magnets and electromagnets, combined with iron yoke 144 and fences 146a and 146b was analyzed using the finite element analysis software ANSYS®. The neodymium permanent magnets used have a relative permeability $\mu_r$=1.17, and a coercive force Hc=835,000 Amp/m. The B-H curves of prior art FePd spring 104 (see FIG. 1A) and Fe yoke 144 (with fences 146—see FIG. 7) were also input to the data set. Note that fences 146 were incorporated based on an understanding that the magnetic flux should not "leak out" from the yoke when the electromagnet is turned off. The finite element analysis was performed to determine how effective the fences are in enhancing the distribution of magnetic flux from the hybrid magnet trigger in the FSMA spring.

FIG. 8 illustrates the magnetic flux vectors obtained from the finite element analysis, and FIG. 9A illustrates the magnetic flux lines obtained from the finite element analysis when the hybrid magnet system is turned on. Note FIG. 8 and FIG. 9A show only a right half of spring actuator 140, with respect to center axis 154 (see FIG. 7). Preferably, when the electromagnet is turned off, magnetic flux losses into the ambient from the yoke should be minimal. Fences 146 both help hold the spring in position at the top of the yoke, and also direct the magnetic flux lines into the spring. When the electromagnet is turned on, the magnetic flux originating from both the electromagnet and the permanent magnet preferably penetrates through the majority of the spring, which together with the yoke forms a closed loop, enabling stronger magnetic forces to be obtained. In this two-dimensional (2-D) simulation, the spring was approximated by rectangular cross sections.

Actuators shown in FIGS. 7, 8, and 9A include both inner and outer fences. FIGS. 9B and 9C (similarly showing only the right half of an actuator) illustrate the magnetic flux lines obtained from finite element analysis of actuators that include only outer fences (FIG. 9B), and only inner fences (FIG. 9C). All fences are made of soft iron and function as a part of the yoke of the hybrid magnetic trigger to enhance magnetic coupling with the spring element. Based on numerical results obtained through the finite element analysis, the fence configurations shown in FIG. 9B (outer fences only) and 9C (inner fences only) result in a larger magnetic force being applied to coils of the spring closest to the hybrid magnetic trigger. In contrast, the fence configuration of FIG. 9A (both inner and outer fences) results in the highest concentration of magnetic forces being applied at a tip of the upper housing. Because the spring must be attracted to the hybrid magnetic trigger in order to collapse the spring, the configurations of FIGS. 9B (outer fences only) and 9C (inner fences only) are preferred. Furthermore, since a denser distribution of magnetic flux lines provides a higher magnetic force, and less distribution of the flux lines into ambient air indicates less leakage of the magnetic forces, the outer fence only configuration of FIG. 9B is particularly preferred.

FIG. 10A illustrates a spring actuator 140a including the most preferred outer only configuration, whereas FIG. 10B illustrates a spring actuator 140b including the preferred inner only configuration.

Calculations pertinent to the FSMA composite spring actuator will now be discussed. For a given geometry of an a FSMA composite spring 160, which is shown in FIG. 11, includes a ferromagnetic layer 162 and a SMA layer 164, the application of torque T results in a linear shear-strain γ, which increases linearly with a radius r. The distribution of shear-strain within the two region spring (i.e. the ferromagnetic region and the SMA region) is expected to include a discontinuity at the interface of the two regions, as shown in FIG. 12.

The constraints in modeling the mechanical behavior of a composite with a rectangular cross section are such that the shear-stress level in the SMA region remains sufficiently high to induce Martensite transformation, resulting in super elastic behavior, while the ferromagnetic core region remains elastic. Assume composite coil spring 160 includes a super elastic TiNi alloy tube (SMA 164) and a ferromagnetic core (ferromagnetic layer 162) under a uniaxial external load P. In the following analysis, two coordinate systems are introduced, i.e., a global coordinate system (X, Y, Z) attached to the spring, and a local coordinate system (x, y, z) attached to the wire.

In this case, a moment M and an internal force Q acting on the cross section of the wire are expressed in the local coordinates as follows:

$$M_x=0, M_y=PR \sin\alpha, M_z=PR \cos\alpha \quad (1)$$

$$Q_x=0, Q_y=P\cos\alpha, Q_z=P\sin\alpha \quad (2)$$

If the specific length of the coil spring is related by a, b, p<<D, where a and b are ½ of the height and width of a rectangle, p is the pitch, and D is the diameter of spring, the following stress components can be neglected, and the stress field is analyzed under shear-stress condition of $\tau_{zx}$ and $\tau_{zy}$.

$$\tau_{xy}, \sigma_x, \sigma_y, \sigma_z=0 \quad (3)$$

Therefore, the equivalent von Mises stress is given by:

$$\sigma_e = [3(\tau_{yz}^2 + \tau_{zx}^2)]^{\frac{1}{2}} = \sqrt{3}\,\tau \quad (4)$$

and the onset shearing stress for the stress induced Martensite transformation (SIM) and reverse transformation (RT), $\tau_0$ and $\tau_1$, are:

$$\tau_0 = \tau_{SIM} = \frac{\sigma_0}{\sqrt{3}}, \tau_1 = \tau_{RT} = \frac{\sigma_1}{\sqrt{3}} \quad (5)$$

where $\sigma_0$, $\sigma_1$ are the onset stresses for SIM and RT, respectively, under uniaxial normal stress (see FIG. 3), and where $\sigma_0$ and $\sigma_1$ correspond to the stress in the upper and lower plateau of the stress-strain curve of TiNi. The assumption is then introduced that spring deformation is uniform along the wire direction (z-axis) and plane displacements u and v are in proportion to z, as follows:

$$u=-\omega yz, v=-\omega xz, w=-\omega\phi(x, y) \quad (6)$$

where ω is the twist angle per unit length of the wire and the function φ(x, y) is the Saint-Venant's function that satisfies the equilibrium equation and 2-D compatibility equation of strain. For the spring with rectangular cross section, the shearing strain components are expressed as:

$$\frac{\gamma_{zx}}{\omega b} = -2\frac{y}{b} - \frac{\pi}{2b^2}\sum_{n=1}^{\infty}(2n-1)A_n\cosh\frac{(2n-1)\pi x}{2b}\sin\frac{(2n-1)\pi y}{2b}, \quad (7)$$

$$\frac{\gamma_{zy}}{\omega b} = \frac{\pi}{2b^2}\sum_{n=1}^{\infty}(2n-1)A_n\sinh\frac{(2n-1)\pi x}{2b}\cos\frac{(2n-1)\pi y}{2b}, \quad (8a)$$

where:

$$A_n = (-1)^n \frac{32b^2}{(2n-1)^3\pi^3}\,\text{sech}\frac{(2n-1)\pi a}{2b} \quad (8b)$$

Next, the stress distribution is analyzed. The stresses of the super elastic loop (see FIG. 3) on the cross section is different from point to point and on the numerical super elastic loop at any point in the TiNi alloy layer are computed in terms of von Mises stress. The torque of wire is:

$$T = M_z = PR\cos\alpha = \iint_A (x\tau_{zy} - y\tau_{zx})\,dx\,dy \quad (9)$$

and it is obtained by numerical integration. The mechanical behavior of the spring is expressed by the relation between the external load P and the axial displacement δ. The displacement δ is given by:

$$\delta=\delta_{torsion}+\delta_{shear}\approx\delta_{torsion}=R\phi=2n\pi R^2\omega\sec\alpha \quad (10)$$

where $\delta_{torsion}$ and $\delta_{shear}$ are the displacement induced by torsion=PR/2 and direct shear force=P, respectively. $\delta_{shear}$ can be neglected as compared with $\delta_{torsion}$ when D/d>>1, where d is the diameter of the wire.

FIG. 3 also shows the stress-strain curve and super elastic relationship for a rectangular cross-sectional FSMA composite spring having an iron core and CuAlMn alloy as the super elastic SMA material that covers the iron core region.

Spring Actuator Including Multiple FSMA Springs and Drive Units

The present invention also encompasses an FSMA-based spring actuator that includes a plurality of individual FSMA springs, each spring having an individual hybrid magnetic trigger, or driving unit. To achieve an actuator with a particularly long stroke, additional springs and driving units are stacked until the required stroke is achieved.

FIGS. 13A and 13B show a multi-spring actuator 170 including a stack of three FSMA springs 174a–174c, each coupled to a respective drive unit 172a–172c. In FIG. 13A, each hybrid magnetic trigger (i.e., each drive unit 172a–172c) is not energized, and thus, each spring 174a–174c is not collapsed. In FIG. 13B, each hybrid magnetic trigger (i.e., each drive unit 172a–172c) has been triggered, and each spring collapses as described above in connection with the single FSMA spring-based actuator. Each spring in actuator 170 is a FSMA, such as homogenous FePd, or a FSMA composite including a ferromagnetic layer and a SMA layer, like the FSMA composite springs described above. While FIGS. 13A and 13B show only three drive units and three springs, it will clearly be understood that additional drive units and springs can be added (or deleted) as needed to achieve an actuator having a desired stroke.

FIG. 14 schematically illustrates a cross section of an exemplary drive unit 172, which includes an electromagnet 180 and ring shaped permanent magnets 176a and 176b. An energy source and conductors coupling the electromagnet to the energy source have been omitted to simplify the Figure, although those of ordinary skill will recognize that electromagnet 180 (as well as the electromagnets discussed above) must be energized with an electrical current provided by a power source, such as a battery, or a conventional power supply energized using an alternating current line connection. Yoke 178 is generally disc shaped and is formed of a magnetically permeable material, such as iron. Drive unit 172 includes a permanent magnet disposed both above and below electromagnet 180. This configuration facilitates the coupling of magnetic flux to springs disposed both above and below drive unit 172. If desired, permanent magnet 176b can be omitted, so that magnetic flux is directed into an FSMA spring disposed adjacent to permanent magnet 176a. The magnetic flux provided by such drive units in the energized state (i.e. on) and non-energized state (i.e. off) is schematically shown in FIGS. 15A–15C, based on a portion 182 of the cross-sectional view of FIG. 14.

In FIGS. 15A and 15B, portion 182 of a drive unit 172d is shown. Note that drive unit 172d differs from drive unit 172 of FIG. 14 only in that the lower permanent magnet (magnet 176b) is not included. Referring to FIG. 15A, flux lines 186a and 188a are provided by permanent magnet 176a and establish a closed loop within yoke 178. When electromagnet 180 is not energized, the magnetic flux provided by permanent magnet 176a is insufficient to couple the required actuating magnetic force to a ferromagnetic mass 184. In an assembled spring actuator, one end of an FSMA spring will be coupled to yoke 178 adjacent to permanent magnet 176a. It should be understood that ferromagnetic mass 184 is spaced apart from yoke 178 in FIGS. 15A–15C for illustrative purposes only, to emphasis the differences in magnetic flux when electromagnet 180 is on and off.

In FIG. 15B electromagnet 180 has been energized, and the magnetic flux lines have changed. Flux lines 186b and 188b now couple magnetic flux from the drive unit into the ferromagnetic mass. If ferromagnetic mass 184 were a spring, the first coil of the spring would be attracted to the upper surface of yoke 178, and the spring would collapse, as discussed above.

In FIG. 15C, portion 182 of drive unit 172 includes both upper permanent magnet 176a and lower permanent magnet 176b. When electromagnet 180 is energized, flux line 186c couples magnetic flux from the drive unit into the upper and lower ferromagnetic masses (mass 184 and 184a, respectively), while flux line 188c couples magnetic flux to the upper ferromagnetic mass (mass 184), and flux line 189 couples magnetic flux to the lower ferromagnetic masse (mass 184a). If either mass 184 or mass 184a were an a FSMA spring, the first coil of that spring would be attracted to the respective upper surface or lower surface of yoke 178, and the spring would collapse, as discussed above.

In a stack including n FSMA springs and n drive units, each drive unit can be energized simultaneously, or the drive units can be energized sequentially. It is expected that actuators including a plurality of drive units and a plurality of FSMA springs as described above will find application as compact actuators for airborne and ground vehicles. Such actuators are mechanically simple, yet robust, and can achieve a relatively large stroke with a relatively large force, in a compact package. Development studies indicate that drive units having a height of about 8 mm, a diameter of about 90 mm, and a mass of about 300 g–600 g are readily achievable. A finite element analysis indicates a an actuator including three drive units/springs (see FIGS. 13A and 13B) will be able to achieve a stroke of about 20–30 mm (about 1 inch), a lifting force of about 57 N (about 11 pounds), a current draw of about 5 Amps at 20–30 Volts, and will have a weight of about 2.6 kg (about 6 pounds). Longer strokes can be achieved by adding more drive unit/spring combinations. Weight reduction can be achieved by selecting a yoke material that is magnetically permeable, but lower density, compared to iron. For example, the three drive-unit actuator described above (having a yoke diameter of about 90 mm and a yoke height of about 8 mm) can be reduced in weight by about 407 g if each yoke is implemented using a mixture of 80% iron and 20% polymer, while reducing the force reduction by only 7% (about 53 N compared to about 57 N for an all iron yoke). If each yoke is implemented as a 50/50 mixture of iron and polymer, the actuator can be reduced in weight by about 1152 g, with a corresponding reduction in output force of only about 19% (about 45.7 N compared to about 57 N for an all iron yoke).

To achieve a yoke of a desired shape, iron powder can be cast, sintered, or cold pressed into the desired shape. Mixtures of powdered ferromagnetic metals and polymers can be combined and then sintered or cold pressed into the desired shape.

SMA-Based Torque Actuator

The present invention further encompasses a torque actuator based on an FSMA composite. A working model based on Fe bars and TiNi wires has been successfully demonstrated. FIGS. 16A and 16B respectively illustrate a torque actuator 200 in a de-energized (off) state and an energized (on) state. Actuator 200 includes a centrally disposed coil spring 202 formed of a plurality of individual iron bars and TiNi wire (see FIG. 16C, which is described in detail below, for an illustration of how the iron bars and TiNi alloy wire are assembled). A plurality of hybrid magnetic triggers 204 (generally consistent with those described above, including both a permanent magnet and an electromagnet) are disposed about the periphery of centrally disposed coil spring 202, which is coupled to an outer plate 208 at a point 207, and to an inner rod 209. A bar 206 is coupled to inner rod 209.

In FIG. 16A, each electromagnet is un-energized, coil spring 202 is not attracted to the plurality of hybrid magnetic triggers 204, and bar 206 is in a first position (about 4 o'clock). In FIG. 16B, the electromagnets in the plurality of hybrid magnetic triggers 204 have been energized, and coil spring 202 is attracted to hybrid magnetic triggers 204. Movement of coil spring 202 causes rod 209 to rotate, which in turn results in rod 208 being moved to a second position (about 2 o'clock).

FIG. 16C schematically illustrates how iron bars and TiNi wire can be combined to achieve coil spring 202. Iron bars 201 can be round or hexagonal in cross section. A plurality of openings 203 are formed in each iron bar, so that the openings pass completely through the bar, and such that the openings are aligned, as shown. TiNi alloy wire 205 having a diameter substantially equal to that of the openings formed into the iron bars are inserted into the openings of each bar. Each TiNi alloy wire is inserted into openings in additional iron bars until a coil spring of the desired length is achieved. Note that cooling the TiNi alloy wire will cause the TiNi alloy wire to shrink slightly in diameter, such that the wire can be easily inserted through the openings in the bars. When the wire warms, it will fit tightly within the openings. Heating the iron bars so that the openings expand slightly will also be useful when inserting the wire through the openings. While FIG. 16C indicates that many individual TiNi alloy wires can be used, an initial working embodiment included only two such TiNi alloy wires. Additional TiNi alloy wires should increase the performance of the working model.

The working model (i.e., actuator 200) proved that an FSMA composite coil spring could indeed be actuated, by hybrid magnetic triggers. Actuator 200 exhibited a modest torque capability (about 0.588 Nm) and a maximum angle of twist of about 45 degrees. The bar and wire configuration of coil spring 202 certainly does not represent an optimal configuration, and additional work, as detailed below, was performed to develop a more preferred FSMA composite coil spring.

Before discussing a preferred FSMA composite coil spring, it may be useful to review the operation of prior art torque actuators, to clarify why torque actuators based on an FSMA composite coil spring are capable of achieving greater torque than these prior art units. FIG. 17A shows one example of a prior art torque motor, wherein a rotor 222 is an electromagnet surrounded by a permanent magnet shell 224. Rotor 222 rotates because of the attraction and the repulsion between the electromagnet and the permanent magnets included in the permanent magnet shell. The relative motion between the electromagnet (rotor 222) and permanent magnets 224 can be considered to be a sliding motion along an X axis 227, as indicated by a vector 227a, where a north pole of a permanent magnet is attracted to a south pole of an electromagnet. The permanent magnet is shown in a first position 222a, and a second position 222b. This attractive force along an X axis is referred to as attractive force Fx. In FIG. 17B, the relative motion between the magnets is due to Fx, and there is little or no attractive force along a Y axis 225.

In contrast, as shown in FIG. 17C, an attractive force Fy (as indicated by vector 225a) exists between the permanent magnet and an electromagnet 224a, and the permanent magnet moves from a position 222c to a position 222d. Attractive force Fy is not employed in torque motor 220, because the permanent magnets are fixed in position, such that the electromagnet can slide (i.e., rotate) relative to the permanent magnets, but a distance 226 between the permanent magnets and the electromagnets never changes. Generally speaking, the attractive force Fy is much larger than the attractive force Fx, especially when a distance 226 between the magnets is small. The torque actuators in accord with the present invention use attractive force Fy, and thus, can achieve a greater output torque.

As shown in FIGS. 18A and 18B, a preferred torque actuator 210 in accord with the present invention includes an. FSMA composite coiled plate 212 and a plurality of hybrid magnetic triggers 204. It should be understood that for larger or smaller torque actuators, more or fewer hybrid magnetic triggers can be employed. FIG. 18A shows actuator 210 in the off or de-energized state, whereas FIG. 18B shows actuator 210 in the on or energized state. Coiled plate 212 has a first end 215 attached to an inner rod 218 and a second end 217 attached to a casing/yoke 219 disposed adjacent to hybrid magnetic triggers 204. When the electromagnets are energized, coiled plate 212 is attracted to casing/yoke 219 and moves in response to attractive force Fy, as discussed above. The motion of coiled plate 212 in turn causes inner rod 218 to rotate counter clockwise (note the apparent movement of the letter "R" included on inner rod 218). The rotating motion of the inner rod will provide torque for a dead load that is connected to the rod directly, or by a pulley or a belt (neither separately shown). It should be understood that such actuators can be configured to achieve rotation in either a clockwise or counter clockwise direction.

Coiled plate 212 is made from an FSMA composite, including a ferromagnetic material and a super-elastic grade SMA. Coiled spring 212 is subjected to a bending moment, which is not uniform over the length of the coiled spring, due to the varying curvature of the coiled plate. A functional FSMA composite-based torque actuator must be capable of inducing a sufficiently large stress in the SMA portion of the FSMA composite plate so that the SMA can reach at least the onset of stress-induced Martensite transformation, and the stress induced in the ferromagnetic portion of the FSMA composite plate remains below its yield stress, while the ferromagnetic portion is attracted to the inner wall of the outer casing due to a strong magnetic flux gradient when the electromagnets are switched on.

The following section describes a model employed to determine the forces acting on an idealized coiled plate spring 232 shown in FIGS. 19A and 19B. Coiled plate spring 232 has a first end 235 connected to an inner rod 238 at a point P0. Inner rod 238 has a radius R0. Coiled plate spring 232 has a second end 237 connected to an outer casing 239 at a point Pe. Outer casing 239 has an innermost radius R1. Coiled plate spring 232 thus loads inner rod 238 with a constant force, F0, as indicated in FIG. 19A.

When a magnetic flux 240 is applied to outer casing 239 (such as by energizing a hybrid magnetic trigger like one of those described in detail above), as shown in FIG. 19B, a portion 242 (i.e. arc Pe-P2) of coiled plate spring 232 having a length l is attracted to outer casing 239, resulting in a counter-clockwise rotation of inner rod 238 through an angle φ. At this point, coiled plate spring 232 is bent around inner rod 238 with a tangent point 244 moving from P1 to P'1.

The following relationships are used to examine the difference in strain energy between the initial configuration (FIG. 19A), and the second configuration (FIG. 19B). The strain energy can be considered to be equal to the work done by a constant force, $F_0$. Defining the energy state of the initial configuration (FIG. 19A) to be $E_a$, and the energy state of the second configuration (FIG. 19B) to be $E_b$, an energy balance equation under a constant weight $F_0$ becomes:

$$\Delta E = E_a - E_b = F_0 l_0 \phi \quad (11)$$

where $l_0$ is the lever of the torque that can transmit a constant load $F_0$.

When no magnetic flux 240 is applied (i.e., the electromagnets in the hybrid magnetic triggers are off), the radius r of each point in coiled plate spring 232 is:

$$r = \frac{(\theta - \theta_1)}{(2n\pi - \theta_1)}(r_1 - r_0) + r_0, \text{ for } \theta_1 \le \theta \le 2n\pi \quad (12)$$

Then the free length of the spring, which is not attached to both the inner rod and the outer casing, is:

$$L - r_0 \theta_1 = \int_{\theta_1}^{2n\pi} r \, d\theta \quad (13)$$

$$= \int_{\theta_1}^{2n\pi} \left[ \frac{(\theta - \theta_1)}{(2n\pi - \theta_1)}(r_1 - r_0) + r_0 \right] d\theta$$

$$= \frac{1}{2}(r_1 + r_0)(2n\pi - \theta_1)$$

From equation (12), $\theta_1$ is solved as:

$$\theta_1 = \frac{2[n\pi(r_0 + r_1) - L]}{(r_1 - r_0)} \quad (14)$$

The strain inside idealized elastic coiled plate spring 232 is $\epsilon = y/r$, hence the stress is $\sigma = Ey/r$; so the elastic energy of idealized elastic coiled plate spring 232 is given by:

$$E_a = \int_V \left(\frac{1}{2}\sigma\epsilon\right) dV \quad (15)$$

$$= \int_V \frac{Ey^2}{2r^2}(bd\,y)dl$$

$$= \int_{\overline{P_0P_1}} \frac{Ey^2}{2r^2}(bd\,y)(r_0\theta_1) + \int_{\overline{P_1P_e}} \frac{Ey^2}{2r^2}(bd\,y)(rd\theta)$$

since $$\int_{\overline{P_0P_1}} \frac{Ey^2}{2r^2}(bd\,y)(r_0\theta_1) = \frac{r_0\theta_1 bE}{2r_0^2}\int_{-\frac{h}{2}}^{\frac{h}{2}} y^2\,dy$$

and $$\int_{\overline{P_1P_e}} \frac{Ey^2}{2r^2}(d\,y)(rd\theta) = \frac{Eb}{2}\left[\int_{-\frac{h}{2}}^{\frac{h}{2}}\int_{\theta_1}^{2n\pi} \frac{y^2}{r^2} b\,dy(rd\theta)\right]$$

$E_a$ is reduced to $E_a = \frac{bh^3 E\theta_1}{24r_0} + \frac{bh^3 E}{24}\int_{\theta_1}^{2n\pi} \frac{1}{r}d\theta$ In the above equations, b is the width of the plate spring.

With:

$$r = \frac{(\theta - \theta_1)}{(2n\pi - \theta_1)}(r_1 - r_0) + r_0,$$

$$r = \frac{(\theta - \theta_1)}{(2n\pi - \theta_1)}(r_1 - r_0) + r_0$$

and evaluating the integral, $E_a$ is obtained as:

$$E_a = \frac{bh^3 E}{24r_0}\left[\frac{2[n\pi(r_0 + r_1) - L]}{(r_1 - r_0)} + \frac{r_0}{(r_1 - r_0)}\left(\ln\left(\frac{r_1}{r_0}\right)\right)\left[\frac{2L - 4n\pi r_0}{(r_1 - r_0)}\right]\right] \quad (16)$$

When magnetic flux 240 is applied as in FIG. 19B, the radius r of each point on the spring is given by:

$$r = \frac{(\theta - \theta_1')}{(\theta_2 - \theta_1')}(r_1 - r_0) + r_0, \text{ for } \theta_1' \leq \theta \leq \theta_2 \quad (17)$$

From the geometry of FIG. 19B:

$$\theta_2 = 2n\pi - \theta_2^*, \text{ where } r_1\theta_2^* = l, \text{ therefore } \theta_2 = 2n\pi - \frac{l}{r_1} \quad (18)$$

Then the free length of the spring, which is not attached to both the inner rod and the outer casing, is:

$$L - l - r_0\theta_1' = \int_{\theta_1'}^{\theta_2} r\,d\theta \quad (19)$$

Using Eq. (7), Eq. (using Equation (17), Equation (19) is reduced to:

$$L - l - r_0\theta_1' = \int_{\theta_1'}^{\theta_2}\left[\frac{(\theta - \theta_1')}{(\theta_2 - \theta_1')}(r_1 - r_0) + r_0\right]d\theta \quad (20)$$

$$= \frac{1}{2}(r_1 + r_0)(\theta_2 - \theta_1')$$

From Equation (20), $\theta_1'$ is solved as:

$$\theta_1' = \frac{2[n\pi(r_0 + r_1) - L]}{(r_1 - r_0)} + \frac{l}{r_1} \quad (21)$$

Evaluating the strain energy $E_b$ of FIG. 19B leads to:

$$E_b = \int_V \left(\frac{1}{2}\sigma\epsilon\right)dV = \int_V \frac{Ey^2}{2r^2}(bd\,y)dl \quad (22a)$$

$$= \int_{\overline{P_0P_1'}} \frac{Ey^2}{2r^2}(bd\,y)(rd\theta) + \int_{\overline{P_1'P_2}} \frac{Ey^2}{2r^2}(bd\,y)(rd\theta) + \quad (22b)$$

$$\int_{\overline{P_2P_e}} \frac{Ey^2}{2r^2}(bd\,y)(rd\theta)$$

Since r is constant in the first and third terms of Equation (12), the result is:

$$\int_{\overline{P_0P_1'}} \frac{Ey^2}{2r^2}(bd\,y)(rd\theta) = \frac{bh^3 E}{24r_0}\theta_1', \quad (23a)$$

$$\int_{\overline{P_2P_e}} \frac{Ey^2}{2r^2}(bd\,y)(rd\theta) = \frac{bh^3 E}{24r_1}\theta_1^*$$

Elemental integration is performed for arc P1'P2 by using Equation (17) to obtain the second term, as follows:

$$\int_{\overline{P_1'P_2}} \frac{Ey^2}{2r^2}(bd\,y)(rd\theta) = \frac{bh^3 E(\theta_2 - \theta_1')}{24(r_1 - r_0)}\ln\left(\frac{r_1}{r_0}\right) \quad (23b)$$

Therefore $E_b$ is obtained as follows:

$$E_b = \frac{bh^3 E}{24r_0}\left[\left[\frac{2[n\pi(r_0 + r_1) - L]}{(r_1 - r_0)}\right] + \frac{l}{r_1} + \frac{r_0}{(r_1 - r_0)}\left(\ln\frac{r_1}{r_0}\right)\left[\frac{(2L - 4n\pi r_0)}{(r_1 - r_0)} - \frac{2l}{r_1}\right]\right] \quad (24)$$

Using Eqs. (1), (6), Equations (11), (16) and (24) to simplify, results in:

$$E_b - E_a = F_0 r_0 \phi = \frac{bh^3 E}{24 r_0}\left[\frac{l}{r_1} - \frac{r_0}{(r_1 - r_0)}\frac{2l}{r_1}\left(\ln\left(\frac{r_1}{r_0}\right)\right)\right] \quad (25)$$

From Equation (25) the angle of twist $\phi$ for a given constant load $F_0$ is determined by:

$$\phi = \frac{bh^3 E}{24 r_0 l_0 F_0}\frac{l}{r_1}\left[1 - \frac{2r_0}{(r_1-r_0)}\left(\ln\left(\frac{r_1}{r_0}\right)\right)\right] \quad (26)$$

Using the model noted immediately above, results were calculated for different coiled plate springs having various different thicknesses (h), widths (b), turns (n), and initial load ($F_0$). FIG. 20 graphically illustrates predicted results of a coiled plate spring having a width (b), for several cases of plate thickness (h). The results indicate that increasing the thickness of the coiled plate spring results in increasing twist $\phi$. The width of the plate also contributes positively to the load carrying capability of the actuator. This result is reasonable because the larger the plate spring, the more energy that can be stored in the coiled plate spring as strain energy. Upon actuation of the electromagnets, more energy is thus released from the plate spring.

The working model (FIGS. 16A and 16B) was based on a coiled spring made up of Fe bars and two TiNi alloy wires, while the theoretical model (FIGS. 19A and 19B) discussed above is based on a coiled plate spring. To evaluate the performance of the working model, an approximate equivalent coiled plate spring must be substituted for the spring made of Fe bars and TiNi alloy wire. It was determined that the spring made up of Fe bars and TiNi alloy wire could be replaced with an a FSMA composite coiled plate spring made using Fe and TiNi, where the coiled plate has a width (b) of 3.0 mm and a height (h) of 1.5 mm, so that the coiled plate spring would provide approximately the same performance. Using measurements obtained from the working model, the following data were collected for input into the theoretical model:

$r_0$=10 mm, $r_1$=25 mm, $l_0$=80 mm, $F_0$=7.35 35 N, $l$=59 mm, $\phi$=58 degrees, (27)

and Torque=$F_0 l_0$=0.588 588 N-m.

The range of radius of curvature (r) is calculated from $\rho=r_0$ to $r_1$; thus, the range of maximum bending strain ($\epsilon = y_{max}/r$), with $y_{max}$=0.75 mm, $\epsilon$=0.03~0.07. This range in the strain in TiNi alloy wires corresponds to the super elastic plateau of the stress-strain curve of TiNi. This result supports the conclusion that the TiNi alloy wires undergo stress-induced Martensite transformation (i.e., a super elastic plateau is achieved, as desired). The range of the maximum bending stress can be estimated by the range of $\epsilon$ multiplied by Young's modulus ($E_A$~$E_m$) where $E_A$ and $E_m$ are the Young's modulus of the 100% Austenite phase and the 100% Martensite phase, respectively, and are given by:

$E_A$=80 GPa, $E_m$=50 GPa (28)

Using the values of Equations (16) and (17) in the theoretical model described above, the torque angle $\phi$ can be calculated to be:

$\phi$=90~144 degrees (29)

The value of $\phi$ obtained using the theoretical model overestimates the measured value of 58 degrees; however, numerous assumptions were made in the theoretical model, and the actual results varied from the theoretical results by less than a factor of two.

The deformation mode of the coiled plate spring in FIGS. 18A, 18B, 19A, and 19B is bending. FIG. 21 schematically a preferred FSMA composite plate 250, including a SMA layer 252 and a ferromagnetic layer 254. The following bending model has been employed to evaluate the forces acting on such an FSMA composite plate used in the preferred torque actuator of FIGS. 18A and 18B. This model assumes that the FSMA composite plate is subjected to a pure bending moment, M, to facilitate the modeling, although the actual plate spring is loaded with a varying bending moment due to the varying curvature of the plate spring. FIG. 22 graphically illustrates a pure bending model of FSMA composite plate 250 of thickness h under a force M, resulting in a curvature $\rho$. The stress-strain curves of super-elastic SMA layer 252 (where the SMA is CuAlMn alloy) and ferromagnetic layer 254 are graphically illustrated in FIG. 3.

One requirement for an a FSMA composite plate to be used as a coil spring in a torque actuator is that the ferromagnetic plate (having a thickness $h_f$) bend toward the inner wall of the casing (adjacent to the hybrid magnetic triggers, i.e., casing/yoke 219 of FIGS. 18A and 18B), so that the ferromagnetic plate is attracted to the hybrid magnetic triggers when the electromagnets are turned on to activate the torque actuator. For proper function, the bending stress in the ferromagnetic layer should remain elastic, just below the yield stress, while in the SMA layer, the bending stress reaches the plateau of the stress-induced Martensite phase transformation (i.e., the super-elastic region). It is assumed in the present model, as is graphically illustrated in FIG. 23, that the super-elastic region 260 is a flat rectangular box, ignoring a work-hardening rate.

The stress distribution in a FSMA composite plate (such as plate 250 of FIG. 21) can be classified into the following three cases:

Case-1: The bending stress in the ferromagnetic layer just reaches the yield stress, while the bending stress of the SMA layer is below the onset ($\sigma_{SIM}$) of stress-induced Martensite (SIM).

Case-2: The bending stress in the ferromagnetic layer just reaches the yield stress, while the bending stress of the SMA layer is within the super-elastic plateau, ($\sigma_{SIM}$).

Case-3: The bending stress in the ferromagnetic layer just reaches the yield stress, while the bending stress of the SMA layer stress is above the onset of the SIN stress level, ($\sigma_{SIM}$).

To implement SMA layer 252 of FSMA in composite plate 250 (FIG. 21), CuAlMn alloy was selected, because the super-elastic stress strain curve can be tailored to some extent by appropriate heat treatment, with the value of $\sigma_{SIM}$ being in the range of 180–250 MPa. To implement ferromagnetic layer 254, both soft Fe and FeCoV alloy plates were considered. The yield stress of the former is around 200 MPa and that of the latter is about 400 MPa.

Preliminary results of the present modeling of the FSMA composite plate are graphically illustrated in FIGS. 23 and 24. FIG. 23 illustrates the stress-strain curves of FeCoV alloy used as the ferromagnetic material and CuAlMn used as the SMA, with the super-elastic behavior idealized as flat rectangular shape 260 for the loop portion and with a non-work hardening rate.

FIG. 24 clearly illustrates the super elastic bending behavior that can be realized by using a composite FSMA plate having a layer of FeCoV alloy and a layer of CuAlMn alloy, where the ratio of the thickness of the ferromagnetic layer ($h_f$) to the thickness of the composite plate (h) is 0.5 to 0.7.

Such a composite FSMA plate can be achieved by bonding a layer of CuAlMn alloy to a layer of FeCoV alloy. Various bonding techniques such as diffusion bonding, cold pressing, adhesive bonding, and sintering can be employed to achieve an optimal technique.

While theoretical models used to develop the present invention have been discussed above, a more detailed description of models employed to analyze bending of a FSMA composite plate, and to determine an optimal cross-sectional shape for a FSMA composite coil spring are provided below.

Detailed Analysis of the Bending of a Composite Plate

For bending type actuation, a laminated FSMA composite plate 250 including a ferromagnetic layer 254 and a super elastic SMA layer 252 is shown in FIG. 25A. when used in an actuator, plate 250 is subject to bending moment M induced by the magnetic force generated by the ferromagnetic material. Bending moment M is also shown in FIG. 22, as described above. After the bending stresses on SMA layer 252 reaches the level required for stress phase transformation (the onset of the super elastic plateau in the upper loop of the stress-strain curve shown in FIG. 23), the phase transformation proceeds from the plate surface as shown in transformation region 300 of FIG. 25B. The stress in the transformed region remains constant due to the super elastic behavior of SMA. It is assumed throughout this model (to simplify the analysis) that super elastic loop 260 (see FIG. 23) of the SMA is "flat", i.e., no work-hardening type slope is allowed, and that the Young's modulus of the Austenite is the same as that of the Martensite. These assumptions enable closed form solutions to be achieved using the present bending model. It should be noted that results obtained from this model are expected to be first approximations rather than precise results. However, such approximations can be used to calculate a preferred thickness ratio of a ferromagnetic layer and a SMA layer in a FSMA composite plate. Note discontinuity 302 at the interface between SMA layer 252 and ferromagnetic layer 254.

The relation between the bending moment and the curvature of the plate is then theoretically calculated by using the stress-strain curves of the constituent materials. FIG. 22 shows bending moment and the relative thicknesses of each layer of the FSMA composite plate. The radius of curvature of the composite plate subject to bending moment M is ρ, the thickness of the composite plate is h, the thickness of the ferromagnetic layer is $h_f$, and the plate width is b. FIG. 23 shows the idealized stress-strain curves of the ferromagnetic material and the super elastic SMA, where the Young's modulus of the ferromagnetic material is $E_f$, that of the SMA is $E_{SMA}$, the yield stress of the ferromagnetic material is $\sigma_f$, and only the elastic portion of the ferromagnetic material is shown. The onset stress for phase transformation of super elastic SMA is $\sigma_0$; and the onset stress for reverse transformation is $\sigma_1$ in the super elastic loop portion of the SMA. As a result, the relationship between the bending moment and the curvature of the composite plate is expected to exhibit the super elastic loop if the composite plate is properly designed (i.e., if the relative thicknesses of the ferromagnetic layer and the SMA layer are properly selected). This super elastic loop response of an FSMA composite plate is very desirable.

The curvature that reaches yield stress $\sigma_f$ in a ferromagnetic layer and the curvature that reaches transformation stress $\sigma_0$ in the super elastic SMA layer are strongly influenced by the mechanical properties and the thickness of both materials.

As briefly discussed above, stress transformation distribution is classified into the following three cases because of the relationship between the transformation stress in the SMA layer and the yield stress of a ferromagnetic layer:

Case 1: The stress in the ferromagnetic layer reaches the yield stress, $\sigma_f$, before reaching the transformation stress, $\sigma_0$, in the super elastic SMA layer. The stress distribution of this case upon loading and unloading is shown in FIG. 26A, where bending stress by elastic deformation is generated in each material.

Case 2: The stress in the ferromagnetic layer reaches the yield stress after the SMA layer reaches the transformation stress in the plate. The stress distribution of Case 2 upon loading and unloading is shown in FIG. 26B. Under an increasing bending moment, a first elastic stress distribution is indicated in portion (a) of the Figure, the stress in the SMA layer then reaches the transformation stress, $\sigma_0$, to the position of y1 in portion (b). When the transformation domain advances to where y1=Y1, the ferromagnetic layer reaches the yield stress, $\sigma_f$, as indicated in portion (c). During unloading, the stress decreases first inelastically in all domains, as indicated in portion (d). The stress then becomes constant in the upper part of the SMA layer to a position y3, where the stress reaches the reverse transformation stress, $\sigma_1$, as indicated in portion (e). Once the stress at location y3=Y1 reaches $\sigma_1$, the stress inside portion y<y2 decreases elastically, as indicated in portion (f). Finally, the stress in the entire SMA layer decreases elastically when the stress in the SMA at the top surface becomes smaller than $\sigma_1$, as indicated in portion (g).

Case 3: The stress in the ferromagnetic layer reaches the yield stress, after the entire domain of the super elastic SMA layer reaches the transformation stress, $\sigma_0$. The stress distribution of Case 3 upon loading and unloading is shown in FIG. 26C. In the early stage of loading, the stress in the ferromagnetic layer does not reach the yield stress, even after the stress in all domains of the SMA layer reach the transformation stress, $\sigma_0$, as indicated in portion (c). A neutral axis position changes with an increase in the load, and the stress reaches the yield stress, $\sigma_f$, in the ferromagnetic layer, as indicated in a portion (d). The unloading stresses are illustrated in portions (e)–(h).

For each stress distribution, $\sigma_x(y)$, in the three cases discussed above, the following equations are valid (i.e., for defining the equilibrium of force and moment):

$$\int_0^h \sigma_x(y)y\,dy = 0 \tag{30}$$

$$M = -\int_0^h \sigma_x(y)yb\,dy = 0 \tag{31}$$

The neutral axis position and the relationship between the bending moment and the curvature are obtained by solving these equations. Referring in particular to the second case described above (FIG. 26B), and in particular to portion (b) of FIG. 26B, when a neutral axis position is $\zeta_2$ and the transformation stress position is y1, the stress distribution in each domain becomes:

In the ferromagnetic layer (0<y<$h_f$):

$$\sigma(y) = E_f \frac{\zeta_2 - y}{\rho} \tag{32}$$

In the SMA layer below the transformation stress $\sigma_0$ ($h_f<y<y1$):

$$\sigma(y) = E_{SMA}\frac{\xi_2 - y}{\rho} \quad (33)$$

In the transformation domain of the SMA layer ($y1<y<h$):

$$\sigma(y) = -\sigma_0 \quad (34)$$

By substituting Eqs. (32), (33), and (34) into Eqs. (30) and (31), unknown $\xi_2$ and $y1$ are solved by Eqs. (35) and (36), which are:

$$\frac{\xi_2}{h} = \left\{\left(\frac{E_f}{E_{SMA}} - 1\right)\frac{h_f}{h} + \frac{\sigma_0}{E_{SMA}}\frac{\rho}{h}\right\} + \quad (35)$$

$$\sqrt{\frac{E_f}{E_{SMA}}\left(\frac{E_f}{E_{SMA}} - 1\right)\left(\frac{h_f}{h}\right)^2 + 2\frac{\sigma_0}{E_{SMA}}\frac{\rho}{h}\left\{1 + \left(\frac{E_f}{E_{SMA}} - 1\right)\frac{h_f}{h}\right\}}$$

$$\frac{y_1}{h} = \frac{\xi_2}{h} + \frac{\sigma_0}{E_{SMA}}\frac{\rho}{h} \quad (36)$$

Moreover, by substituting Eqs. (32)–(36) into Eq. (31), the relationship between the normalized bending moment and curvature is obtained as:

$$\frac{M}{E_{SMA}bh^2} = \frac{h}{\rho}\left[\frac{E_f}{E_{SMA}}\left\{\frac{1}{3}\left(\frac{h_f}{h}\right)^3 - \frac{1}{2}\frac{\xi_2}{h}\left(\frac{h_f}{h}\right)^2\right\} + \frac{1}{3}\left\{\left(\frac{y_1}{h}\right)^3 - \left(\frac{h_f}{h}\right)^3\right\} - \frac{1}{2}\frac{\xi_2}{h}\left\{\left(\frac{y_1}{h}\right)^2 - \left(\frac{h_f}{h}\right)^2\right\} + \frac{1}{2}\frac{\sigma_0}{E_{SMA}}\left\{1 - \left(\frac{y_1}{h}\right)^2\right\}\right] \quad (37)$$

Eq. (37) is valid for the range of curvature, i.e., from the curvature with transformation stress $\sigma_0$ at a top portion (y=h) of the SMA layer, to the curvature with yield stress at the bottom $\sigma_f$ (y=0) of the ferromagnetic layer. The range of the curvature is given by:

$$\frac{\sigma_0}{E_{SMA}}\frac{2\left\{1 + \left(\frac{E_f}{E_{SMA}} - 1\right)\left(\frac{h_f}{h}\right)\right\}}{1 + \left(\frac{E_f}{E_{SMA}} - 1\right)\left(2 - \frac{h_f}{h}\right)\left(\frac{h_f}{h}\right)} < \frac{h}{\rho} \leq \frac{h}{\rho_1} \text{ where} \quad (38)$$

$$\frac{h}{\rho_1} = \frac{\left(\frac{\sigma_f}{E_f} + \frac{\sigma_0}{E_{SMA}}\right)^2}{-\left\{\frac{\sigma_f}{E_f}\left(\frac{E_f}{E_{SMA}} - 1\right)\left(\frac{h_f}{h}\right) - \frac{\sigma_0}{E_{SMA}}\right\} + \sqrt{\left\{\frac{\sigma_f}{E_f}\left(\frac{E_f}{E_{SMA}} - 1\right)\left(\frac{h_f}{h}\right) - \frac{\sigma_0}{E_{SMA}}\right\}^2 + \left(\frac{\sigma_f}{E_f} + \frac{\sigma_0}{E_{SMA}}\right)^2\left(\frac{E_f}{E_{SMA}} - 1\right)\left(\frac{h_f}{h}\right)^2}} \quad (39)$$

Similarly, the relationship between the bending moment and the curvature for the three cases of FIGS. 26A–26C can be calculated. The results for Cases 1, 2, and 3 are shown below in the section entitled, Detailed Analysis of the Relationship Between Bending moment and Curvature.

The conditions under which three cases are valid are obtained as

Case 1:

$$\frac{\sigma_f}{\sigma_0} < \frac{E_f}{E_{SMA}}\frac{1 + \left(\frac{E_f}{E_{SMA}} - 1\right)\left(\frac{h_f}{h}\right)^2}{1 + \left(\frac{E_f}{E_{SMA}} - 1\right)\left(2 - \frac{h_f}{h}\right)\left(\frac{h_f}{h}\right)} \quad (40)$$

Case 2:

$$2\frac{h}{h_f}\left\{\frac{\sigma_0}{E_{SMA}} + \frac{\sigma_0}{E_f}\left(\frac{h_f}{h} - 1\right)\right\} > \frac{h}{\rho_1} \quad (41)$$

Case 3:

$$2\frac{h}{h_f}\left\{\frac{\sigma_0}{E_{SMA}} + \frac{\sigma_0}{E_f}\left(\frac{h_f}{h} - 1\right)\right\} \leq \frac{h}{\rho_1} \quad (42)$$

The maximum normalized curvatures in these cases are given by:

Case 1:

$$\frac{h}{\rho} = \frac{\sigma_f}{E_f}\frac{2\left\{1 + \left(\frac{E_f}{E_{SMA}} - 1\right)\left(\frac{h_f}{h}\right)\right\}}{1 + \left(\frac{E_f}{E_{SMA}} - 1\right)\left(\frac{h_f}{h}\right)^2} \quad (43a)$$

Case 2:

$$\frac{h}{\rho} = \frac{h}{\rho_1} \quad (43b)$$

Case 3:

$$\frac{h}{\rho} = 2\frac{h}{h_f}\left\{\frac{\sigma_f}{E_f} - \frac{\sigma_0}{E_f}\left(\frac{h}{h_f} - 1\right)\right\} \quad (43a)$$

The maximum deformability of the composite plate can be analyzed for a given set of the mechanical properties and the thickness ratio of materials by using Eqs. (43a–43c).

Analytical Result and Discussion

The relationship between the bending moment and the curvature is predicted by the present model for two different FSMA composite plates having a SMA layer and a ferromagnetic layer. The first composite plate is Fe/CuAlMn alloy, and the second composite plate is FeCoV/CuAlMn. FIG. 27 shows the idealized stress-strain curves of Fe and CuAlMn alloy. The results of the predicted relationship between the normalized bending moment and the normalized curvature for a plate thickness ratio of h/h=0.5 are shown in FIG. 28. The state of the stress field corresponds to Case 1 (FIG. 26A), since the stress in the SMA layer has not reached the super elastic plateau. Thus, the super elastic loop is not observed, as is clearly evident from FIG. 28. Therefore, it can be concluded that an a FSMA composite plate formed of a layer of Fe and a layer of CuAlMn alloy is not preferred for use as an effective bending actuator component.

Next, the FeCoV/CuAlMn composite plate was analyzed by using the mechanical property data shown in the stress strain relationship of FIG. 29. FIG. 30 graphically illustrates the results obtained using the model described above to evaluate the FeCoV/CuAlMn composite plate, for a plate thickness ratio of h/h=0.5. By using FeCoV alloy, whose yield stress is larger than Fe (and whose soft magnetic property is larger than Fe), the results shown in FIG. 30 indicate Case 3 (FIG. 26C) has been substantially achieved, in that most of the CuAlMn layer becomes a transformation domain. Moreover, the maximum curvature was 2.22 times larger, and the bending moment was 1.60 times larger than the corresponding values obtained for the Fe/CuAlMn composite plate. Therefore, the FeCoV/CuAlMn composite plate has been identified as a preferred FSMA composite material for use as a bending actuator component.

Next, a set of parametric studies was performed to examine the effects of material parameters ($\sigma_f$, $E_f$, $\sigma_0$, $\sigma_1$, $E_{SMA}$) and geometrical parameters (i.e. the thickness ratio h/h). The results are shown in FIG. 31, where portions (a)–(f) each correspond to a change in parameters (note the yield stress of ferromagnetic material ($\sigma_f$), the upper plateau stress ($\sigma_0$), the lower plateau stress ($\sigma_1$) of the CuAlMn super elastic loop, the thickness ratio (h/h) of the ferromagnetic plate ($h_f$) to the SMA plate (h), the Young's modulus of the ferromagnetic material ($E_f$) and that of SMA ($E_{SMA}$), respectively).

When the yield stress of the ferromagnetic material increases, it is clear from portion (a) of FIG. 31 that both the bending moment and the curvature increase. When transformation stress $\sigma_0$ of the SMA plate increases, it follows from portion (b) of FIG. 31 that the bending moment increases and the curvature decreases. It can be seen from portion (c) of FIG. 31 that the lower limit of the super elastic loop decreases if the reverse transformation stress, $\sigma_1$, decreases. When the thickness of the ferromagnetic layer increases, it is clear from portion (d) of FIG. 31 that the bending moment increases, although the curvature decreases. Conversely, because the thickness of the super elastic SMA layer increases when the thickness of the ferromagnetic layer decreases, the super elasticity behavior increases. Therefore, the bending moment decreases, and the curvature increases. From portion (e) of FIG. 31, it can be seen that the maximum curvature decreases though the bending moment does not change when the Young's modulus of the ferromagnetic material increases. Therefore, an increase in the Young's modulus of the ferromagnetic material is undesirable for a FSMA composite plate used for bending. From portion (f) of FIG. 31, it can be seen that the bending moment decreases when the Young's modulus of the SMA increases. Clearly, the design of higher performance FSMA composites and ferromagnetic shape memory alloys composite becomes possible using the above model as a tool to evaluate potential components.

Analytical Model for a FSMA Spring-Based Actuator

With the aim of designing a high-speed linear actuator, the super elastic characteristic of a coiled spring formed from an FSMA composite wire with rectangular cross section is analyzed. FIG. 32 shows forces and parameters employed in defining such a model. Note that D=the diameter of spring; d=the diameter of wire; p=the pitch of one coil; n=the number of turns (or coils); L=the length of spring without a load (L=np); and a=the inclined angle of the wire relative to an x-y plane.

The magnetic force is generated in the ferromagnetic material by the magnetic field gradient (which as described above, is generated when a hybrid magnetic trigger is energized), and the displacement is generated in the spring by the hybrid transformation mechanism discussed above. The relationship between this spring force and displacement is analyzed in the following model. When force P is applied to the spring, the wire of the FSMA composite is subjected to torque T. The relationship between spring force P and torque T is given by:

$$T = PR \cos \alpha \quad (44)$$

Moreover, when the twist angle per unit length of the rectangular cross section wire is $\omega$, the total twist angle $\phi$ is $2n\pi R\omega\sec\alpha$, because the total length of the wire is $2n\pi R\sec\alpha$. Therefore, the displacement of the spring is calculated by:

$$\delta = \delta_{torsion} + \delta_{shear} \approx \delta_{torsion} = R\phi = 2n\pi R^2 \omega \sec\alpha \quad (45)$$

It is assumed in the present model that the displacement due to direct shear, $\delta_{shear}$, can be neglected. This assumption is justified for a large ratio of D to a or b. Then, the relationship between the spring force and displacement can be calculated by clarifying the relationship between the twist angle per unit length, $\omega$, and the torque, T, of the rectangular section wire.

Optimization of the Shape of a FSMA Composite Wire with a Rectangular Section

To generate a large magnetic force by the hybrid mechanism, it is necessary to increase the area of a ferromagnetic material in the rectangular section, while meeting the requirement that the ferromagnetic material should not reach its yield stress. The stress field in the rectangular section can be calculated from the shear-strain distribution of the rectangular section for a given twist angle. Consider a rectangular section of an FSMA composite wire with a width 2a and a height 2b, as shown in FIG. 32. It is assumed that the spring deformation is uniform along the wire direction (z-axis) and plane displacements u and v are in proportion to z, as follows:

$$u = -\omega y z, \quad v = \omega x z, \quad w = -\omega \phi(x, y) \quad (46)$$

where the function $\Phi(x,y)$ is the Saint-Venant's function that satisfies the equilibrium equation and the 2-D compatibility equation of strain. For the spring with the rectangular cross section, the shear-strain components are expressed as:

$$\frac{\gamma_{zx}}{\omega a} = -\frac{16}{\pi^2} \sum_{n=1}^{\infty} \frac{(-1)^{n-1}}{(2n-1)^2} \frac{\sinh\left[(2n-1)\frac{\pi y}{2a}\right]}{\cosh\left[(2n-1)\frac{\pi b}{2a}\right]} \cos\left[(2n-1)\frac{\pi x}{2a}\right] \quad (47)$$

$$\frac{\gamma_{zy}}{\omega a} = -\frac{16}{\pi^2} \sum_{n=1}^{\infty} \frac{(-1)^{n-1}}{(2n-1)^2} \left\{1 - \frac{\cosh\left[(2n-1)\frac{\pi y}{2a}\right]}{\cosh\left[(2n-1)\frac{\pi b}{2a}\right]}\right\} \sin\left[(2n-1)\frac{\pi x}{2a}\right] \quad (48)$$

Therefore, the effective shear-strain acting on the rectangular cross section, $\gamma$, is calculated by:

$$\gamma = \sqrt{(\gamma_{zx}^2 + \gamma_{zy}^2)} \quad (49)$$

For a=2 and b=1, contour line distributions of shear-strain components, $\gamma_{zx}$, $\gamma_{zy}$, and effective shear-strain, $\gamma$, divided by $\omega a$ are shown in FIGS. 33A, 33B, and 33C, respectively. Note that $\gamma_{zx}$ becomes 0 at x=−a and a; it reaches a minimum value at y=b on the y axis; and, it reaches a maximum value at y=−b on the y axis. Also note that $\gamma_{zy}$ reaches a minimum value at x=−2, y=0; and it reaches a maximum value at x=2, y=0. The normalized effective shear-strain, $\gamma$, divided by $\omega a$ ($\gamma/\omega a$) reaches a maximum value 0.930 at the center of the longer edges and is reduced toward the center of the cross section.

The effective shear-stress induced in the ferromagnetic material is calculated by multiplying $\gamma$ by the shear modulus $G_f$ of the ferromagnetic material. Therefore, the effective shear-stress distribution of the ferromagnetic material in the rectangular section is calculated for a given set of twist angle per unit length $\omega$, size a and b. Then, the optimum shape of the ferromagnetic material can be determined from its domain whose effective shear-stress does not exceed the yield stress in shear $\tau_f$ of the ferromagnetic material.

If FeCoV ($G_F$=70 GPa, $\tau_f$=231 MPa) is used as a ferromagnetic material, and CuAlMn alloy is used as a super elastic SMA, then for ω=0.003, a=2, and b=1, γ/ωa<0.55 is obtained from the requirement that $G_{F_i}<\tau_f$. FIG. 34 shows the rectangular cross-sectional shape of a FSMA composite wire determined using this model, where the inner core satisfies the requirement, γ/ωa<0.55.

Next, the relationship between the twist angle per unit length ω and the torque T of the composite wire with the rectangular section is examined. The torque is calculated by:

$$T = M_z = PR\cos\alpha = \int_{-b}^{b}\int_{-a}^{a}(x\tau_{zy} - y\tau_{zx})dxdy \quad (50a)$$

$$= \int_{-b}^{b}\int_{-a}^{a}G(x\gamma_{zy} - y\gamma_{zx})dxdy \quad (50b)$$

Here, it is possible to divide the loading of the FSMA composite into three domains.

Domain 1: Domain of the ferromagnetic material.
Domain 2: Domain with effective shear-stress less than the onset stress of the transformation of the SMA, $\tau_0$.
Domain 3: The transformation domain of the SMA.

The effective stress in the ferromagnetic material is obtained by multiplying shear modulus $G_f$ by the corresponding effective shear-strain for the elastic deformation. In the SMA, it is necessary to judge if the effective shear-stress, τ, is below the transformation stress, $\tau_0$. The effective shear-stress τ is obtained by multiplying the shear modulus $G_{SMA}$ by γ if the effective shear-stress of Domain 2 is below the transformation stress, $\tau_0$. In Domain 3, where the effective shear-stress, τ, reaches a transformation stress $\tau_0$, τ becomes a transformation stress, $\tau_0$.

Because each shear-strain component proportionally increases with an increase in ω, by multiplying each shear-strain component by the modified shear modulus $G=\tau_0/\gamma$, each shear-stress component in which τ becomes $\tau_0$ is calculated. That is, Eq. (50) is applicable to Domain 3 by using Eq. (53). Then, torque T corresponding to the twist angle per unit length, ω, is calculated by Eq. (51) by using the modified shear modulus in each domain according to the following Eqs.:

Domain 1: (51)

$$\gamma = \frac{\tau_f \omega}{G_f \omega_f} \quad G = G_f$$

Domain 2: (52)

$$\gamma \geq \frac{\tau_f \omega}{G_f \omega_f} \quad \text{and} \quad \gamma < \frac{\tau_0}{G_{SMA}}$$

Domain 3: (53)

$$\gamma \geq \frac{\tau_f \omega}{G_f \omega_f} \quad \text{and} \quad \gamma \geq \frac{\tau_0}{G_{SMA}} \quad G = \frac{\tau_0}{\gamma}$$

where, $\omega_f$ is input data, and it is the maximum design twist angle per unit length given when the cross section shape is optimized ($\omega_f$=0.0015 for the cross-sectional shape of FIG. 34).

Next, the case of unloading is considered. The stress in each domain decreases during unloading, but where the super elasticity was generated in Domain 3, and effective shear-stress reached the transformation stress during the preceding loading, it is necessary to divide Domain 3 into three sub-domains:

Domain 3-1: Domain with τ above the reverse transformation stress $\tau_1$.
Domain 3-2: Domain with τ equal to the reverse transformation stress $\tau_1$.
Domain 3-3: Domain with τ below the reverse transformation stress $\tau_1$.

For Domain 3-1, the effective shear-stress, τ, is larger than the reverse transformation stress, $\tau_1$. The shear-stress component, $\tau=\tau_0$, is calculated by multiplying the modified shear modulus of Eq. (53) by the shearing strain component; the shear-stress decreases from this stress state elastically in proportion to $G_{SMA}$ in Domain 3. That is, the stress component is calculated by multiplying the modified shear modulus of Eq. (55) by the shear-strain component in the range of effective shear-strain of Eq. (54).

Domain 3-1:

$$\gamma > \frac{\tau_1}{G_{SMA}} \quad \text{and} \quad \gamma \leq \frac{(\tau_0 - \tau_1)\omega}{G_{SMA}(\omega_f - \omega)} \quad (54)$$

$$G = \frac{\tau_0}{\gamma} - G_{SMA} \quad (55)$$

For Domain 3-2, because the effective shear-stress τ reaches the reverse transformation stress, $\tau_1$, the shear-stress component remains constant, i.e., $\tau=\tau_1$. That is, the shear-stress component is calculated by multiplying the modified shear modulus of Eq. (57) by the shear-strain component in the range of effective shear-strain of Eq. (56).

Domain 3-2:

$$\gamma > \frac{\tau_1}{G_{SMA}} \quad \text{and} \quad \gamma > \frac{(\tau_0 - \tau_1)\omega}{G_{SMA}(\omega_f - \omega)} \quad (56)$$

$$G = \frac{\tau_1}{\gamma} \quad (57)$$

For Domain 3-3, the super elasticity disappears because the effective shear-stress, τ, drops below the transformation stress, $\tau_1$. The range of effective shear-strain and modified shear modulus are given by:

Domain 3-3:

$$\gamma \leq \frac{\tau_1}{G_{SMA}} \quad (58)$$

$$G = G_{SMA} \quad (59)$$

The torque T corresponding to ω can be analyzed from Eq. (50) by calculating the effective shear-strain of each area using the modified shear modulus corresponding to each domain, as defined by Eqs. (51), (52), (53), (55), (57) and (59). The relationship between the force and displacement of a spring can be calculated by using Eqs. (44) and (45).

Based on the above model, predictions of the torque-twist angle relationship, and also of the spring force (P) and displacement (δ) relationship based on the idealized stress-strain relations of ferromagnetic FeCoV alloy and super elastic CuAlMn alloy were developed and are illustrated in FIG. 35.

FIGS. 36A and 36B illustrate analytical results based on the above described model for the case of a maximum twist angle per unit length ω=0.003 for a composite plate wire having dimensions of a=2 mm (width is 4 mm), and b=1 mm (height is 2 mm). In particular, FIG. 36A shows the relationship between the torque and the normalized twist angle, indicating that the torque rises proportionally as the twist angle increases, and the transformation of the SMA begins at ωa=0.0025, reaching the transformation stress with ωa=0.0042 in all domains of the SMA. After ωa reaches 0.006, the super elastic loop is exhibited during loading and unloading.

FIG. 36B shows the relationship between the spring force and the displacement of a coil spring of length L=100 mm, diameter D=25 mm, pitch p=5 mm and number of turns, n=20. The maximum displacement of this coiled spring was 59.2 mm, with a spring force of 78.4 N.

A parametric study was performed to examine the effects of each parameter on the P-δ relationship. FIG. 37 shows the analytical results of the P-δ relationship as influenced by various parameters, including $G_{SMA}$ (see portion (a)); $\tau_0$ (see portion (b)); $G_f$ (see portion (c)); $\tau_f$ (see portion (d)); and $\tau_1$ (see portion (e)). Portion (a) of FIG. 37 clearly shows that the shear modulus of the super elastic SMA does not influence the maximum displacement or the maximum spring force. From portion (b) of FIG. 37 it can be concluded that the spring force increases with an increase in transformation start stress, $\tau_0$. Portion (c) of FIG. 37 shows that the spring force does not change if the shear modulus of the ferromagnetic material becomes small, but the maximum displacement increases when the shear modulus of the ferromagnetic material becomes small, resulting in a larger displacement of the spring. It can be seen from portion (d) of FIG. 37 that both the spring force and displacement increase the super elastic behavior of the SMA when the yield stress of the ferromagnetic material increases. Portion (e) of FIG. 37 shows that the lower limit of the super elastic loop decreases if the reverse transformation stress, $\tau_1$, decreases.

In summary, a larger $T_f$ for the ferromagnetic material, and a softer ferromagnetic material will enable a spring actuator with a larger displacement to be achieved. Further, to obtain a large force of the spring, the use of a SMA having a larger $\tau_0$ is desired.

Next, the mechanical performance (the P-δ relationship) of springs having a generally rectangular and a generally square cross-sectional shape were compared. To this end, the cross sectional area of the square was made equal to that of the rectangular section discussed above (see FIG. 35). The analytical results of the optimum square cross section of a FeCoV/CuAlMn composite are shown in FIG. 38. The P-δ relationship of the FSMA spring with this square cross section is shown in FIG. 39 as a dashed line, while results of the rectangular cross section are shown as a solid line. A comparison between the square cross section of FIG. 38 and the rectangular cross section of FIG. 34 reveals that the FSMA composite spring with the square cross section provides a larger force capability than can be achieved with the rectangular cross section of the same cross sectional area. However, the effectiveness of using the spring with the square cross section remains to be determined. It has been recognized that when an a FSMA composite spring is employed in an actuator and triggered using a hybrid magnetic trigger such as one of those described above, a rectangular cross-sectional shape is more effective in distributing magnetic flux from one coil of the spring to another. Thus, rectangular cross-sectional springs are generally easier to actuate with the same amount of magnetic flux, but square cross-sectional springs achieve a greater force.

The models described above (plate bending and spring forces) predicted results for the bending moment and curvature relationship of an a FSMA composite plate exhibiting super elastic behavior, and similar super elastic behavior in a FSMA composite spring with rectangular cross section. The resulting super elastic behavior enables actuators with high force and displacement capability to be achieved. The results of the above described models were used effectively optimizing the cross sectional geometry of two types of FSMA composites—plates for bending applications, and springs for torsion applications.

Detailed Analysis of the Relationship Between Bending Moment and Curvature

The relationship between the normalized bending moment and the normalized curvature of a FSMA composite plate is classified into the following eight patterns, as shown in FIGS. 40A–40C.

FIG. 40A illustrates Case 1, which is constructed with only Pattern 1.

FIG. 40B illustrates Case 2, which is constructed with Patterns 1 and 2 at loading, and Patterns 1, 4, 5, and 6 at unloading.

FIG. 40C illustrates Case 3, which is constructed with Patterns 1, 2, and 3 at loading, and Patterns 1, 4, 7, and 8 at unloading.

Equations of each pattern are as follows:

Pattern 1 (Cases 1, 2 and 3).

$$\frac{M}{E_{SMA}bh^2} = \frac{h}{\rho}\left[\frac{E_f}{E_{SMA}}\left\{\frac{1}{3}\left(\frac{h_f}{h}\right)^3 - \frac{1}{2}\frac{\xi_1}{h}\left(\frac{h_f}{h}\right)^2\right\} + \frac{1}{3}\left\{1-\left(\frac{h_f}{h}\right)^3\right\} - \frac{1}{2}\frac{\xi_1}{h}\left\{1-\left(\frac{h_f}{h}\right)^2\right\}\right]$$

where $\xi_1$ is the distance of the neutral axis, and:

$$\frac{\xi_1}{h} = \frac{\left(\frac{E_f}{E_{SMA}}-1\right)\left(\frac{h_f}{h}\right)^2+1}{2\left\{\left(\frac{E_f}{E_{SMA}}-1\right)\left(\frac{h_f}{h}\right)+1\right\}}$$

Pattern 2 (Cases 2 and 3).

$$\frac{M}{E_{SMA}bh^2} = \frac{h}{\rho}\left[\frac{E_f}{E_{SMA}}\left\{\frac{1}{3}\left(\frac{h_f}{h}\right)^3 - \frac{1}{2}\frac{\xi_2}{h}\left(\frac{h_f}{h}\right)^2\right\} + \frac{1}{3}\left\{\left(\frac{y_1}{h}\right)^3-\left(\frac{h_f}{h}\right)^3\right\} - \frac{1}{2}\frac{\xi_2}{h}\left\{\left(\frac{y_1}{h}\right)^2-\left(\frac{h_f}{h}\right)^2\right\}\right] + \frac{1}{2}\frac{\sigma_0}{E_{SMA}}\left\{1-\left(\frac{y_1}{h}\right)^2\right\}$$

where $\xi_2$ is the distance of the neutral axis, and $y_1$ is the position for $\sigma=\sigma_0$.

$$\frac{\xi_2}{h} = \left\{\left(\frac{E_f}{E_{SMA}}-1\right)\frac{h_f}{h} + \frac{\sigma_0}{E_{SMA}}\frac{\rho}{h}\right\} + \sqrt{\frac{E_f}{E_{SMA}}\left(\frac{E_f}{E_{SMA}}-1\right)\left(\frac{h_f}{h}\right)^2 + 2\frac{\sigma_0}{E_{SMA}}\frac{\rho}{h}\left\{1+\left(\frac{E_f}{E_{SMA}}-1\right)\frac{h_f}{h}\right\}}$$

$$\frac{y_1}{h} = \frac{\xi_2}{h} + \frac{\sigma_0}{E_{SMA}}\frac{\rho}{h}$$

Pattern 3 (Case 3).

$$\frac{M}{E_{SMA}bh^2} = \frac{h}{\rho}\frac{E_f}{E_{SMA}}\left\{\frac{1}{3}\left(\frac{h_f}{h}\right)^3 - \frac{1}{2}\frac{\xi_3}{h}\left(\frac{h_f}{h}\right)^2\right\} + \frac{1}{2}\frac{\sigma_0}{E_{SMA}}\left\{1 - \left(\frac{h_f}{h}\right)^2\right\}$$

where $\xi_3$ is the distance of the neutral axis, and $$\frac{\xi_3}{h} = \frac{\sigma_0}{E_f}\frac{\rho}{h}\left(\frac{h}{h_f} - 1\right) + \frac{1}{2}\frac{h_f}{h}$$

Pattern 4 (Cases 2 and 3).

$$\frac{M}{E_{SMA}bh^2} = \frac{h}{\rho}\left[\frac{E_f}{E_{SMA}}\left\{\frac{1}{3}\left(\frac{h_f}{h}\right)^3 - \frac{1}{2}\frac{\xi_4}{h}\left(\frac{h_f}{h}\right)^2\right\} + \frac{1}{3}\left\{\left(\frac{y_2}{h}\right)^3 - \left(\frac{h_f}{h}\right)^3\right\} - \frac{1}{2}\frac{\xi_4}{h}\left\{\left(\frac{y_1}{h}\right)^2 - \left(\frac{h_f}{h}\right)^2\right\}\right] + \frac{1}{2}\frac{\sigma_1}{E_{SMA}}\left\{1 - \left(\frac{y_2}{h}\right)^2\right\}$$

Pattern 5 (Case 2).

$$\frac{h}{\rho_1} = \frac{\left(\left(\frac{\sigma_f}{E} + \frac{\sigma_0}{E_{SMA}}\right)^2\right)}{-\left\{\frac{\sigma_f}{E_f}\left(\frac{E_f}{E_{SMA}} - 1\right)\frac{h_f}{h} - \frac{\sigma_0}{E_{SMA}}\right\} + \sqrt{\left\{\frac{\sigma_1}{E_f}\left(\frac{E_f}{E_{SMA}} - 1\right)\frac{h_f}{h} - \frac{\sigma_0}{E_{SMA}}\right\}^2 + \left(\frac{\sigma_f}{E_f} + \frac{\sigma_0}{E_{SMA}}\right)^2\left(\frac{E_f}{E_{SMA}} - 1\right)\left(\frac{h_f}{h}\right)^2}}$$

$$\frac{M}{E_{SMA}bh^2} = \frac{h}{\rho}\left[\frac{1}{3}\left\{\left(\frac{E_f}{E_{SMA}} - 1\right)\left(\frac{h_f}{h}\right)^3 + \left(\frac{y_3}{h}\right)^3\right\} - \frac{1}{2}\frac{\xi_5}{h}\left\{\left(\frac{E_f}{E_{SMA}} - 1\right)\left(\frac{h_f}{h}\right)^2 + \left(\frac{y_3}{h}\right)^2\right\}\right] - \frac{h}{\rho_1}\left[\frac{1}{3}\left\{\left(\frac{y_3}{h}\right)^3 - \left(\frac{Y_1}{h}\right)^3\right\} - \frac{1}{2}\frac{\xi_5}{h}\left\{\left(\frac{y_3}{h}\right)^2 - \left(\frac{Y_1}{h}\right)^2\right\}\right] + \frac{1}{2}\frac{\sigma_0}{E_{SMA}}\left\{\left(\frac{y_3}{h}\right)^2 - \left(\frac{Y_1}{h}\right)^2\right\} + \frac{1}{2}\frac{\sigma_1}{E_{SMA}}\left\{1 - \left(\frac{y_3}{h}\right)^2\right\}$$

where $\xi_5$ is the distance of the neutral axis, and $$\frac{\xi_5}{h} = \frac{-B_3 + \sqrt{B_3^2 - A_3 C_3}}{A_3}$$

$$A_3 = 1 - \frac{h}{\rho_1}\frac{\rho}{h}$$

$$B_3 = \left(\frac{E_f}{E_{SMA}} - 1\right)\frac{h_f}{h} + \left(\frac{h}{\rho_1}\frac{Y_1}{h} - \frac{\sigma_0 - \sigma_1}{E_{SMA}}\right)\frac{\rho}{h}$$

$$C_3 = -\left(\frac{E_f}{E_{SMA}} - 1\right)\left(\frac{h_f}{h}\right)^2 - \left\{\left(\frac{h}{\rho_1}\frac{Y_1}{h} - 2\frac{\sigma_0}{E_{SMA}}\right)\frac{Y_1}{h} + 2\frac{\sigma_1}{E_{SMA}} - \left(\frac{\sigma_0 - \sigma_1}{E_{SMA}}\right)^2\frac{\rho_1\rho}{\rho_1 - \rho}\right\}\frac{\rho}{h}$$

$$\frac{y_3}{h} = \frac{\xi_5}{h} - \frac{\sigma_0 - \sigma_1}{E_{SMA}}\frac{\rho_1}{\rho_1 - \rho}\frac{\rho}{h}$$

$$\frac{Y_1}{h} = \left(\frac{\sigma_f}{E_f} + \frac{\sigma_0}{E_{SMA}}\right)\frac{\rho_1}{h}$$

$$\frac{h}{\rho_1} = \frac{\left(\frac{\sigma_f}{E_f} + \frac{\sigma_0}{E_{SMA}}\right)}{-\left\{\frac{\sigma_f}{E_f}\left(\frac{E_f}{E_{SMA}} - 1\right)\frac{h_f}{h} - \frac{\sigma_0}{E_{SMA}}\right\} + \sqrt{\left\{\frac{\sigma_1}{E_f}\left(\frac{E_f}{E_{SMA}} - 1\right)\frac{h_f}{h} - \frac{\sigma_0}{E_{SMA}}\right\}^2 + \left(\frac{\sigma_f}{E_f} + \frac{\sigma_0}{E_{SMA}}\right)\left(\frac{E_f}{E_{SMA}} - 1\right)\left(\frac{h_f}{h}\right)^2}}$$

Pattern 6 (Case 2).

$$\frac{M}{E_{SMA}bh^2} = \frac{h}{\rho}\left[\frac{E_f}{E_{SMA}}\left\{\frac{1}{3}\left(\frac{h_f}{h}\right)^3 - \frac{1}{2}\frac{\xi_6}{h}\left(\frac{h_f}{h}\right)^2\right\} + \frac{1}{3}\left\{1 - \left(\frac{h_f}{h}\right)^3\right\} - \frac{1}{2}\frac{\xi_6}{h}\left\{1 - \left(\frac{h_f}{h}\right)^2\right\}\right] - \frac{h}{\rho}\left[\frac{1}{3}\left\{1 - \left(\frac{Y_1}{h}\right)^3\right\} - \frac{1}{2}\frac{\xi_6}{h}\left\{1 - \left(\frac{Y_1}{h}\right)^2\right\}\right] + \frac{1}{2}\frac{\sigma_0}{E_{SMA}}\left\{1 - \left(\frac{Y_1}{h}\right)^2\right\}$$

where $\xi_6$ is the distance of the neutral axis, and $$\frac{\xi_6}{h} = \frac{\left(\frac{E_f}{E_{SMA}} - 1\right)\left(\frac{h_f}{h}\right)^2 + 1 - \left\{\frac{h}{\rho_1}\left(1 + \frac{Y_1}{h}\right) - 2\frac{\sigma_0}{E_{SMA}}\right\}\left(1 - \frac{Y_1}{h}\right)\frac{\rho}{h}}{2\left\{\left(\frac{E_f}{E_{SMA}} - 1\right)\left(\frac{h_f}{h}\right) + 1 - \frac{h}{\rho_1}\left(1 - \frac{Y_1}{h}\right)\frac{\rho}{h}\right\}}$$

Pattern 7 (Case 3).

$$\frac{M}{E_{SMA}bh^2} = \frac{h}{\rho}\left[\frac{1}{3}\left\{\left(\frac{E_f}{E_{SMA}} - 1\right)\left(\frac{h_f}{h}\right)^3 + \left(\frac{y_4}{h}\right)^3\right\} - \frac{1}{2}\frac{\xi_7}{h}\left\{\left(\frac{E_f}{E_{SMA}} - 1\right)\left(\frac{h_f}{h}\right)^2 + \left(\frac{y_4}{h}\right)^2\right\}\right] + \frac{h}{\rho_2}\left[\frac{1}{3}\left\{\left(\frac{y_4}{h}\right)^3 - \left(\frac{h_f}{h}\right)^3\right\} - \frac{1}{2}\frac{\xi_7}{h}\left\{\left(\frac{y_4}{h}\right)^2 - \left(\frac{h_f}{h}\right)^2\right\}\right] + \frac{1}{2}\frac{\sigma_0}{E_{SMA}}\left\{\left(\frac{y_4}{h}\right)^2 - \left(\frac{h_f}{h}\right)^2\right\}\frac{1}{2}\frac{\sigma_1}{E_{SMA}}\left\{1 - \left(\frac{y_4}{h}\right)^2\right\}$$

where $\xi_7$ is the distance of the neutral axis, and $$\frac{\xi_7}{h} = \frac{-B_4 + \sqrt{B_4^2 - A_4 C_4}}{A_4}$$

$$A_4 = 1 - \frac{h}{\rho_2}\frac{\rho}{h}$$

$$B_4 = \left(\frac{E_f}{E_{SMA}} - 1\right)\frac{h_f}{h} + \left(\frac{h}{\rho_2}\frac{h_f}{h} - \frac{\sigma_0 - \sigma_1}{E_{SMA}}\right)\frac{\rho}{h}$$

$$C_4 = -\left(\frac{E_f}{E_{SMA}} - 1\right)\left(\frac{h_f}{h}\right)^2 - \left\{\left(\frac{h}{\rho_2}\frac{h_f}{h} - 2\frac{\sigma_0}{E_{SMA}}\right)\frac{h_f}{h} + 2\frac{\sigma_1}{E_{SMA}} - \left(\frac{\sigma_0 - \sigma_1}{E_{SMA}}\right)^2\frac{\rho_2\rho}{\rho_2 - \rho}\right\}\frac{\rho}{h}$$

$$\frac{y_4}{h} = \frac{\xi_7}{h} - \frac{\sigma_0 - \sigma_1}{E_{SMA}}\frac{\rho_2}{\rho_2 - \rho}\frac{\rho}{h}$$

$$\frac{h}{\rho_2} = 2\frac{h}{h_f}\left\{\frac{\sigma_f}{E_f} - \frac{\sigma_0}{E_f}\left(\frac{h}{h_f} - 1\right)\right\}$$

Pattern 8 (Case 3).

-continued $$\frac{M}{E_{SMA}bh^2} = \frac{h}{\rho}\left[\frac{E_f}{E_{SMA}}\left\{\frac{1}{3}\left(\frac{h_f}{h}\right)^3 - \frac{1}{2}\frac{\xi_8}{h}\left(\frac{h_f}{h}\right)^2\right\} + \frac{1}{3}\left\{1-\left(\frac{h_f}{h}\right)^3\right\} - \frac{1}{2}\frac{\xi_8}{h}\left\{1-\left(\frac{h_f}{h}\right)^2\right\}\right] - \frac{h}{\rho_2}\left[\frac{1}{3}\left\{1-\left(\frac{h_f}{h}\right)^3\right\} - \frac{1}{2}\frac{\xi_8}{h}\left\{1-\left(\frac{h_f}{h}\right)^2\right\}\right] + \frac{1}{2}\frac{\sigma_0}{E_{SMA}}\left\{1-\left(\frac{h_f}{h}\right)^2\right\}$$

where $\delta_8$ is the distance of the neutral axis, and $$\frac{\xi_8}{h} = \frac{\left\{\frac{h}{\rho_2}\left(1+\frac{h_f}{h}\right) - 2\frac{\sigma_0}{E_{SMA}}\right\}\left(1-\frac{h_f}{h}\right)\frac{\rho}{h} + \left(\frac{E_f}{E_{SMA}}-1\right)\left(\frac{h_f}{h}\right)^2 + 1 -}{2\left\{\left(\frac{E_f}{E_{SMA}}-1\right)\left(\frac{h_f}{h}\right) + 1 - \frac{h}{\rho_2}\left(1-\frac{h_f}{h}\right)\frac{\rho}{h}\right\}}$$

Useful Range

The useful range of the curvature of each pattern is as follows:

Case 1:

Pattern 1 (Loading and Unloading)

$$0 \leq \frac{h}{\rho} \leq \frac{\sigma_f}{E_f} \frac{2\left\{1+\left(\frac{E_f}{E_{SMA}}-1\right)\left(\frac{h_f}{h}\right)\right\}}{1+\left(\frac{E_f}{E_{SMA}}-1\right)\left(\frac{h_f}{h}\right)^2}$$

Case 2

Pattern 1 (Loading)

$$0 \leq \frac{h}{\rho} \leq \frac{\sigma_0}{E_{SMA}} \frac{2\left\{1+\left(\frac{E_f}{E_{SMA}}-1\right)\left(\frac{h_f}{h}\right)\right\}}{1+\left(\frac{E_f}{E_{SMA}}-1\right)\left(2-\frac{h_f}{h}\right)\left(\frac{h_f}{h}\right)}$$

Pattern 2 (Loading)

$$\frac{\sigma_0}{E_{SMA}} \frac{2\left\{1+\left(\frac{E_f}{E_{SMA}}-1\right)\left(\frac{h_f}{h}\right)\right\}}{1+\left(\frac{E_f}{E_{SMA}}-1\right)\left(2-\frac{h_f}{h}\right)\left(\frac{h_f}{h}\right)} < \frac{h}{\rho} \leq \frac{h}{\rho_1}$$

Pattern 1 (Unloading)

$$0 \leq \frac{h}{\rho} \leq \frac{\sigma_1}{E_{SMA}} \frac{2\left\{1+\left(\frac{E_f}{E_{SMA}}-1\right)\left(\frac{h_f}{h}\right)\right\}}{1+\left(\frac{E_f}{E_{SMA}}-1\right)\left(2-\frac{h_f}{h}\right)\left(\frac{h_f}{h}\right)}$$

Pattern 4 (Unloading)

$$\frac{\sigma_1}{E_{SMA}} \frac{2\left\{1+\left(\frac{E_f}{E_{SMA}}-1\right)\left(\frac{h_f}{h}\right)\right\}}{1+\left(\frac{E_f}{E_{SMA}}-1\right)\left(2-\frac{h_f}{h}\right)\left(\frac{h_f}{h}\right)} <$$

$$\frac{h}{\rho} \leq \frac{2\frac{\sigma_1}{E_{SMA}}\left\{1+\left(\frac{E_f}{E_{SMA}}-1\right)\left(\frac{h_f}{h}\right)\right\}}{\left(\frac{Y_1}{h}\right)^2\left(\frac{E_f}{E_{SMA}}-1\right)\left(2-\frac{h_f}{h}\right)\left(\frac{h_f}{h}\right)}$$

Pattern 5 (Unloading)

$$\frac{2\frac{\sigma_1}{E_{SMA}}\left\{1+\left(\frac{E_f}{E_{SMA}}-1\right)\left(\frac{h_f}{h}\right)\right\}}{\left(\frac{Y_1}{h}\right)^2\left(\frac{E_f}{E_{SMA}}-1\right)\left(2\frac{Y_1}{h}-\frac{h_f}{h}\right)\left(\frac{h_f}{h}\right)} <$$

$$\frac{h}{\rho} \leq \frac{2A_1}{-B_1 - \sqrt{B_1^2 - 4A_1C_1}}$$

where:

$$A_1 = \left\{2\frac{\sigma_1}{E_{SMA}} + \left(1-\frac{Y_1}{h}\right)\frac{h}{\rho_1}\right\}\left(1-\frac{Y_1}{h}\right)$$

$$B_1 = 2\left\{\left(\frac{E_f}{E_{SMA}}-1\right)\frac{h_f}{h}+1\right\}\left(\frac{\sigma_0-\sigma_1}{E_{SMA}}\frac{\rho_1}{h}-1\right) + \left(\frac{E_f}{E_{SMA}}-1\right)\left(\frac{h_f}{h}\right)^2 + 1 - \left(1-\frac{Y_1}{h}\right)\left(1-\frac{Y_1}{h}+2\frac{\sigma_1}{E_{SMA}}\frac{\rho_1}{h}\right)$$

$$C_1 = \frac{\rho_1}{h}\left\{\left(\frac{E_f}{E_{SMA}}-1\right)\left(2-\frac{h_f}{h}\right)\frac{h_f}{h}+1\right\}$$

Pattern 6 (Unloading)

$$\frac{2A_1}{-B_1 - \sqrt{B_1^2 - 4A_1C_1}} < \frac{h}{\rho} \leq \frac{h}{\rho_1}$$

Case 3

Pattern 1 (Loading)

$$0 \leq \frac{h}{\rho} \leq \frac{\sigma_0}{E_{SMA}} \frac{2\left\{1+\left(\frac{E_f}{E_{SMA}}-1\right)\left(\frac{h_f}{h}\right)\right\}}{1+\left(\frac{E_f}{E_{SMA}}-1\right)\left(2-\frac{h_f}{h}\right)\left(\frac{h_f}{h}\right)}$$

Pattern 2 (Loading)

$$\frac{\sigma_0}{E_{SMA}} \frac{2\left\{1+\left(\frac{E_f}{E_{SMA}}-1\right)\left(\frac{h_f}{h}\right)\right\}}{1+\left(\frac{E_f}{E_{SMA}}-1\right)\left(2-\frac{h_f}{h}\right)\left(\frac{h_f}{h}\right)} <$$

$$\frac{h}{\rho} \leq 2\frac{h_f}{h}\left\{\frac{\sigma_0}{E_{SMA}} + \frac{\sigma_0}{E_f}\left(\frac{h_f}{h}-1\right)\right\}$$

Pattern 3 (Loading)

$$2\frac{h_f}{h}\left\{\frac{\sigma_0}{E_{SMA}} + \frac{\sigma_0}{E_f}\left(\frac{h_f}{h}-1\right)\right\} < \frac{h}{\rho} \leq \frac{h}{\rho_2}$$

Pattern 1 (Unloading)

$$0 \leq \frac{h}{\rho} \leq \frac{\sigma_1}{E_{SMA}} \frac{2\left\{1+\left(\frac{E_f}{E_{SMA}}-1\right)\left(\frac{h_f}{h}\right)\right\}}{1+\left(\frac{E_f}{E_{SMA}}-1\right)\left(2-\frac{h_f}{h}\right)\left(\frac{h_f}{h}\right)}$$

Pattern 4 (Unloading)

$$\frac{\sigma_1}{E_{SMA}} \frac{2\left\{1+\left(\frac{E_f}{E_{SMA}}-1\right)\left(\frac{h_f}{h}\right)\right\}}{1+\left(\frac{E_f}{E_{SMA}}-1\right)\left(2-\frac{h_f}{h}\right)\left(\frac{h_f}{h}\right)} <$$

$$\frac{h}{\rho} \leq \frac{2\frac{\sigma_1}{E_{SMA}}\left\{1+\left(\frac{E_f}{E_{SMA}}-1\right)\left(\frac{h_f}{h}\right)\right\}}{\left(\frac{Y_1}{h}\right)^2 + \left(\frac{E_f}{E_{SMA}}-1\right)\left(2\frac{Y_1}{h}-\frac{h_f}{h}\right)\left(\frac{h_f}{h}\right)}$$

-continued

Pattern 7 (Unloading)

$$\frac{2\frac{\sigma_1}{E_{SMA}}\left\{1+\left(\frac{E_f}{E_{SMA}}-1\right)\left(\frac{h_f}{h}\right)\right\}}{\left(\frac{Y_1}{h}\right)^2+\left(\frac{E_f}{E_{SMA}}-1\right)\left(2\frac{Y_1}{h}-\frac{h_f}{h}\right)\left(\frac{h_f}{h}\right)} <$$

$$\frac{h}{\rho} \leq \frac{2A_2}{-B_2-\sqrt{B_2^2-4A_2C_2}}$$

where:

$$A_2 = \left\{2\frac{\sigma_1}{E_{SMA}}+\left(1-\frac{h_f}{h}\right)\frac{h}{\rho_2}\right\}\left(1-\frac{h_f}{h}\right)$$

$$B_2 = 2\left\{\left(\frac{E_f}{E_{SMA}}-1\right)\frac{h_f}{h}+1\right\}\left(\frac{\sigma_0-\sigma_1}{E_{SMA}}\frac{\rho_2}{h}-1\right)+$$

$$\left(\frac{E_f}{E_{SMA}}-1\right)\left(\frac{h_f}{h}\right)^2+1-\left(1-\frac{h_f}{h}\right)\left(1-\frac{h_f}{h}+2\frac{\sigma_0}{E_{SMA}}\frac{\rho_2}{h}\right)$$

$$C_2 = \frac{\rho_2}{h}\left\{\left(\frac{E_f}{E_{SMA}}-1\right)\left(2-\frac{h_f}{h}\right)\frac{h_f}{h}+1\right\}$$

Pattern 8 (Unloading)

$$\frac{2A_2}{-B_2-\sqrt{B_2^2-4A_2C_2}} < \frac{h}{\rho} \leq \frac{h}{\rho_2}$$

Although the present invention has been described in connection with the preferred form of practicing it and modifications thereto, those of ordinary skill in the art will understand that many other modifications can be made to the invention within the scope of the claims that follow. Accordingly, it is not intended that the scope of the invention in any way be limited by the above description, but instead be determined entirely by reference to the claims that follow.

What is claimed is:

1. A spring actuator, comprising:

(a) a spring comprising a ferromagnetic shape memory alloy (FSMA) composite, the FSMA composite including a ferromagnetic material and a shape memory alloy (SMA) material, the FSMA having a generally quadrilateral cross section, such that the ferromagnetic material exhibits a generally stretched X shaped cross section, with the SMA material being disposed peripherally about the generally quadrilateral cross section;

(b) a hybrid magnetic trigger, the hybrid magnetic trigger including at least one permanent magnet and at least one electromagnet; and (c) a yoke configured to couple a magnetic flux from the hybrid magnetic trigger to the spring, such that when the hybrid magnetic trigger is energized, the spring is attracted to the yoke and contracts.

2. The spring actuator of claim 1, wherein the ferromagnetic material comprises iron.

3. The spring actuator of claim 1, wherein the SMA material comprises an alloy of copper, aluminum, and manganese.

4. The spring actuator of claim 1, wherein the yoke further comprises a plurality of fences configured to direct magnetic flux from the hybrid magnetic trigger into the spring.

5. The spring actuator of claim 4, wherein the plurality of fences includes inner fences that are disposed within the spring and outer fences that are external relative to the spring.

6. The spring actuator of claim 4, wherein the plurality of fences include outer fences that are external relative to the spring, but no fences disposed within the spring.

* * * * *